(12) United States Patent
Seo et al.

(10) Patent No.: US 12,495,662 B2
(45) Date of Patent: Dec. 9, 2025

(54) LIGHT-EMITTING ELEMENT AND DISPLAY DEVICE INCLUDING TADF COMPOUND

(71) Applicant: SEMICONDUCTOR ENERGY LABORATORY CO., LTD., Atsugi (JP)

(72) Inventors: Satoshi Seo, Kanagawa (JP); Nobuharu Ohsawa, Kanagawa (JP); Takeyoshi Watabe, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/980,869

(22) Filed: Nov. 4, 2022

(65) Prior Publication Data
US 2023/0095777 A1     Mar. 30, 2023

Related U.S. Application Data

(63) Continuation of application No. 17/094,374, filed on Nov. 10, 2020, now Pat. No. 11,557,742, which is a
(Continued)

(30) Foreign Application Priority Data

Sep. 30, 2014 (JP) ................. 2014-200355

(51) Int. Cl.
*H10K 50/11* (2023.01)
*H10K 50/12* (2023.01)
(Continued)

(52) U.S. Cl.
CPC .......... *H10K 50/11* (2023.02); *H10K 50/121* (2023.02); *H10K 50/19* (2023.02); *H10K 59/32* (2023.02);
(Continued)

(58) Field of Classification Search
CPC .... H10K 50/11; H10K 50/121; H10K 85/633; H10K 210/00; H10K 210/40
(Continued)

(56) References Cited

U.S. PATENT DOCUMENTS 4,619,994 A   10/1986  Shortridge
7,175,922 B2   2/2007  Jarikov et al.
(Continued)

FOREIGN PATENT DOCUMENTS

CN        001536944 A    10/2004
CN        101728416 A     6/2010
(Continued)

OTHER PUBLICATIONS

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.
(Continued)

*Primary Examiner* — Sheng-Bai Zhu
(74) *Attorney, Agent, or Firm* — Nixon Peabody LLP; Jeffrey L. Costellia

(57) ABSTRACT

Provided is a light-emitting element including a fluorescence-emitting material with high emission efficiency. The light-emitting element includes a pair of electrodes and an EL layer between the pair of electrodes. The EL layer includes a first organic compound, a second organic compound, and a guest material. The first organic compound has a function of emitting a thermally activated delayed fluorescence at room temperature. The guest material has a function of emitting fluorescence. A HOMO level of the first organic compound higher than or equal to a HOMO level of the second organic compound. A LUMO level of the first
(Continued)

organic compound is lower than or equal to a LUMO level of the second organic compound.

18 Claims, 23 Drawing Sheets

Related U.S. Application Data continuation of application No. 16/269,114, filed on Feb. 6, 2019, now Pat. No. 11,133,482, which is a continuation of application No. 14/868,724, filed on Sep. 29, 2015, now abandoned.

(51) Int. Cl.
| | | |
|---|---|---|
| *H10K 50/19* | (2023.01) | |
| *H10K 59/32* | (2023.01) | |
| *H10K 85/60* | (2023.01) | |
| *H10K 101/00* | (2023.01) | |
| *H10K 101/10* | (2023.01) | |
| *H10K 101/40* | (2023.01) | |

(52) U.S. Cl.
CPC ......... *H10K 85/622* (2023.02); *H10K 85/626* (2023.02); *H10K 85/633* (2023.02); *H10K 85/654* (2023.02); *H10K 85/6572* (2023.02); *H10K 85/6576* (2023.02); *H10K 2101/10* (2023.02); *H10K 2101/27* (2023.02); *H10K 2101/40* (2023.02); *H10K 2101/90* (2023.02)

(58) Field of Classification Search
USPC .......................................................... 257/40
See application file for complete search history.

(56) References Cited

U.S. PATENT DOCUMENTS

| | | | |
|---|---|---|---|
| 7,183,010 B2 | 2/2007 | Jarikov | |
| 7,332,857 B2 | 2/2008 | Seo et al. | |
| 7,597,967 B2 | 10/2009 | Kondakova et al. | |
| 7,993,760 B2 | 8/2011 | Komori et al. | |
| 8,034,465 B2 | 10/2011 | Liao et al. | |
| 8,076,681 B2 | 12/2011 | Mori et al. | |
| 8,076,841 B2 | 12/2011 | Shiobara et al. | |
| 8,274,214 B2 | 9/2012 | Ikeda et al. | |
| 8,431,243 B2 | 4/2013 | Kwong et al. | |
| 8,643,268 B2 | 2/2014 | Ogiwara et al. | |
| 8,853,680 B2 | 10/2014 | Yamazaki et al. | |
| 8,963,127 B2 | 2/2015 | Pieh et al. | |
| 8,981,355 B2 | 3/2015 | Seo | |
| 8,993,129 B2 | 3/2015 | Endo et al. | |
| 8,994,013 B2 | 3/2015 | Seo | |
| 8,994,263 B2 | 3/2015 | Shitagaki et al. | |
| 9,048,398 B2 | 6/2015 | Yamazaki et al. | |
| 9,054,317 B2 | 6/2015 | Monkman et al. | |
| 9,059,421 B2 | 6/2015 | Seo et al. | |
| 9,082,994 B2 | 7/2015 | Watabe et al. | |
| 9,123,898 B2 | 9/2015 | Song et al. | |
| 9,130,177 B2 | 9/2015 | Ma et al. | |
| 9,130,182 B2 | 9/2015 | Seo et al. | |
| 9,142,710 B2 | 9/2015 | Seo et al. | |
| 9,142,786 B2 | 9/2015 | Kwong et al. | |
| 9,159,942 B2 | 10/2015 | Seo et al. | |
| 9,175,213 B2 | 11/2015 | Seo et al. | |
| 9,190,621 B2 | 11/2015 | Ma et al. | |
| 9,219,242 B2 | 12/2015 | Ogiwara et al. | |
| 9,257,655 B2 | 2/2016 | Suzuki et al. | |
| 9,276,228 B2 | 3/2016 | Seo et al. | |
| 9,299,944 B2 | 3/2016 | Seo et al. | |
| 9,356,250 B2 | 5/2016 | Ohsawa et al. | |
| 9,412,962 B2 | 8/2016 | Hamada et al. | |
| 9,537,109 B2 | 1/2017 | Suzuki et al. | |
| 9,559,313 B2 | 1/2017 | Seo et al. | |
| 9,559,324 B2 | 1/2017 | Seo et al. | |
| 9,577,201 B2 | 2/2017 | Kwong et al. | |
| 9,604,928 B2 | 3/2017 | Shitagaki et al. | |
| 9,608,209 B2 | 3/2017 | Ogiwara et al. | |
| 9,660,211 B2 | 5/2017 | Seo et al. | |
| 9,853,227 B2 | 12/2017 | Ma et al. | |
| 9,882,138 B2 | 1/2018 | Osaka et al. | |
| 9,911,930 B2 | 3/2018 | Kwong et al. | |
| 9,947,885 B2 | 4/2018 | Seo et al. | |
| 10,008,677 B2 | 6/2018 | Xia et al. | |
| 10,032,998 B2 | 7/2018 | Ogiwara et al. | |
| 10,069,076 B2 | 9/2018 | Hamada et al. | |
| 10,121,984 B2 | 11/2018 | Seo et al. | |
| 10,230,060 B2 | 3/2019 | Kwong et al. | |
| 10,361,389 B2 | 7/2019 | Seo et al. | |
| 10,461,264 B2 | 10/2019 | Ogiwara et al. | |
| 10,600,975 B2 | 3/2020 | Kwong et al. | |
| 10,665,808 B2 | 5/2020 | Seo et al. | |
| 10,680,189 B2 | 6/2020 | Xia et al. | |
| 10,862,059 B2 | 12/2020 | Seo et al. | |
| 10,879,482 B2 | 12/2020 | Ogiwara et al. | |
| 10,930,860 B2 | 2/2021 | Ogiwara et al. | |
| 10,998,516 B2 | 5/2021 | Ishisone et al. | |
| 2002/0109136 A1* | 8/2002 | Seo ........................ | H10K 71/40 |
| | | | 257/40 |
| 2003/0175553 A1* | 9/2003 | Thompson ........... | H10K 85/346 |
| | | | 313/506 |
| 2004/0201545 A1 | 10/2004 | Yamazaki et al. | |
| 2005/0048310 A1 | 3/2005 | Cocchi et al. | |
| 2005/0221116 A1 | 10/2005 | Cocchi et al. | |
| 2006/0119262 A1 | 6/2006 | Ikeda et al. | |
| 2006/0134464 A1 | 6/2006 | Nariyuki | |
| 2007/0010493 A1 | 1/2007 | Menges et al. | |
| 2007/0090756 A1 | 4/2007 | Okada et al. | |
| 2008/0174514 A1 | 7/2008 | Yamazaki et al. | |
| 2009/0226829 A1 | 9/2009 | Aziz et al. | |
| 2009/0283757 A1* | 11/2009 | Seo ........................ | H10K 50/155 |
| | | | 257/40 |
| 2010/0090238 A1 | 4/2010 | Mori et al. | |
| 2010/0184942 A1 | 7/2010 | Chen et al. | |
| 2011/0273366 A1 | 11/2011 | Yamazaki et al. | |
| 2011/0291156 A1 | 12/2011 | Shiratori | |
| 2012/0130081 A1* | 5/2012 | Kawata ............... | H10K 85/6576 |
| | | | 548/145 |
| 2012/0205632 A1* | 8/2012 | Shitagaki ............ | C07F 15/0033 |
| | | | 257/40 |
| 2012/0217487 A1 | 8/2012 | Yamazaki et al. | |
| 2012/0242219 A1 | 9/2012 | Seo et al. | |
| 2012/0248968 A1 | 10/2012 | Ogiwara et al. | |
| 2012/0319966 A1 | 12/2012 | Reynolds | |
| 2013/0032785 A1 | 2/2013 | Ma et al. | |
| 2013/0048964 A1 | 2/2013 | Takeda et al. | |
| 2013/0094173 A1 | 4/2013 | Yamazaki et al. | |
| 2013/0144018 A1 | 6/2013 | Klosin et al. | |
| 2013/0270531 A1 | 10/2013 | Seo et al. | |
| 2013/0277653 A1 | 10/2013 | Osaka et al. | |
| 2013/0292656 A1* | 11/2013 | Seo ........................ | H10K 50/13 |
| | | | 257/40 |
| 2014/0034926 A1 | 2/2014 | Matsubara et al. | |
| 2014/0034930 A1 | 2/2014 | Seo et al. | |
| 2014/0034931 A1 | 2/2014 | Inoue et al. | |
| 2014/0034932 A1 | 2/2014 | Seo et al. | |
| 2014/0061604 A1 | 3/2014 | Seo et al. | |
| 2014/0103329 A1 | 4/2014 | Ogiwara et al. | |
| 2014/0191220 A1 | 7/2014 | Watabe et al. | |
| 2014/0292618 A1 | 10/2014 | Yamazaki et al. | |
| 2014/0326976 A1 | 11/2014 | Shiratori | |
| 2014/0353624 A1 | 12/2014 | Kim et al. | |
| 2015/0069351 A1 | 3/2015 | Kambe et al. | |
| 2015/0069352 A1 | 3/2015 | Kim et al. | |
| 2015/0155502 A1 | 6/2015 | Ishibashi et al. | |
| 2015/0188070 A1* | 7/2015 | Ogiwara ............... | H10K 85/654 |
| | | | 257/40 |
| 2015/0188072 A1 | 7/2015 | Seo | |
| 2015/0239880 A1 | 8/2015 | Adachi et al. | |
| 2015/0243918 A1 | 8/2015 | Sasaki et al. | |
| 2015/0280158 A1 | 10/2015 | Ogiwara et al. | |
| 2015/0336937 A1 | 11/2015 | Lee et al. | |
| 2016/0064684 A1 | 3/2016 | Seo et al. | |
| 2016/0172602 A1 | 6/2016 | Ogiwara et al. | |

(56) References Cited

U.S. PATENT DOCUMENTS

| | | |
|---|---|---|
| 2017/0162799 A1 | 6/2017 | Ogiwara et al. |
| 2018/0226600 A1 | 8/2018 | Seo et al. |
| 2018/0248145 A1 | 8/2018 | Ihn et al. |
| 2019/0013468 A1 | 1/2019 | Hamada et al. |
| 2019/0067615 A1 | 2/2019 | Seo et al. |
| 2019/0074442 A1 | 3/2019 | Hamada et al. |
| 2019/0214577 A1 | 7/2019 | Pan et al. |
| 2020/0176693 A1 | 6/2020 | Kwong et al. |
| 2020/0259107 A1 | 8/2020 | Xia et al. |
| 2020/0280011 A1 | 9/2020 | Seo et al. |
| 2021/0074941 A1 | 3/2021 | Ogiwara et al. |
| 2021/0119163 A1 | 4/2021 | Seo et al. |

FOREIGN PATENT DOCUMENTS

| | | | |
|---|---|---|---|
| CN | 101728490 A | | 6/2010 |
| CN | 102005175 A | | 4/2011 |
| CN | 103155201 A | | 6/2013 |
| CN | 103378301 A | | 10/2013 |
| CN | 103579515 A | | 2/2014 |
| CN | 103579530 A | | 2/2014 |
| CN | 106206958 | * | 12/2016 |
| CN | 109378392 | * | 2/2019 |
| CN | 109599493 | * | 4/2019 |
| DE | 112012003517 | | 5/2014 |
| EP | 1202608 A | | 5/2002 |
| EP | 1467344 A | | 10/2004 |
| EP | 2175503 A | | 4/2010 |
| EP | 2175505 A | | 4/2010 |
| EP | 2465912 A | | 6/2012 |
| EP | 2489716 A | | 8/2012 |
| EP | 2554548 A | | 2/2013 |
| EP | 2690681 A | | 1/2014 |
| EP | 2876698 A | | 5/2015 |
| EP | 2883880 A | | 6/2015 |
| EP | 3249711 A | | 11/2017 |
| EP | 3327100 A | | 5/2018 |
| EP | 3598520 A | | 1/2020 |
| EP | 3719099 A | | 10/2020 |
| JP | 2004-241374 A | | 8/2004 |
| JP | 2004-361423 A | | 12/2004 |
| JP | 2006-024830 A | | 1/2006 |
| JP | 2008-085142 A | | 4/2008 |
| JP | 2008-288344 A | | 11/2008 |
| JP | 2009-144130 A | | 7/2009 |
| JP | 2011-071392 A | | 4/2011 |
| JP | 2011-249698 A | | 12/2011 |
| JP | 2013-236058 A | | 11/2013 |
| JP | 2014-022666 A | | 2/2014 |
| JP | 2014-029971 A | | 2/2014 |
| JP | 2014-031371 A | | 2/2014 |
| JP | 2014-045179 A | | 3/2014 |
| JP | 2017-204639 A | | 11/2017 |
| KR | 2011-0102259 A | | 9/2011 |
| KR | 10-1118713 | | 2/2012 |
| KR | 2012-0024897 A | | 3/2012 |
| KR | 2013-0045302 A | | 5/2013 |
| KR | 2014-0064892 A | | 5/2014 |
| TW | 200422968 | | 11/2004 |
| TW | 201245804 | | 11/2012 |
| TW | 201311650 | | 3/2013 |
| TW | 201311704 | | 3/2013 |
| TW | 201407854 | | 2/2014 |
| TW | 201412755 | | 4/2014 |
| TW | 201418409 | | 5/2014 |
| TW | 201425532 | | 7/2014 |
| TW | 201506885 | | 2/2015 |
| TW | 201638086 | | 11/2016 |
| WO | WO 03100880 | * | 12/2003 |
| WO | WO-2008/109824 | | 9/2008 |
| WO | WO-2012/148511 | | 11/2012 |
| WO | WO-2013/027846 | | 2/2013 |
| WO | WO 2014013947 | * | 1/2014 |
| WO | WO-2014/021441 | | 2/2014 |
| WO | WO-2014/021443 | | 2/2014 |
| WO | WO 2015090177 | * | 6/2015 |
| WO | WO 2016119533 | * | 8/2016 |
| WO | WO-2017/191526 | | 11/2017 |

OTHER PUBLICATIONS

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Nakanotani.H et al., "Red fluorescence OLEDs with external EL quantum efficiency of over 17%", Extended Abstracts (The 61th Spring Meeting 2014), The Japan Society of Applied Physics and Related Societies, 2014, pp. 12-226.

Higuchi.T et al., "Blue fluorescence organic light-emitting diodes with TADF molecules as assistant dopant", Extended Abstracts (The 75th Autumn Meeting 2014), The Japan Society of Applied Physics and Related Societies, Sep. 20, 2014, pp. 12-232.

International Search Report (Application No. PCT/IB2015/057277) dated Jan. 12, 2016.

Written Opinion (Application No. PCT/IB2015/057277) dated Jan. 12, 2016.

Yersin.H et al., Highly Efficient OLEDs with Phosphorescent Materials, 2008, pp. 1-97,283-309, Wiley-VCH Verlag GmbH & Co.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic): Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Endo.A et al., "Thermally Activated Delayed Fluorescence from Sn4+-Porphyrin Complexes and Their Application to Organic Light

(56) References Cited

OTHER PUBLICATIONS

Emitting Diodes—A Novel Mechanism for Electroluminescence", Adv. Mater. (Advanced Materials), Aug. 12, 2009, vol. 21, No. 47, pp. 4802-4806.

Chinese Office Action (Application No. 201580052918.3) dated May 30, 2018.

Nakanotani.H et al., "High-efficiency organic light-emitting diodes with fluorescent emitters", Nature Communications, May 30, 2014, vol. 5, pp. 4016-1-4016-7.

Tanaka.H et al., "Twisted Intramolecular Charge Transfer State for Long-Wavelength Thermally Activated Delayed Fluorescence", Chem. Mater. (Chemistry of Materials), Sep. 24, 2013, vol. 25, No. 18, pp. 3766-3771.

CBP—4,4'-Bis(N-carbazolyl)-1,1'-biphenyl, https://www.ossila.com/products/cbp?variant=7290889025, Ossila.

Chinese Office Action (Application No. 201910277085.0) dated Dec. 1, 2020.

Taiwanese Office Action (Application No. 110106530) dated Jun. 10, 2021.

\* cited by examiner

LIGHT-EMITTING ELEMENT AND DISPLAY DEVICE INCLUDING TADF COMPOUND

TECHNICAL FIELD

One embodiment of the present invention relates to a light-emitting element in which a light-emitting layer capable of providing light emission by application of an electric field is provided between a pair of electrodes, and also relates to a display device, an electronic device, and a lighting device including the light-emitting element.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

BACKGROUND ART

In recent years, research and development have been extensively conducted on light-emitting elements utilizing electroluminescence (EL). In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a display device using this light-emitting element has advantages such as high visibility, no necessity of a backlight, and low power consumption. Furthermore, such a light-emitting element also has advantages in that the element can be formed to be thin and lightweight, and that response time is high.

In the case of a light-emitting element in which an EL layer containing an organic material as the light-emitting material is provided between a pair of electrodes (e.g., an organic EL element), application of a voltage between the pair of electrodes causes injection of electrons from the cathode and holes from the anode into the EL layer having a light-emitting property, and thus a current flows. By recombination of the injected electrons and holes, the organic material having a light-emitting property is put in an excited state, whereby light emission is obtained from the excited organic compound having a light-emitting property.

The excited state of an organic material can be a singlet excited state or a triplet excited state, and light emission from the singlet excited state ($S_1$) is referred to as fluorescence, and light emission from the triplet excited state ($T_1$) is referred to as phosphorescence. The statistical generation ratio of the excited states in the light-emitting element is considered to be $S_1:T_1=1:3$. In other words, a light-emitting element containing a phosphorescent material has higher emission efficiency than a light-emitting element containing a fluorescent material. Therefore, a light-emitting element containing a phosphorescent material capable of converting the triplet excited state into light emission has been actively developed in recent years.

As one of materials capable of partly converting the triplet excited state into light emission, a thermally activated delayed fluorescence (TADF) substance has been known. In a thermally activated delayed fluorescence substance, a singlet excited state is generated from a triplet excited state by reverse intersystem crossing, and the singlet excited state is converted into light emission. Patent Document 1 and Patent Document 2 each disclose a thermally activated delayed fluorescence substance.

In order to increase emission efficiency of a light-emitting element using a thermally activated delayed fluorescence substance, not only efficient generation of a singlet excited state from a triplet excited state but also efficient emission from a singlet excited state, that is, high fluorescence quantum yield are important in a thermally activated delayed fluorescence substance. It is, however, difficult to design a light-emitting material that meets these two.

Patent Document 3 discloses a method: in a light-emitting element containing a thermally activated delayed fluorescence substance and a material emitting fluorescence, singlet excitation energy of the thermally activated delayed fluorescence substance is transferred to the material emitting fluorescence and light emission is obtained from the material emitting fluorescence.

REFERENCE

Patent Document

[Patent Document 1] Japanese Published Patent Application No. 2004-241374
[Patent Document 2] Japanese Published Patent Application No. 2006-24830
[Patent Document 3] Japanese Published Patent Application No. 2014-45179

DISCLOSURE OF INVENTION

In order to increase emission efficiency of a light-emitting element containing a thermally activated delayed fluorescence substance and a material emitting fluorescence, efficient generation of a singlet excited state from a triplet excited state is important. In addition, efficient energy transfer from an excited state of the thermally activated delayed fluorescence substance to an excited state of the material emitting fluorescence is important.

An object of one embodiment of the present invention is to provide a light-emitting element having high emission efficiency which contains a fluorescent material as a light-emitting material. Another object of one embodiment of the present invention is to provide a light-emitting element with high reliability. Another object of one embodiment of the present invention is to provide a light-emitting element with high emission efficiency and high reliability.

Another object of one embodiment of the present invention is to provide a novel light-emitting element. Another object of one embodiment of the present invention is to provide a novel light-emitting element with high emission efficiency and low power consumption.

Note that the description of the above object does not disturb the existence of other objects. In one embodiment of the present invention, there is no need to achieve all the objects. Objects other than the above objects will be apparent from and can be derived from the description of the specification and the like.

Means for Solving the Problems

One embodiment of the present invention is a light-emitting element including a pair of electrodes and an EL layer between the pair of electrodes. The EL layer includes a first organic compound, a second organic compound, and a guest material. The first organic compound has a function of emitting a thermally activated delayed fluorescence at room temperature. The guest material has a function of emitting fluorescence. A HOMO of the first organic compound has an energy level higher than or equal to an energy level of a HOMO of the second organic compound. A LUMO of the first organic compound has an energy level lower than or equal to an energy level of a LUMO of the second organic compound.

Another embodiment of the present invention is a light-emitting element including a pair of electrodes and an EL layer between the pair of electrodes. The EL layer includes a first organic compound, a second organic compound, and a guest material. The first organic compound has a function of emitting a thermally activated delayed fluorescence at room temperature. The guest material has a function of emitting fluorescence. An oxidation potential of the first organic compound is lower than or equal to an oxidation potential of the second organic compound. A reduction potential of the first organic compound is higher than or equal to a reduction of the second organic compound.

In the above structure, a difference between a singlet excitation energy level of the first organic compound and a triplet excitation energy level of the first organic compound is preferably larger than 0 eV and smaller than or equal to 0.2 eV.

In the above structure, the guest material preferably emits light.

In the above structure, it is preferable that the first organic compound include a first π-electron deficient heteroaromatic skeleton and a first π-electron rich heteroaromatic skeleton and the second organic compound include a second π-electron deficient heteroaromatic skeleton and a second π-electron rich heteroaromatic skeleton.

In the above structure, it is preferable that the first π-electron deficient heteroaromatic skeleton include a diazine skeleton or a triazine skeleton, the first π-electron rich heteroaromatic skeleton include any one or more of an acridine skeleton, a phenoxazine skeleton, or a 3-(9-phenyl-9H-carbazole-3-yl)-9H-carbazole skeleton, the second π-electron deficient heteroaromatic skeleton include a pyridine skeleton or a diazine skeleton, and the second π-electron rich heteroaromatic skeleton include any one or more of a furan skeleton, a thiophene skeleton, a fluorine skeleton, and a pyrrole skeleton.

In the above structure, it is preferable that a weight ratio of the second organic compound to the first organic compound be from 1:0.05 to 1:0.5 (the second organic compound: the first organic compound) and a weight ratio of the second organic compound to the guest material be from 1:0.001 to 1:0.01 (the second organic compound: the guest material).

Another embodiment of the present invention is a display device which includes the light-emitting element and a color filter, a sealant, or a transistor. Another embodiment of the present invention is an electronic device which includes the display device and a housing or a function of a touch sensor. Another embodiment of the present invention is a lighting device which includes the light-emitting element in the above embodiment and a housing or a touch sensor.

One embodiment of the present invention makes it possible to provide a light-emitting element having high emission efficiency which contains a fluorescent material as a light-emitting material. One embodiment of the present invention makes it possible to provide a light-emitting element with high reliability. One embodiment of the present invention makes it possible to provide a light-emitting element with high emission efficiency and high reliability. One embodiment of the present invention makes it possible to provide a novel light-emitting element. One embodiment of the present invention makes it possible to provide a novel light-emitting element with high emission efficiency and low power consumption.

Note that the description of these effects does not disturb the existence of other effects. One embodiment of the present invention does not necessarily achieve all the objects listed above. Other effects will be apparent from and can be derived from the description of the specification, the drawings, the claims, and the like.

BEST MODE FOR CARRYING OUT THE INVENTION

Figure 1A:
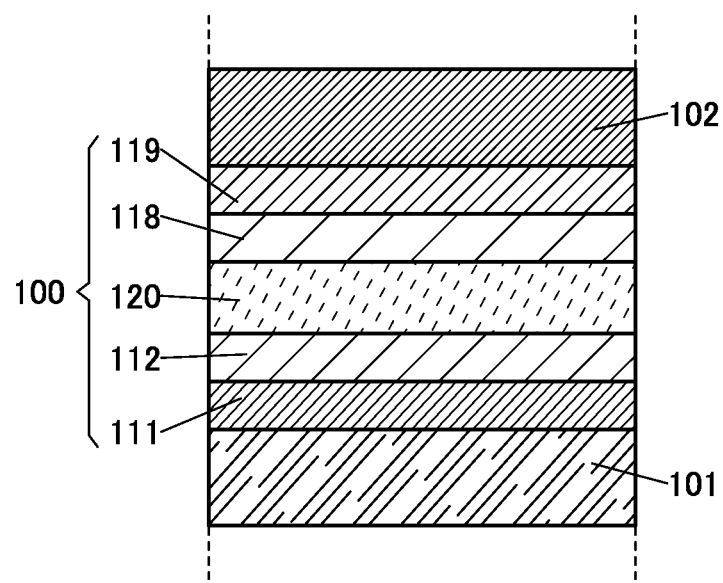
FIGS. 1A and 1B are schematic cross-sectional views illustrating a light-emitting element of one embodiment of the present invention.

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Ordinal numbers such as "first" and "second" in this specification and the like are used for convenience and do not denote the order of steps or the stacking order of layers in some cases. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in this specification and the like, a singlet excited state means a singlet state with excited energy. An $S_1$ level means the lowest level of the singlet excitation energy, that is, the lowest level of excited energy in a singlet excited state. A triplet excited state means a triplet state with excited energy. A $T_1$ level means the lowest level of the triplet excitation energy, that is, the lowest level of excited energy in a triplet excited state. Note that in this specification and the like, a singlet excited state and a singlet excitation energy level mean the lowest singlet excited state and the $S_1$ level, respectively, in some cases. A triplet excited state and a triplet excitation energy level mean the lowest singlet excited state and the $T_1$ level, respectively, in some cases.

In this specification and the like, a fluorescent material refers to a material that emits light in the visible light region when the level of the lowest singlet excited state ($S_1$ level) relaxes to the ground state. A phosphorescent material refers to a material that emits light in the visible light region at room temperature when the level of the lowest triplet excited state ($T_1$ level) relaxes to the ground state. That is, a phosphorescent material refers to a material that can convert triplet excitation energy into visible light.

In this specification and the like, a thermally activated delayed fluorescent substance is a material which can generate a singlet excited state from a triplet excited state by reverse intersystem crossing by thermal activation. The thermally activated delayed fluorescent substance may include a material which can generate a singlet excited state by itself from a triplet excited state by reverse intersystem crossing, for example, a material which emits TADF. Alternatively, the thermally activated delayed fluorescent substance may include a combination of two kinds of materials which form exciplexes.

It also can be said that the thermally activated delayed fluorescent substance is a material of which a triplet excited state is close to a singlet excited state. Specifically, a material in which the difference between the energy levels of the triplet excited state and the singlet excited state is larger than 0 eV and smaller than or equal to 0.2 eV is preferably used. That is, it is preferable that the difference between the energy levels of the triplet excited state and the singlet excited state be larger than 0 eV and smaller than or equal to 0.2 eV in a material which can generate a singlet excited state by itself from a triplet excited state by reverse intersystem crossing, for example, a material which emits TADF, or it is preferable that the difference between the levels of the triplet excited state and the singlet excited state be larger than 0 eV and smaller than or equal to 0.2 eV in exciplexes.

In this specification and the like, thermally activated delayed fluorescence emission energy refers to an emission peak (including a shoulder) on the shortest wavelength side of thermally activated delayed fluorescence. In this specification and the like, phosphorescence emission energy or a triplet excitation energy refers to a phosphorescence emission peak (including a shoulder) on the shortest wavelength side of phosphorescence emission. Note that the phosphorescence emission can be observed by time-resolved photoluminescence in a low-temperature (e.g., 10 K) environment.

Note that in this specification and the like, "room temperature" refers to a temperature in a range of 0° C. to 40° C.

Embodiment 1

In this embodiment, a light-emitting element according to one embodiment of the present invention will be described with reference to FIGS. 1A and 1B and FIGS. 2A to 2C.
<1. Structure Example of Light-Emitting Element>

First, a structure of a light-emitting element of one embodiment of the present invention will be described with reference to FIGS. 1A and 1B.

A light-emitting element 150 includes an EL layer 100 between a pair of electrodes (an electrode 101 and an electrode 102). The EL layer 100 includes at least a light-emitting layer 120. Although the electrode 101 is an anode and the electrode 102 is a cathode in this embodiment, they can be interchanged for the structure of the light-emitting element 150.

The EL layer 100 in FIG. 1A includes a functional layer in addition to the light-emitting layer 120. The functional layer is composed of a hole-injection layer 111, a hole-transport layer 112, an electron-transport layer 118, and an electron-injection layer 119. Note that the structure of the EL layer 100 is not limited to the structure illustrated in FIG. 1A, and at least one selected from the hole-injection layer 111, the hole-transport layer 112, the electron-transport layer 118, and the electron-injection layer 119 is included. The EL layer 100 may include another functional layer which can reduce a barrier to hole or electron injection, enhance a hole/electron-transport property, inhibit a hole/electron transport property, suppress a quenching phenomenon due to an electrode, and the like.

Figure 1B:
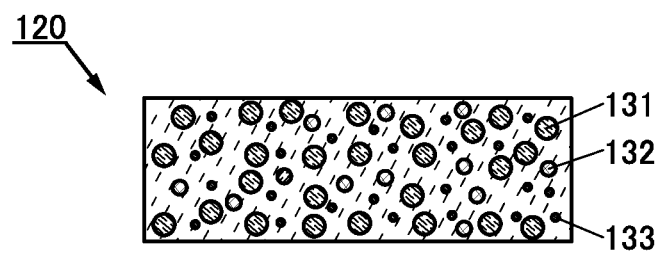

FIG. 1B is a schematic cross-sectional view of an example of the light-emitting layer 120 in FIG. 1A. The light-emitting layer 120 in FIG. 1B includes an organic compound 131, an organic compound 132, and a guest material 133.

A thermally activated delayed fluorescence substance is preferably used for the organic compound 131. A thermally activated delayed fluorescence substance can convert triplet excitation energy into singlet excitation energy by reverse intersystem crossing. At least part of the triplet excitation energy generated in the light-emitting layer 120 is thus converted into singlet excitation energy by the organic compound 131. The singlet excitation energy is transferred to the guest material 133 and then is extracted as fluorescent emission. For this reason, a difference in energy level between singlet excitation energy and triplet excitation energy of the organic compound 131 is preferably larger than 0 eV and smaller than or equal to 0.2 eV. In addition, the singlet excitation energy level of the organic compound 131 is preferably higher than the singlet excitation energy level of the guest material 133, and the triplet excitation energy level of the organic compound 131 is preferably higher than the singlet excitation energy level of the guest material 133, in which case the triplet excitation energy level of the organic compound 131 can be closer to the singlet excitation energy level.

A wide-bandgap material is preferably used for the organic compound 132 to prevent deactivation of the organic compound 131 and the guest material 133. In other words, the singlet excitation energy level of the organic compound 132 is preferably higher than the singlet excitation energy level of the organic compound 131 and that of the guest material 133, and the triplet excitation energy level of the organic compound 132 is preferably higher than the triplet excitation energy level of the organic compound 131 and that of the guest material 133. The light-emitting layer 120 may contain other compounds having a function similar to the organic compound 132.

The guest material 133 may be a light-emitting organic material, which preferably is capable of emitting fluorescence (hereinafter also referred to as a fluorescent material). An example in which a fluorescent material is used as the guest material 133 will be described. Note that the guest material 133 may be referred to as the fluorescent material.

<2. Emission Mechanism of Light-Emitting Element>

First, an emission mechanism of the light-emitting element 150 will be described.

In the light-emitting element 150 of one embodiment of the present invention, voltage application between the pair of electrodes (the electrodes 101 and 102) allows electrons and holes to be injected from the cathode and the anode, respectively, into the EL layer 100 and thus current flows. By recombination of the injected electrons and holes, the guest material 133 in the light-emitting layer 120 of the EL layer 100 is brought into an excited state to provide light emission.

Note that light emission from the guest material 133 can be obtained through the following three processes:
(α) direct recombination process in a guest material;
(β) energy transfer process from a thermally activated delayed fluorescence substance; and
(γ) energy transfer process from a host material.

<<(α) Direct Recombination Process in a Guest Material>>

First, the direct recombination process in the guest material 133 is explained with reference to FIG. 2A, which is a schematic diagram showing the correlation between energy levels. Note that the following explains what terms and signs in FIG. 2A represent:

Host1 (131): the organic compound 131;
Host2 (132): the organic compound 132;
Guest (133): the guest material 133 (fluorescent material);
$S_A$: the level of the lowest singlet excitation energy of the organic compound 131;
$T_A$: the level of the lowest triplet excitation energy of the organic compound 131;
$S_H$: the level of the lowest singlet excitation energy of the organic compound 132;
$T_H$: the level of the lowest triplet excitation energy of the organic compound 132;
$S_G$: the level of the lowest singlet excitation energy of the guest material 133 (fluorescent material); and
$T_G$: the level of the lowest triplet excitation energy of the guest material 133 (fluorescent material).

Figure 2A:
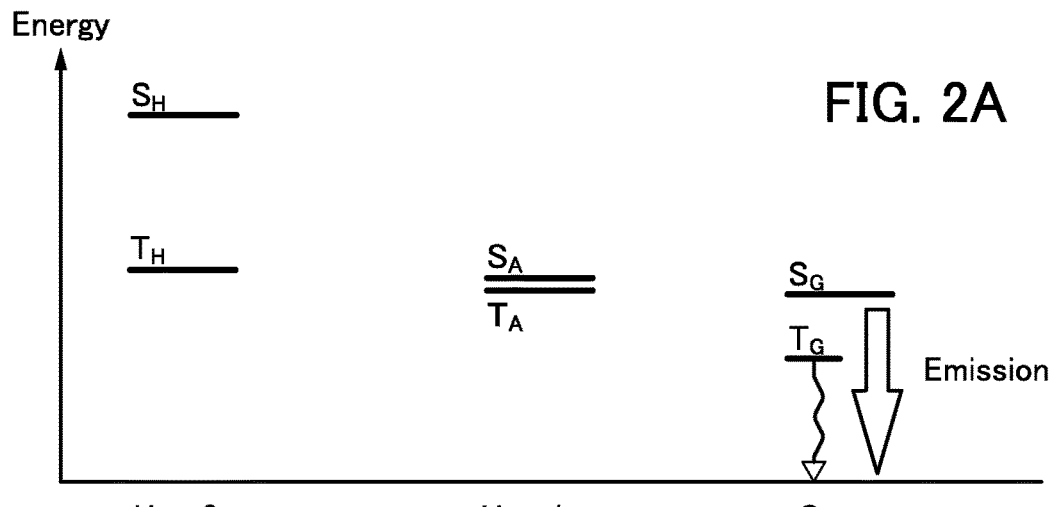
FIGS. 2A to 2C show correlations of energy levels in a light-emitting element of one embodiment of the present invention.

As shown in FIG. 2A, carriers (electrons and holes) are recombined in the guest material 133, and the guest material 133 is brought into an excited state. In the case where the excited state of the guest material 133 is a singlet excited state, fluorescence is obtained. In contrast, in the case where the excited state of the guest material 133 is a triplet excited state, thermal deactivation occurs.

In the (α) direct recombination process in a guest material, high emission efficiency can be obtained from the singlet excited state of the guest material 133 when the fluorescence quantum efficiency of the guest material 133 is high. However, the triplet excited state of the guest material 133 does not contribute to light emission.

<<(β) Energy Transfer Process from a Thermally Activated Delayed Fluorescence Substance>>

Figure 2B:
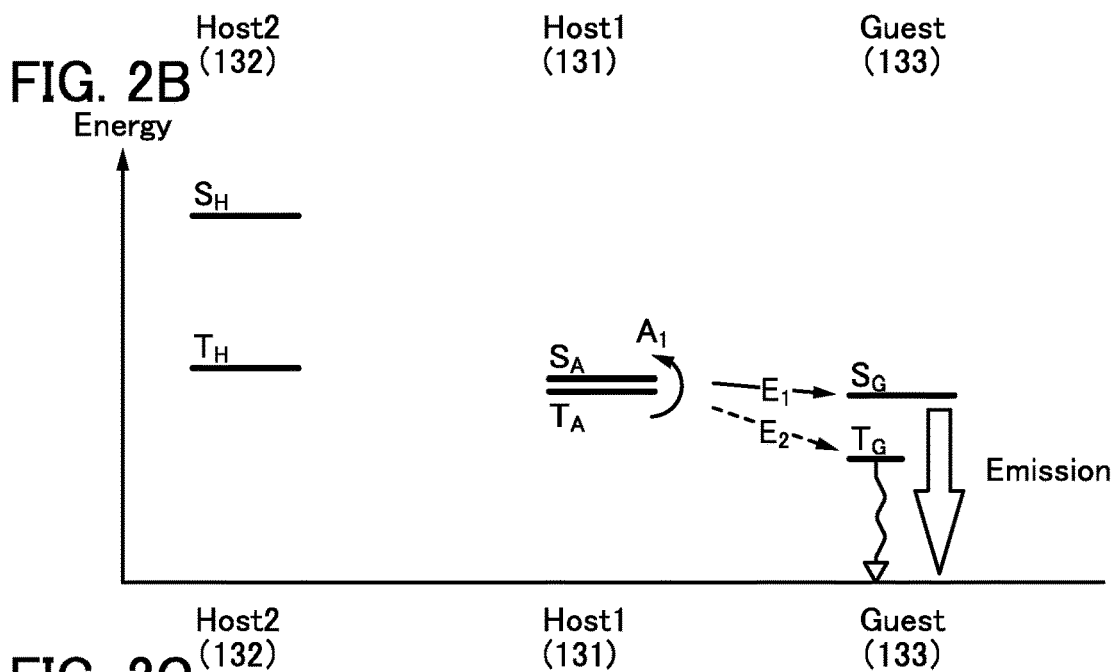

Next, the energy transfer process of the organic compound 131 and the guest material 133 is described with reference to FIG. 2B, which is a schematic diagram showing the correlation between energy levels. Note that indication and numerals in FIG. 2B are similar to those in FIG. 2A.

Carriers are recombined in the organic compound 131, and the organic compound 131 is brought into an excited state. In the case where the excited state of the organic compound 131 is a single excited state and $S_A$ of the organic compound 131 is higher than $S_G$ of the guest material 133, the singlet excitation energy of the organic compound 131 is transferred from $S_A$ of the organic compound 131 to $S_G$ of the guest material 133 as shown by a route $E_1$ in FIG. 2B, whereby the guest material 133 is brought into the singlet excited state. Fluorescence is obtained from the guest material 133 in the singlet excited state.

Note that since direct transition of the guest material 133 from a singlet ground state to a triplet excited state is forbidden, energy transfer from the organic compound 131 in the singlet excited state to the guest material 133 in the triplet excited state is unlikely to be a main energy transfer process; therefore, the description is omitted. In other words, energy transfer from the organic compound 131 in the singlet excited state to the guest material 133 in the singlet excited state as shown in the following general formula (G1) is important.

$$^1A^* + {}^1G \rightarrow {}^1A + {}^1G^* \tag{G1}$$

Note that in the general formula (G1), $^1A^*$ and $^1G^*$ represent the singlet excitation states of the organic compound 131 and the guest material 133, respectively, and $^1A$ and $^1G$ represent the singlet ground states of the organic compound 131 and the guest material 133, respectively.

In the case where the organic compound 131 is brought into a triplet excitation state, fluorescence is obtained through the following two processes.

Since the organic compound 131 is a thermally activated delayed fluorescence substance, excitation energy is transferred from $T_A$ to $S_A$ of the organic compound 131 by reverse intersystem crossing (upconversion) as shown by a route $A_1$ in FIG. 2B. This is the first process.

Subsequently, in the case where $S_A$ of the organic compound 131 is higher than $S_G$ of the guest material 133, excitation energy is transferred from $S_A$ of the organic compound 131 to $S_G$ of the guest material 133 as shown by the route $E_1$ in FIG. 2B, whereby the guest material 133 is brought into the singlet excited state. This is the second process. Fluorescence is obtained from the guest material 133 in the singlet excited state.

The first and second processes are represented by the following general formula (G2).

$$^3A^* + {}^1G \rightarrow \text{(reverse intersystem crossing)} \rightarrow {}^1A^* + {}^1G \rightarrow {}^1A + {}^1G^* \tag{G2}$$

Note that in the general formula (G2), $^3A^*$ represents the triplet excitation state of the organic compound 131; $^1A^*$ and $^1G^*$ represent the singlet excitation states of the organic compound 131 and the guest material 133, respectively; and $^1A$ and $^1G$ represent the singlet ground states of the organic compound 131 and the guest material 133, respectively.

As represented by the general formula (G2), the singlet excited state ($^1A^*$) of the organic compound 131 is generated from the triplet excited state ($^3A^*$) of the organic compound 131, which is a thermally activated delayed fluorescence substance, by reverse intersystem crossing. Then, excitation energy is transferred to the singlet excited state ($^1G^*$) of the guest material 133.

When all the energy transfer processes described in the (β) Energy transfer process from a thermally activated delayed fluorescence substance occur efficiently, both the triplet excitation energy and the singlet excitation energy of the organic compound 131 are efficiently converted into the singlet excited state ($^1G^*$) of the guest material 133, leading to high-efficiency light emission.

However, if the organic compound 131 releases excitation energy as light or heat and is deactivated before the excitation energy is transferred from the singlet excited state of the organic compound 131 to the singlet excited state of the guest material 133, the emission efficiency of the light-emitting element is decreased. In addition, the emission efficiency is also decreased by a decrease in efficiency of $A_1$, which is the previous process where the organic compound 131 is transferred from a triplet excited state to a singlet excited state by reverse intersystem crossing. The energy difference between $T_A$ and $S_A$ is large particularly when $T_A$ of the organic compound 131 is lower than $T_G$ of the guest material 133 and $S_A \geq S_G > T_G > T_A$ is satisfied. As a result, the reverse intersystem crossing shown by the route $A_1$ in FIG. 2B is unlikely to occur; accordingly, the efficiency of the subsequent energy transfer process shown by the route $E_1$ is decreased to lower efficiency for generating a singlet excited state of the guest material 133. Thus, $T_A$ is preferably higher than $T_G$, that is, emission energy of the organic compound 131, which is a thermally activated delayed fluorescence substance, is preferably higher than phosphorescence emission energy of the guest material 133.

The excitation energy is thermally deactivated also when excitation energy is transferred from $T_A$ of the organic compound 131 to $T_G$ of the guest material 133 as shown by a route $E_2$ in FIG. 2B. It is thus preferable that the energy transfer process shown by the route $E_2$ in FIG. 2B be less likely to occur because the generation efficiency of the triplet excited state of the guest material 133 can be decreased and the occurrence of thermal deactivation of excitation energy can be reduced. Thus, the weight percentage of the guest material 133 is preferably smaller than that of the organic compound 131. Specifically, their weight ratio (the organic compound 131:the guest material 133) is preferably from 1:0.001 to 1:0.05, further preferably from 1:0.001 to 1:0.01.

Note that when the direct recombination process in the guest material 133 becomes dominant, the triplet excited state of the guest material 133 very likely to occur in the light-emitting layer to cause thermal deactivation of excited energy, resulting in a decreased emission efficiency. That is, it is preferable that the probability of the (β) energy transfer process from a thermally activated delayed fluorescence substance be higher than that of the (α) direct recombination process in a guest material because the generation efficiency of the triplet excited state of the guest material 133 can be decreased and the occurrence of thermal deactivation of excited energy when the excited state of the guest material 133 is a triplet excited state can be reduced. Thus, as mentioned above, it is preferable that the weight percentage of the guest material 133 be smaller than that of the organic compound 131. Specifically, their weight ratio (the organic compound 131:the guest material 133) is preferably from 1:0.001 to 1:0.05, further preferably from 1:0.001 to 1:0.01.

<<(γ) Energy Transfer Process from a Host Material>>

Figure 2C:
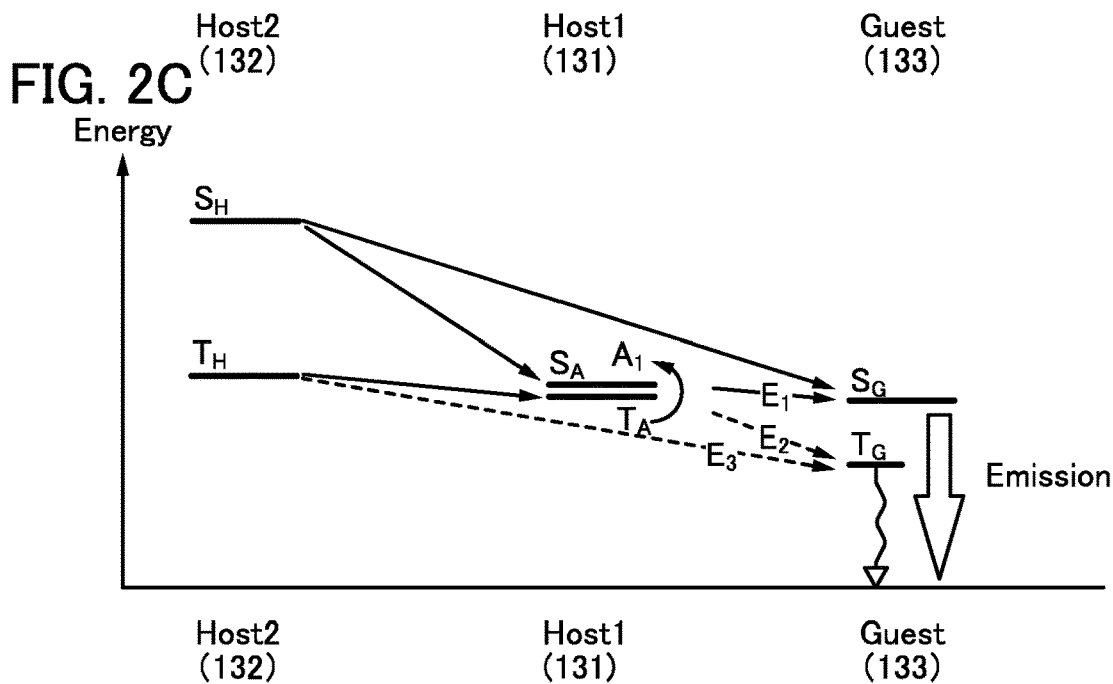

Next, the energy transfer process from the organic compound 132 to the organic compound 131 or the guest material 133 is described with reference to FIG. 2C, which is a schematic diagram showing the correlation between energy levels. Note that indication and numerals in FIG. 2C are similar to those in FIG. 2A.

Carriers are recombined in the organic compound 132, and the organic compound 132 is brought into an excited state. In the case where the excited state of the organic compound 132 is a single excited state and $S_H$ of the organic compound 132 is higher than $S_A$ of the organic compound 131 and $S_G$ of the guest material 133, the singlet excitation energy is transferred from $S_H$ of the organic compound 132 to $S_G$ of the guest material 133, whereby the guest material 133 is brought into the singlet excited state. Alternatively, the singlet excitation energy transferred from $S_H$ of the organic compound 132 to $S_A$ of the organic compound 131 is transferred to $S_G$ of the guest material 133 through the above-described (β) energy transfer process from a thermally activated delayed fluorescence substance. Fluorescence is obtained from the guest material 133 in the singlet excited state. Note that the organic compound 132 in this embodiment is a host material.

Note that since direct transition of the guest material 133 from a singlet ground state to a triplet excited state is forbidden, energy transfer from the organic compound 132 in the singlet excited state to the guest material 133 in the triplet excited state is unlikely to be a main energy transfer process; therefore, a description thereof is omitted. In other words, energy transfer from the organic compound 132 in the singlet excited state to the guest material 133 in the singlet excited state as shown in the following general formula (G3) or (G4) is possible.

$$^1H^* + {}^1A + {}^1G \rightarrow {}^1H + {}^1A + {}^1G^* \tag{G3}$$

$$^1H^* + {}^1A + {}^1G \rightarrow {}^1H + {}^1A^* + {}^1G \rightarrow {}^1H + {}^1A + {}^1G^* \tag{G4}$$

Note that in the general formula (G3) or (G4), $^1H^*$, $^1A^*$, and $^1G^*$ represent the singlet excitation states of the organic compound 132, the organic compound 131, and the guest material 133, respectively; and $^1H$, $^1A$, and $^1G$ represent the singlet ground states of the organic compound 132, the organic compound 131, and the guest material 133, respectively.

In the case where the exited state of the organic compound 132 is the triplet excited state, when $T_H$ of the organic compound 132 is higher than $T_A$ of the organic compound 131 and $S_A$ of the organic compound 131 is higher than $S_G$ of the guest material 133, fluorescence is obtained through the following process.

First, energy is transferred from $T_H$ of the organic compound 132 to $T_A$ of the organic compound 131.

Subsequently, as described in the (β) energy transfer process from a thermally activated delayed fluorescence substance, energy is transferred from $S_A$ of the organic compound 131 to $S_G$ of the guest material 133 through the reverse intersystem crossing (the route $A_1$) in the organic compound 131, which is a thermally activated delayed fluorescence substance, so that fluorescence is obtained from the guest material 133 in the singlet excited state.

The energy transfer process is expressed by the following general formula (G5).

$$^3H^* + {}^1A + {}^1G \rightarrow {}^1H + {}^3A^* + {}^1G \rightarrow \text{(reverse intersystem crossing)} \rightarrow {}^1H + {}^1A^* + {}^1G \rightarrow {}^1H + {}^1A + {}^1G^* \tag{G5}$$

Note that in the general formula (G5), $^3H^*$ and $^3A^*$ represent the triplet excitation states of the organic compounds 132 and 131, respectively; $^1A^*$, and $^1G^*$ represent the singlet excitation states of the organic compound 131 and the guest material 133, respectively; and $^1H$, $^1A$, and $^1G$ represent the singlet ground states of the organic compound 132, the organic compound 131, and the guest material 133, respectively.

As represented by the general formula (G5), the triplet excited state ($^3A^*$) of the organic compound 131 is generated from the triplet excited state ($^3H^*$) of the organic compound 132. Immediately after that, the singlet excited state ($^1A^*$) of the organic compound 131 is generated by reverse intersystem crossing, and then, energy is transferred to the singlet excited state ($^1G^*$) of the guest material 133.

When all the energy transfer processes described above in the (γ) energy transfer process from a host material occur efficiently, both the triplet excitation energy and the singlet excitation energy of the organic compound 132 are efficiently converted into the singlet excited state ($^1G^*$) of the guest material 133, and emission from the guest material 133 is possible.

However, if the organic compound 132 releases excitation energy as light or heat and is deactivated before the excitation energy is transferred from the singlet excited state of the organic compound 132 to the singlet excited state of the guest material 133, the emission efficiency of the light-emitting element is decreased. In addition, the emission efficiency is also decreased by a decrease in efficiency of the route $A_1$, which is the previous process where the organic compound 131 is transferred from a triplet excited state to a singlet excited state by reverse intersystem crossing. Particularly when $T_H$ of the organic compound 132 is lower than $T_A$ of the organic compound 131, energy transfer process from $T_H$ of the organic compound 132 to $T_A$ of the organic compound 131 is unlikely to occur and reverse intersystem crossing in the organic compound 131 does not occur, leading to a decrease in generation efficiency of a singlet excitation state of the guest material 133. Thus, $T_H$ of the organic compound 132 is preferably higher than $T_A$ of the organic compound 131.

In the case where excitation energy is transferred from the $T_H$ of the organic compound 132 to the $T_G$ of the guest material 133 as shown by a route $E_3$ in FIG. 2C, the excitation energy is also thermally deactivated. Therefore, it is preferable that the energy transfer process shown by the route $E_3$ in FIG. 2C be less likely to occur because the generation efficiency of the triplet excited state of the guest material 133 can be decreased and the occurrence of thermal deactivation can be reduced. Thus, the weight percentage of the guest material 133 is preferably smaller than that of the organic compound 132. Specifically, their weight ratio (the organic compound 132:the guest material 133) is preferably from 1:0.001 to 1:0.05, further preferably from 1:0.001 to 1:0.01.

As described above, although part of excitation energy is converted into fluorescence of the guest material 133 in the (γ) energy transfer process from a host material, there is a possibility of thermal deactivation in the routes $E_2$ and $E_3$ in FIG. 2C. Thus, it is preferable that the probability of the (β) energy transfer process from a thermally activated delayed fluorescence substance be higher than those of the (γ) energy transfer process from a host material and the (α) direct recombination process in a guest material because the generation efficiency of the triplet excited state in the light-emitting layer 120 can be decreased, that is, the occurrence of thermal deactivation can be reduced and the emission efficiency of the light-emitting element 150 can be increased. Carrier recombination in the organic compound 131, which is a thermally activated delayed fluorescence substance, is important for increasing the probability of the (β) energy transfer process from a thermally activated delayed fluorescence substance.

<<Carrier Recombination>>

The relationship of energy level between the organic compound 131 and the organic compound 132 is important to generate carrier recombination in the organic compound 131. In particular, the relationship of energy level between a highest occupied molecular orbital (HOMO) and a lowest unoccupied molecular orbital (LUMO), or the relationship between an oxidation potential and a reduction potential is important.

Carriers injected from the pair of electrodes into the EL layer 100 reach the light-emitting layer 120, whereby they are injected into a substance included in the light-emitting layer 120. At this time, holes and electrons tend to enter more stable HOMO and LUMO, respectively. Thus, what is important for carrier recombination in the organic compound 131, which is a thermally activated delayed fluorescence substance, is that the HOMO level of the organic compound 131 is higher than or equal to the HOMO level of the organic compound 132 and that the LUMO level of the organic compound 131 is lower than or equal to the LUMO level of the organic compound 132. It is also important that the oxidation potential of the organic compound 131 is lower than or equal to the oxidation potential of the organic compound 132 and the reduction potential of the organic compound 131 is higher than or equal to the reduction potential of the organic compound 132.

In such a structure, exciplexes are unlikely to be formed between the organic compounds 131 and 132.

Although carriers can easily transfer between adjacent molecules of the organic compound 131 in the light-emitting layer 120, carriers easily transfer also to a functional layer (e.g., the hole-transport layer 112 and the electron-transport layer 118) other than the light-emitting layer 120. It is thus preferable that the weight percentage of the organic compound 131 is smaller than that of the organic compound 132 for carrier recombination in the organic compound 131 in the light-emitting layer 120. In addition, in order to suppress energy transfer between excited-state molecules and ground-state molecules of the organic compound 131, the weight percentage of the organic compound 131 is preferably smaller than that of the organic compound 132. In the case where a molecule of the organic compound 131 is adjacent to a molecule of the guest material 133, there is a possibility of energy transfer from a triplet excitation state of the organic compound 131 to a triplet excitation state of the guest material 133. Thus, the weight percentage of the organic compound 131 is preferably smaller than that of the organic compound 132 in order to suppress the energy transfer. Specifically, their weight ratio (the organic compound 132:the organic compound 131) is preferably from 1:0.05 to 1:0.5.

<3. Energy Transfer Mechanism>

Next, factors controlling the above-described processes of intermolecular energy transfer between the organic compound 131 or 132 and the guest material 133 are described. As mechanisms of the intermolecular energy transfer, two mechanisms, i.e., Förster mechanism (dipole-dipole interaction) and Dexter mechanism (electron exchange interaction), have been proposed. Although intermolecular energy transfer between the organic compound 131 and the guest material 133 is described here, the same is applied to intermolecular energy transfer between the organic compound 132 and the guest material 133.

<<Förster Mechanism>>

In Förster mechanism, energy transfer does not require direct contact between molecules and energy is transferred through a resonant phenomenon of dipolar oscillation between the organic compound 131 and the guest material 133. By the resonant phenomenon of dipolar oscillation, the organic compound 131 provides energy to the guest material 133, and thus, the organic compound 131 in an excited state is put in a ground state and the guest material 133 in a ground state is put in an excited state. Note that the rate constant $k_{h^* \to g}$ of Förster mechanism is expressed by Formula 1.

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \qquad \text{[Formula 1]}$$

In Formula 1, $v$ denotes a frequency, $f'_h(v)$ denotes a normalized emission spectrum of the organic compound 131 (a fluorescent spectrum in energy transfer from a singlet excited state, and a phosphorescent spectrum in energy transfer from a triplet excited state), $\varepsilon_g(v)$ denotes a molar absorption coefficient of the guest material 133, N denotes Avogadro's number, n denotes a refractive index of a medium, R denotes an intermolecular distance between the organic compound 131 and the guest material 133, τ denotes a measured lifetime of an excited state (fluorescence lifetime or phosphorescence lifetime), c denotes the speed of light, φ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the organic compound 131 and the guest material 133. Note that $K^2=2/3$ in random orientation.

<<Dexter Mechanism>>

In Dexter mechanism, the organic compound 131 and the guest material 133 are close to a contact effective range where their orbitals overlap, and the organic compound 131 in an excited state and the guest material 133 in a ground state exchange their electrons, which leads to energy transfer. Note that the rate constant $k_{h^* \to g}$ of Dexter mechanism is expressed by Formula 2.

$$k_{h^* \to g} = \left(\frac{2\pi}{h}\right) K^2 \exp\left(-\frac{2R}{L}\right) \int f'_h(v)\varepsilon'_g(v) dv \qquad \text{[Formula 2]}$$

In Formula 2, h denotes a Planck constant, K denotes a constant having an energy dimension, $v$ denotes a frequency, $f'_h(v)$ denotes a normalized emission spectrum of the organic compound 131 (a fluorescent spectrum in energy transfer from a singlet excited state, and a phosphorescent spectrum in energy transfer from a triplet excited state), $\varepsilon'_g(v)$ denotes a normalized absorption spectrum of the guest material 133, L denotes an effective molecular radius, and R denotes an intermolecular distance between the organic compound 131 and the guest material 133.

Here, the efficiency of energy transfer from the organic compound 131 to the guest material 133 (energy transfer efficiency $\phi_{ET}$) is expressed by Formula 3. In Formula 3, $k_r$ denotes a rate constant of a light-emission process (fluorescence in energy transfer from a singlet excited state, and phosphorescence in energy transfer from a triplet excited state) of the organic compound 131, $k_n$ denotes a rate constant of a non-light-emission process (thermal deactivation or intersystem crossing) of the organic compound 131, and τ denotes a measured lifetime of an excited state of the organic compound 131.

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \qquad \text{[Formula 3]}$$

According to Formula 3, it is found that the energy transfer efficiency #ET can be increased by increasing the rate constant $k_{h^* \to g}$ of energy transfer so that another competing rate constant $k_r + k_n$ (=1/τ) becomes relatively small.

<<Concept for Promoting Energy Transfer>>

In both the energy transfer processes of the general formulae (G1) and (G2), since energy is transferred from the singlet excited state ($^1A^*$) of the organic compound 131 to the singlet excited state ($^1G^*$) of the guest material 133, energy transfers by both Förster mechanism (Formula 1) and Dexter mechanism (Formula 2) occur.

First, an energy transfer by Förster mechanism is considered. When τ is eliminated from Formula 1 and Formula 3, it can be said that the energy transfer efficiency $\phi_{ET}$ is higher when the quantum yield φ (here, a fluorescence quantum yield because energy transfer from a singlet excited state is discussed) is higher. However, in practice, a more important factor is that the emission spectrum of the organic compound 131 (here, a fluorescent spectrum because energy transfer from a singlet excited state is discussed) largely overlaps with the absorption spectrum of the guest material 133 (absorption corresponding to the transition from the singlet ground state to the singlet excited state). Note that it is preferable that the molar absorption coefficient of the guest material 133 be also high. This means that the emission spectrum of the organic compound 131 overlaps with the absorption band of the guest material 133 which is on the longest wavelength side.

Next, an energy transfer by Dexter mechanism is considered. According to Formula 2, in order to increase the rate constant $k_{h^*\rightarrow g}$, it is preferable that an emission spectrum of the organic compound 131 (here, a fluorescent spectrum because energy transfer from a singlet excited state is discussed) largely overlap with an absorption spectrum of the guest material 133 (absorption corresponding to transition from a singlet ground state to a singlet excited state).

The above description suggests that the energy transfer efficiency can be optimized by making the emission spectrum of the organic compound 131 overlap with the absorption band of the guest material 133 which is on the longest wavelength side.

In view of this, one embodiment of the present invention provides a light-emitting element which includes the organic compound 131 having a function as an energy donor capable of efficiently transferring energy to the guest material 133. The organic compound 131 is a thermally activated delayed fluorescence substance and thus has a feature that the singlet excitation energy level and the triplet excitation energy level are close to each other. Specifically, it is preferable that the organic compound 131 have a difference of larger than 0 eV and smaller than or equal to 0.2 eV between the singlet excitation energy level and the triplet excitation energy level. This enables transition (reverse intersystem crossing) of the organic compound 131 from the triplet excited state to the singlet excited state to be likely to occur. Therefore, the generation efficiency of the singlet excited state of the organic compound 131 can be increased. Furthermore, in order to facilitate energy transfer from the singlet excited state of the organic compound 131 to the singlet excited state of the guest material 133 having a function as an energy acceptor, it is preferable that the emission spectrum of the organic compound 131 overlap with the absorption band of the guest material 133 which is on the longest wavelength side. Thus, the generation efficiency of the singlet excited state of the guest material 133 can be increased.

In addition, in the light-emitting element 150 of one embodiment of the present invention, the HOMO level of the organic compound 131 is higher than or equal to the HOMO level of the organic compound 132, and the LUMO level of the organic compound 131 is lower than or equal to the LUMO level of the organic compound 132; or the oxidation potential of the organic compound 131 is lower than or equal to the oxidation potential of the organic compound 132 and the reduction potential of the organic compound 131 is higher than or equal to the reduction potential of the organic compound 132, which allows recombination of carriers injected into the EL layer 100 to be performed efficiently in the organic compound 131. Thus, the occurrence of thermal deactivation can be reduced and the emission efficiency can be increased.

<4. Materials>

Next, components of a light-emitting element of one embodiment of the present invention are described in detail.

<<Light-Emitting Layer>>

The organic compound 131 in the light-emitting layer 120 is composed of one kind of material. Note that another compound having a function similar to the organic compound 131 may be included in the light-emitting layer 120. For example, in the case where the organic compound 131 is composed of one kind of material, any of the following materials can be used.

First, a fullerene, a derivative thereof, an acridine derivative such as proflavine, eosin, or the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)), which are shown in the following structural formulae.

[Chemical Formula 1]

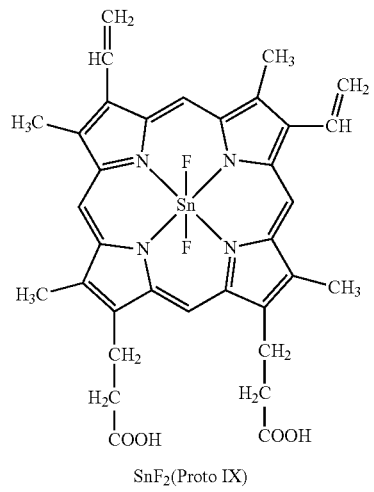

$SnF_2$(Proto IX)

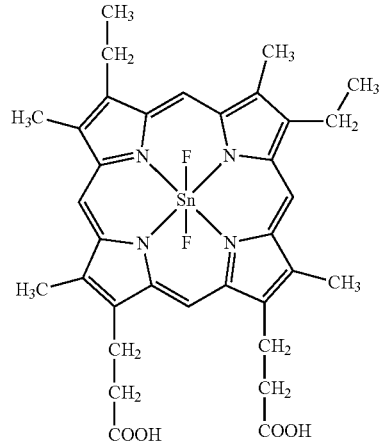

$SnF_2$(Meso IX)

-continued

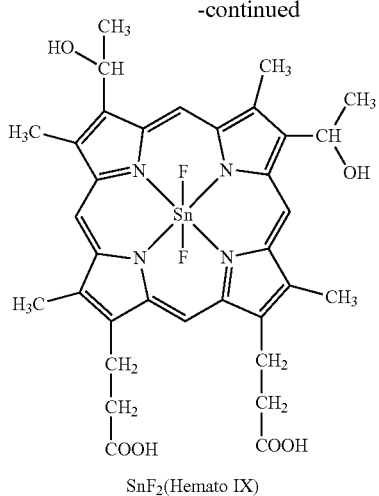

SnF₂(Hemato IX)

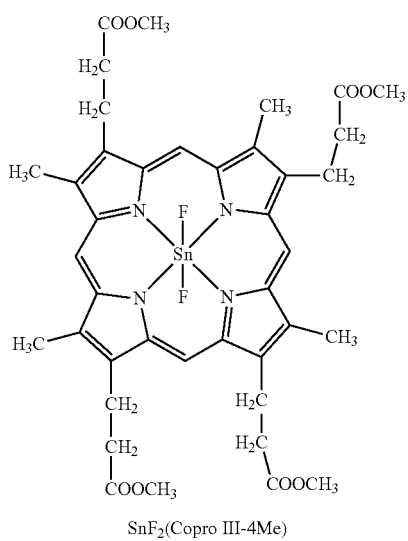

SnF₂(Copro III-4Me)

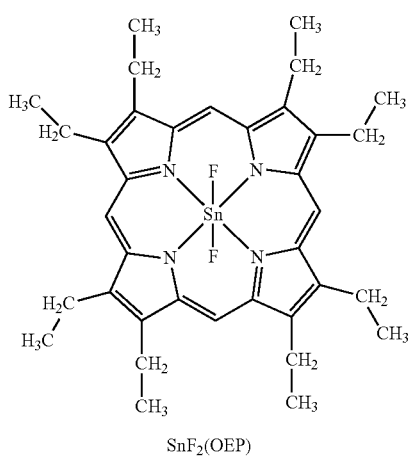

SnF₂(OEP)

-continued

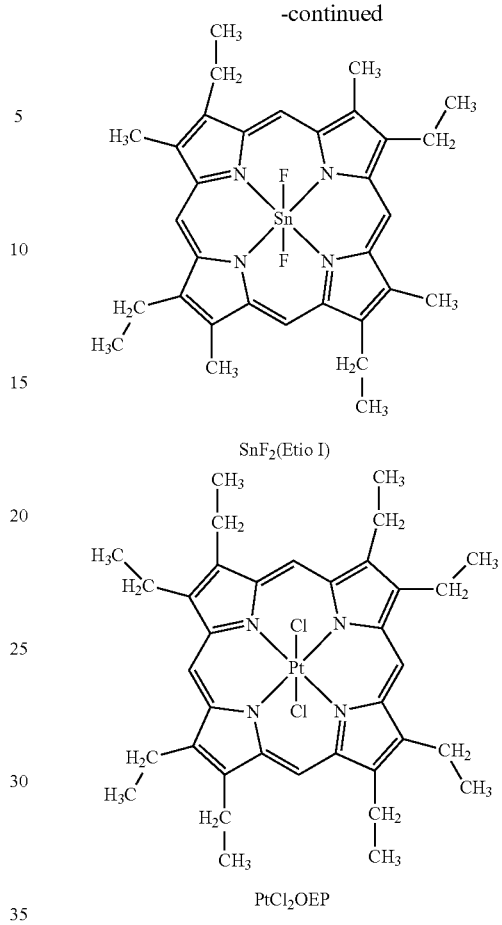

SnF₂(Etio I)

PtCl₂OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazine-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) shown in the following structural formulae, can be used as the organic compound 131. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small. The heterocyclic compound is preferably used because of the π-electron rich heteroaromatic ring and the π-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have favorable stability and reliability and are particularly preferable. Among skeletons having the π-electron rich heteroaromatic ring, an acridine skeleton, a phenoxazine skeleton, or a 3-(9-phenyl-9H-carbazole-3-yl)-9H-carbazole skeleton has favorable stability and reliability; thus, any of the skeletons is particularly preferable. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small.

[Chemical Formula 2]

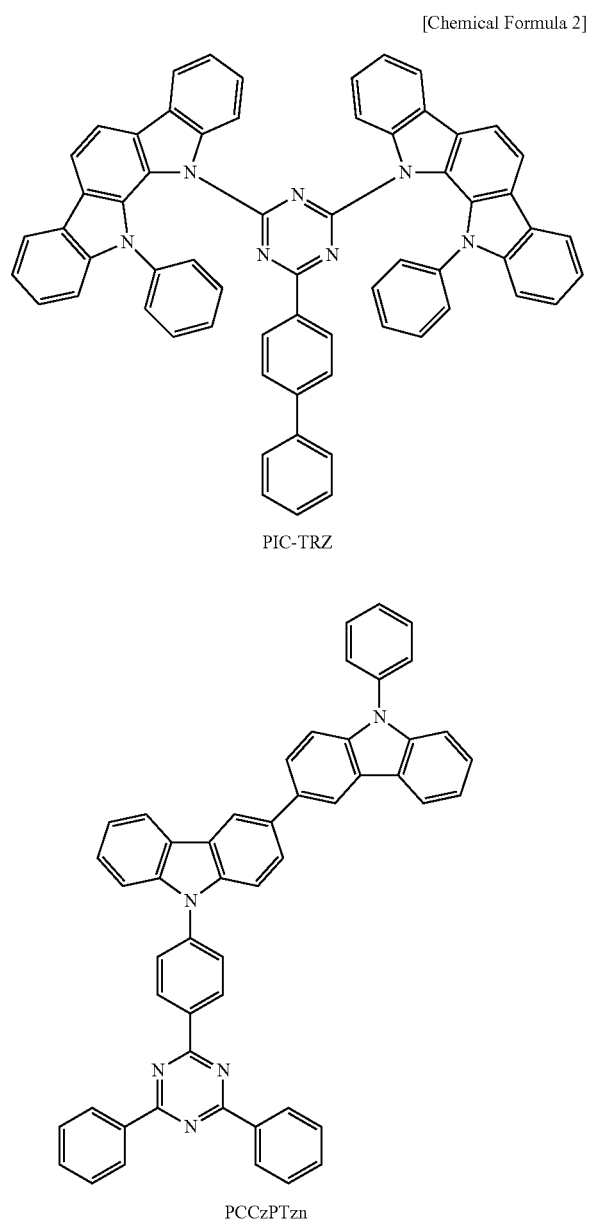

The following compounds can be used as the organic compound 132 in the light-emitting layer 120. Because the organic compound 132 functions as a host material in the light-emitting layer 120, it preferably contains a skeleton which easily receives electrons (a skeleton having an electron-transport property) and/or a skeleton which easily receives holes (a skeleton having an hole-transport property).

As the compound containing a skeleton which easily accepts electrons (a skeleton having an electron-transport property), a compound, a metal complex, or the like including a π-electron deficient heteroaromatic skeleton can be used. Specific examples include a metal complex such as bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having an azole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: Co11), 2,2',2"-(1,3,5-benzenetriyl)tris(1-phenyl-1H-benzimidazole) (abbreviation: TPBI), or 2-[3-(dibenzothiophene-4-yl)phenyl]-1-phenyl-1H-benzimidazole (abbreviation: mDBTBIm-II); a heterocyclic compound having a diazine skeleton such as 2-[3-(dibenzothiophene-4-yl)phenyl]dibenzo[f,h]quinoxaline (abbreviation: 2mDBTPDBq-II), 2-[3'-(dibenzothiophene-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[3-(3,9'-bi-9H-carbazol-9-yl)phenyl]dibenzo[f,h]quinoxaline (abbreviation: 2mCzCzPDBq), 4,6-bis[3-(9H-carbazol-9-yl)phenyl]pyrimidine (abbreviation; 4,6mCzP2Pm), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); a heterocyclic compound having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the heterocyclic compounds, the heterocyclic compounds having diazine skeletons (pyrimidine, pyrazine, pyridazine) or having a pyridine skeleton are highly reliable and stable and is thus preferably used. In addition, the heterocyclic compounds having the skeletons have a high electron-transport property to contribute to a reduction in drive voltage.

As the compound having a skeleton which easily accepts holes (a skeleton having a hole-transport property), a compound having a π-electron rich heteroaromatic skeleton, an aromatic amine skeleton, or the like can be favorably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); N-(1,1'-biphenyl-4-yl)-9,9-dimethyl-N-[4-(9-phenyl-9H-carbazol-3-yl)phenyl]-9H-fluoren-2-amine (abbreviation: PCBBiF), a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation:Cz2DBT), or 9-phenyl-9H-3-(9-phenyl-9H-carbazol-3-yl)carbazole (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above-described compounds, a compound including any one or more of a furan skeleton, a thiophene skeleton, a fluorine skeleton, and a pyrrole skeleton is preferable because it is stable and reliable and has a high hole-transport property to contribute to a reduction in driving voltage.

In addition, among the above-described compounds, a compound including a pyridine skeleton or a diazine skeleton (a pyrimidine skeleton, a pyrazine skeleton, and a pyridazine skeleton) as a π-electron deficient heteroaromatic skeleton and including any one or more of a furan skeleton, a thiophene skeleton, a fluorine skeleton, and a pyrrole skeleton as a π-electron rich heteroaromatic skeleton has a high carrier-transport property and thus contributes to a reduction in driving voltage. In addition, a compound including any of the skeletons has favorable reliability and thus is preferable. Note that an indole skeleton, a carbazole skeleton, or the 3-(9H-carbazol-9-yl)-9H-carbazole skeleton is particularly preferable as a pyrrole skeleton.

Note that the above-described compounds are non-limiting examples of the organic compounds 131 and 132, and other materials may be used as long as they can transport carriers and they satisfy the following conditions: the HOMO level of the organic compound 131 is higher than or equal to the HOMO level of the organic compound 132, and the LUMO level of the organic compound 131 is lower than or equal to the LUMO level of the organic compound 132; or the oxidation potential of the organic compound 131 is lower than or equal to the oxidation potential of the organic compound 132 and the reduction potential of the organic compound 131 is higher than or equal to the reduction potential of the organic compound 132. In addition, a thermally activated delayed fluorescence substance may be used for the organic compound 132.

Table 1 shows measurement results of HOMO and LUMO levels of the above-described compounds in the thin-film state, which are non-limiting examples of the organic compounds 131 and 132. Table 2 shows measurement results of the oxidation potentials and the reduction potentials of the compounds in the solution state and the HOMO and LUMO levels estimated from the results. Table 3 shows measurement results of the triplet excitation energy levels. The structures and abbreviations of these compounds are shown below.

[Chemical Formula 3]

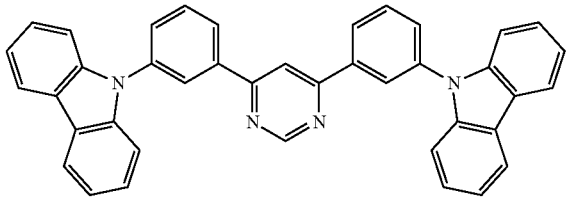

4,6mCzP2Pm

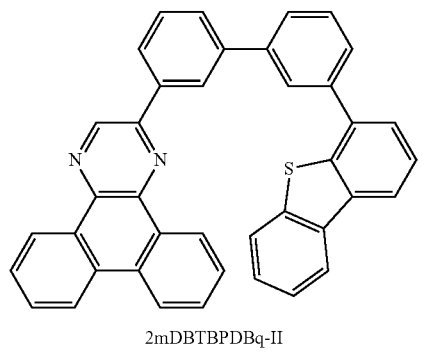

2mDBTBPDBq-II

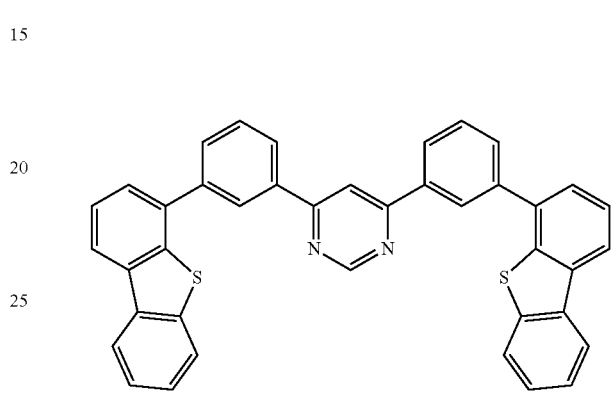

4,6mDBTP2Pm-II

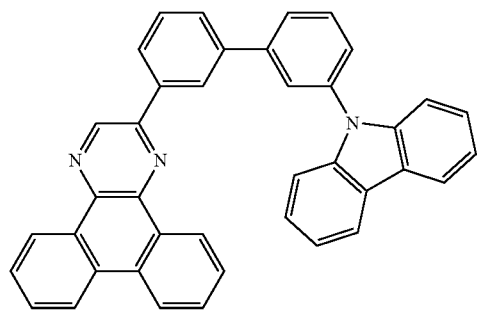

2mCzBPDBq

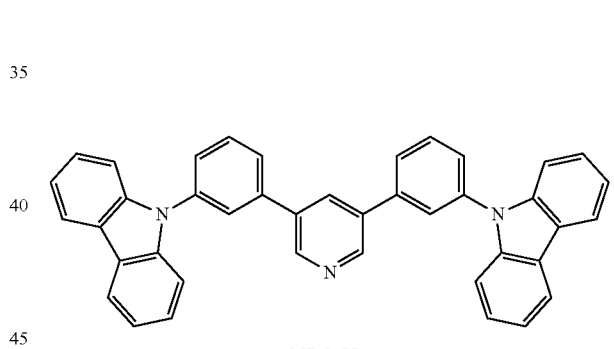

35DCzPPy

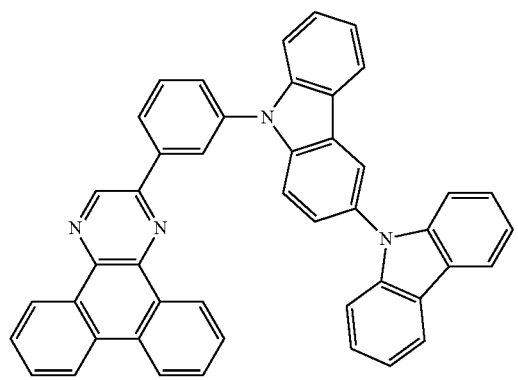

2mCzCzPDBq

TABLE 1

|  | Abbreviation | HOMO(eV) in thin-film state | LUMO(eV) in thin-film state |
|---|---|---|---|
| Organic compound 131 (First organic compound) | PCCzPTzn | −5.86 | −3.01 |
|  | PXZ-TRZ | −5.63 | −3.13 |
| Organic compound 132 (Second organic compound) | 2mDBTBPDBq-II | −6.17 | −3.07 |
|  | 2mCzBPDBq | −5.78 | −2.67 |
|  | 2mCzCzPDBq | −5.95 | −2.88 |
|  | 4,6mDBTP2Pm-II | −6.36 | −2.87 |
|  | 4,6mCzP2Pm | −6.23 | −2.77 |
|  | 35DCzPPy | −6.21 | −2.73 |

TABLE 2

|  | Abbreviation | Oxidation potential(V) in solution state | Reduction potential(V) in solution state | HOMO(eV) estimated from oxidation potential in solution state | LUMO(eV) estimated from oxidation potential in solution state |
| --- | --- | --- | --- | --- | --- |
| Organic compound 131 (First organic compound) | PCCzPTzn | 0.70 | −1.97 | −5.64 | −2.97 |
|  | PXZ-TRZ | 0.39 | −1.95 | −5.33 | −2.99 |
| Organic compound 132 (Second organic compound) | 2mDBTBPDBq-II | 1.28 | −2.00 | −6.22 | −2.94 |
|  | 2mCzBPDBq | 0.97 | −1.99 | −5.91 | −2.95 |
|  | 2mCzCzPDBq | 0.80 | −1.97 | −5.74 | −2.97 |
|  | 4,6mDBTP2Pm-II | 1.28 | −2.12 | −6.22 | −2.83 |
|  | 4,6mCzP2Pm | 0.95 | −2.06 | −5.89 | −2.88 |
|  | 35DCzPPy | 0.96 | −2.56 | −5.90 | −2.39 |

TABLE 3

|  | Abbreviation | Triplet excitation energy level($T_1$) (eV) |
| --- | --- | --- |
| Organic compound 131 (First organic compound) | PCCzPTzn | 2.53 |
| Organic compound 132 (Second organic compound) | 2mDBTBPDBq-II | 2.41 |
|  | 2mCzCzPDBq | 2.42 |
|  | 4,6mDBTP2Pm-II | 2.62 |
|  | 4,6mCzP2Pm | 2.70 |
|  | 35DCzPPy | 2.75 |

To obtain the HOMO level of each compound in the thin-film state, the ionization potential of each compound was measured by a photoelectron spectrometer (AC-3, manufactured by Riken Keiki, Co., Ltd.) in the air, and the measured ionization potentials were converted into negative values. In addition, to estimate the optical bandgap of each compound in the solid state, an absorption spectrum of each compound in the thin-film state was measured and the absorption edge was obtained from Tauc plot with an assumption of direct transition. The LUMO energy in the thin-film state was calculated from the energy of the estimated bandgaps and the HOMO levels, which have been obtained.

Electrochemical characteristics (oxidation and reduction characteristics) of each compound in the solution state were measured by cyclic voltammetry (CV). Note that an electrochemical analyzer (ALS model 600A or 600C, product of BAS Inc.) was used for the measurement. In the measurements, the potential of a working electrode with respect to the reference electrode was changed within an appropriate range, whereby the oxidation peak potential and the reduction peak potential were obtained. In addition, the HOMO and LUMO levels of each compound were calculated from the estimated redox potential of the reference electrode of −4.94 eV and the obtained peak potentials.

The triplet excitation energy levels were measured by phosphorescence measurement of the compounds. The measurement was performed by using a PL microscope, LabRAM HR-PL, produced by HORIBA, Ltd., a He—Cd laser (325 nm) as excitation light, and a CCD detector at a measurement temperature of 10 K. The triplet excitation energy levels were calculated from a peak on the shortest wavelength side of the phosphorescent spectrum obtained by the measurement.

With the use of compounds which satisfy the following condition: the HOMO level of the organic compound 131 is higher than or equal to the HOMO level of the organic compound 132, and the LUMO level of the organic compound 131 is lower than or equal to the LUMO level of the organic compound 132; or the oxidation potential of the organic compound 131 is lower than or equal to the oxidation potential of the organic compound 132 and the reduction potential of the organic compound 131 is higher than or equal to the reduction potential of the organic compound 132, which are shown in Table 1 and Table 2 as an example, recombination of carriers injected into the EL layer 100 can be efficiently performed in the organic compound 131 and thus a light-emitting element with high emission efficiency can be provided.

In addition, with the use of compounds such that the triplet excitation energy level of the organic compound 132 is higher than that of the organic compound 131, which are shown in Table 3 as an example, energy can be easily transferred from the triplet excitation energy level of the organic compound 132 to that of the organic compound 131. Thus, the (γ) energy transfer process from a host material becomes easily occur and a light-emitting element with high emission efficiency can be provided.

In the light-emitting layer 120, the guest material 133 (fluorescent material) is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPm), N,N'-bis(3-methylphenyl)-N, N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenedia mine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N', N'-triphenyl-1,4-phenylenediamine (abbreviation: 2DPAPPA), N,N,N',N',N'',N'',N''',N'''-octaphenyldibenzo[g, p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis (1,1'-biphenyl-2-yl)-2-anthryl]-N,9-diphenyl-9H-carbazol-3-amine (abbreviation: 2PCABPhA), N-(9,10-diphenyl-2-anthryl)-N,N,N'-triphenyl-1,4-phenylenediamine (abbreviation: 2DPAPA), N-[9,10-bis(1,1'-biphenyl-2-yl)-2-anthryl]-N,N,N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), 5,6,11,12-tetraphenylnaphthacene (common name: rubrene), 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylide ne}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethe nyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethe nyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

Because the above-described materials of the guest material 133 are non-limiting examples, other materials may be used as long as light emission (thermally activated delayed fluorescence) of the organic compound 131 which is an energy donor overlaps with an absorption band (absorption corresponding to the transition of the guest material 133 from the singlet ground state to the singlet excited state) on the longest wavelength in an absorption spectrum of the guest material 133 which is an energy accepter.

Note that the light-emitting layer 120 can be formed by an evaporation method (including a vacuum evaporation method), an inkjet method, a coating method, gravure printing, or the like.

Next, details of other components of the light-emitting element 150 in FIG. 1A are described.

<<Pair of Electrodes>>

The electrode 101 and the electrode 102 have functions of injecting holes and electrons into the light-emitting layer 120. The electrodes 101 and 102 can be formed using a metal, an alloy, or a conductive compound, or a mixture or a stack thereof, for example. A typical example of the metal is aluminum; besides, a transition metal such as silver, tungsten, chromium, molybdenum, copper, or titanium, an alkali metal such as lithium, sodium, or cesium, or a Group 2 metal such as calcium or magnesium can be used. As the transition metal, a rare earth metal such as ytterbium (Yb) may be used. An alloy containing any of the above metals can be used as the alloy, and MgAg and AlLi can be given as examples. As the conductive compound, a metal oxide such as indium oxide-tin oxide (indium tin oxide) can be given. It is also possible to use an inorganic carbon-based material such as graphene as the conductive compound. As described above, the electrode 101 and/or the electrode 102 may be formed by stacking two or more of these materials.

Light emitted from the light-emitting layer 120 is extracted through the electrode 101 and/or the electrode 102. Therefore, at least one of the electrodes 101 and 102 transmits visible light. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

<<Hole-Injection Layer>>

The hole-injection layer 111 has a function of reducing a barrier for hole injection from the electrode 101 to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is more preferable because of its stability in the atmosphere, low hygroscopic property, and easiness of handling.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, an aromatic hydrocarbon, a stilbene derivative, or the like can be used. The compound including a skeleton that easily accepts holes which is described as an example of the organic compound 132 can be used. Furthermore, the hole-transport material may be a high molecular compound.

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 120, the HOMO level of the hole-transport layer 112 is preferably equal or close to the HOMO energy level of the hole-injection layer 111.

<<Electron-Transport Layer>>

The electron-transport layer 118 has a function of transporting, to the light-emitting layer 120, electrons injected from the electrode 102 through the electron-injection layer 119. A material having a property of transporting more electrons than holes can be used as an electron-transport material, and a material having an electron mobility of $1 \times 10^{-6}$ cm$^2$/Vs or higher is preferable. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; and a bipyridine derivative. The compound having a skeleton that easily accepts electrons which is described as an example of the organic compound 132 can be used.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given.

Note that the hole-injection layer 111, the hole-transport layer 112, the electron-transport layer 118, and the electron-injection layer 119 described above can each be formed by an evaporation method (including a vacuum evaporation method), an inkjet method, a coating method, a gravure printing method, or the like.

Besides the above-mentioned materials, an inorganic compound or a high molecular compound (e.g., an oligomer, a dendrimer, or a polymer) may be used for the hole-injection layer 111, the hole-transport layer 112, the light-emitting layer 120, the electron-transport layer 118, and the electron-injection layer 119.

<<Substrate>>

The light-emitting element 150 is fabricated over a substrate of glass, plastic, or the like. As the way of stacking layers over the substrate, layers may be sequentially stacked from the electrode 101 side or sequentially stacked from the electrode 102 side.

Note that, for example, glass, quartz, plastic, or the like can be used for the substrate over which the light-emitting element 150 can be formed. Alternatively, a flexible substrate can be used. The flexible substrate is a substrate that can be bent, such as a plastic substrate made of polycarbonate or polyarylate, for example. A film, an inorganic film formed by evaporation, or the like can also be used. Note that materials other than these can be used as long as they can function as a support in a manufacturing process of the light-emitting element and an optical element or as long as they have a function of protecting the light-emitting element and the optical element.

The light-emitting element 150 can be formed using a variety of substrates, for example. The type of substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of the glass substrate include a barium borosilicate glass substrate, an aluminoborosilicate glass substrate, and a soda lime glass substrate. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, polyvinyl chloride, and the like. Other examples are polyamide, polyimide, aramid, epoxy, an inorganic film formed by evaporation, paper, and the like.

Alternatively, a flexible substrate may be used as the substrate, and the light-emitting element may be provided directly on the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. By using such a substrate, a light-emitting element with high durability, a light-emitting element with high heat resistance, a lightweight light-emitting element, or a thin light-emitting element can be obtained.

The light-emitting element 150 may be formed over an electrode electrically connected to a field-effect transistor (FET), for example, which is formed over the above-mentioned substrate, so that an active matrix display device in which the FET controls the drive of the light-emitting element 150 can be manufactured.

In this embodiment, one embodiment of the present invention has been described. Embodiments of the present invention are described in other embodiments. Note that one embodiment of the present invention is not limited to the above examples. For example, one embodiment of the present invention is not limited to the above-described example in which the HOMO level of the organic compound 131 is higher than or equal to the HOMO level of the organic compound 132 and the LUMO level of the organic compound 131 is lower than or equal to the LUMO level of the organic compound 132, and the example in which the oxidation potential of the organic compound 131 is lower than or equal to the oxidation potential of the organic compound 132 and the reduction potential of the organic compound 131 is higher than or equal to the reduction potential of the organic compound 132. Depending on circumstances or conditions, in one embodiment of the present invention, the HOMO level of the organic compound 131 is not necessarily higher than or equal to the HOMO level of the organic compound 132, and the LUMO level of the organic compound 131 is not necessarily lower than or equal to the LUMO level of the organic compound 132. The oxidation potential of the organic compound 131 is not necessarily lower than or equal to the oxidation potential of the organic compound 132, and the reduction potential of the organic compound 131 is not necessarily higher than or equal to the reduction potential of the organic compound 132. Alternatively, one embodiment of the present invention is not limited to the above-described example in which the organic compound 131 is a substance which exhibits thermally activated delayed fluorescence at room temperature. Depending on circumstances or conditions, the organic compound 131 in one embodiment of the present invention may contain a substance other than the substance which exhibits thermally activated delayed fluorescence at room temperature, for example. Alternatively, depending on circumstances or conditions, the organic compound 131 in one embodiment of the present invention does not necessarily contain the substance which exhibits thermally activated delayed fluorescence at room temperature, for example. Alternatively, one embodiment of the present invention is not limited to the above example in which the weight percentage of the organic compound 131 is smaller than that of the organic compound 132. Depending on circumstances or conditions, the weight percentage of the organic compound 131 is not limited to be smaller than that of the organic compound 132.

The structure described above in this embodiment can be combined with any of the structures described in the other embodiments as appropriate.

Embodiment 2

In this embodiment, a light-emitting element having a structure different from that described in Embodiment 1 and an emission mechanism of the light-emitting element will be described below with reference to FIGS. 3A and 3B.

<Structure Example of Light-Emitting Element>

Figure 3A:
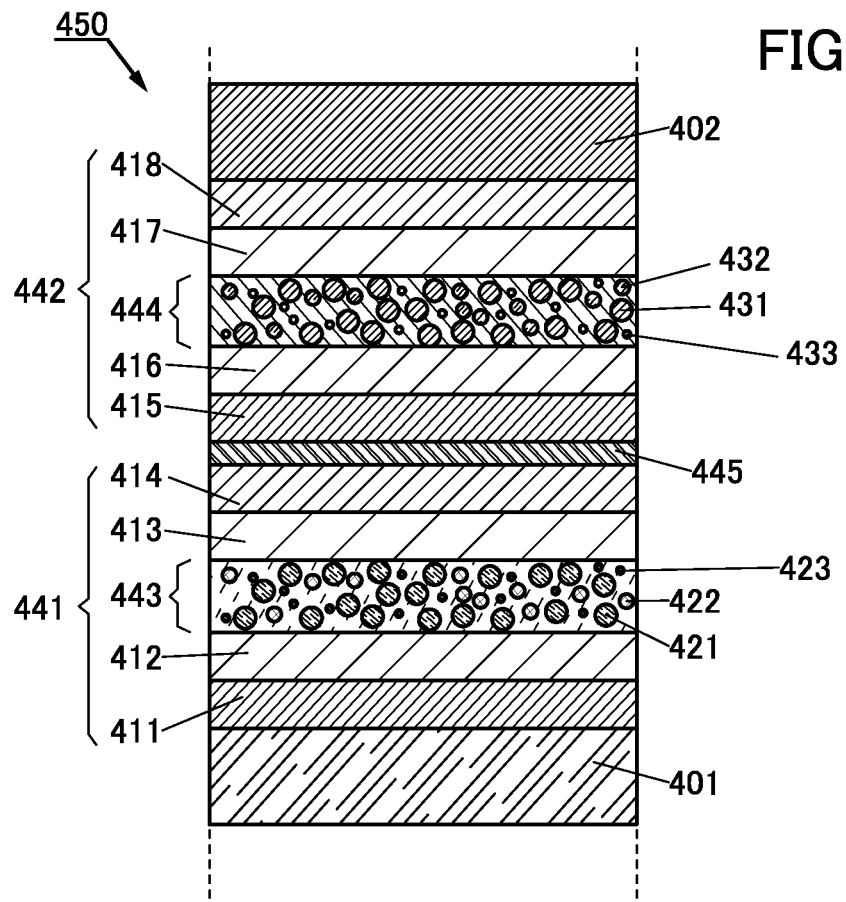
FIGS. 3A and 3B are a schematic cross-sectional view of a light-emitting element of one embodiment of the present invention and a diagram illustrating the correlation of energy levels in a light-emitting layer.

FIG. 3A is a schematic cross-sectional view of a light-emitting element 450.

The light-emitting element 450 illustrated in FIG. 3A includes a plurality of light-emitting units (in FIG. 3A, a light-emitting unit 441 and a light-emitting unit 442) between a pair of electrodes (an electrode 401 and an electrode 402). One light-emitting unit has the same structure as the EL layer 100 illustrated in FIG. 1A. That is, the light-emitting element 150 in FIG. 1A includes one light-emitting unit, while the light-emitting element 450 includes the plurality of light-emitting units. Note that the electrode 401 functions as an anode and the electrode 402 functions as a cathode in the following description of the light-emitting element 450; however, the functions may be interchanged in the light-emitting element 450.

In the light-emitting element 450 illustrated in FIG. 3A, the light-emitting unit 441 and the light-emitting unit 442 are stacked, and a charge-generation layer 445 is provided between the light-emitting unit 441 and the light-emitting unit 442. Note that the light-emitting unit 441 and the light-emitting unit 442 may have the same structure or different structures. For example, it is preferable that the EL layer 100 illustrated in FIGS. 1A and 1B be used in the light-emitting unit 441 and that a light-emitting layer containing a phosphorescent material as a light-emitting material be used in the light-emitting unit 442.

That is, the light-emitting element 450 includes a light-emitting layer 443 and a light-emitting layer 444. The light-emitting unit 441 includes a hole-injection layer 411, a hole-transport layer 412, an electron-transport layer 413, and an electron-injection layer 414 in addition to the light-emitting layer 443. The light-emitting unit 442 includes a hole-injection layer 415, a hole-transport layer 416, an electron-transport layer 417, and an electron-injection layer 418 in addition to the light-emitting layer 444.

The charge-generation layer 445 preferably contains a composite material of an organic material and a material having an electron accepting property. For the composite material, the composite material that can be used for the hole-injection layer 111 described in Embodiment 1 may be used. As the organic material, a variety of compounds such as an aromatic amine compound, a carbazole compound, an aromatic hydrocarbon, and a high molecular compound (such as an oligomer, a dendrimer, or a polymer) can be used. An organic material having a hole mobility of $1\times10^{-6}$ cm$^2$/Vs or higher is preferably used. Note that any other material may be used as long as it has a property of transporting more holes than electrons. Since the composite material of an organic material and a material having an electron accepting property has excellent carrier-injection and carrier-transport properties, low-voltage driving or low-current driving can be realized. Note that when a surface of a light-emitting unit on the anode side is in contact with the charge-generation layer 445 as that of the light-emitting unit 442, the charge-generation layer 445 can also serve as a hole-injection layer or a hole-transport layer of the light-emitting unit; thus, a hole-injection layer or a hole-transport layer does not need to be included in the light-emitting unit.

The charge-generation layer 445 may have a stacked-layer structure of a layer containing the composite material of an organic material and a material having an electron accepting property and a layer containing another material. For example, the charge-generation layer 445 may be formed using a combination of a layer containing the composite material of an organic material and a material having an electron accepting property with a layer containing one material selected from among materials having an electron donating and a compound having a high electron-transport property. Furthermore, the charge-generation layer 445 may be formed using a combination of a layer containing the composite material of an organic material and a material having an electron accepting property with a layer including a transparent conductive film.

The charge-generation layer 445 provided between the light-emitting unit 441 and the light-emitting unit 442 may have any structure as long as electrons can be injected to the light-emitting unit on one side and holes can be injected into the light-emitting unit on the other side when a voltage is applied between the electrode 401 and the electrode 402. For example, in FIG. 3A, the charge-generation layer 445 injects electrons into the light-emitting unit 441 and holes into the light-emitting unit 442 when a voltage is applied such that the potential of the electrode 401 is higher than that of the electrode 402.

The light-emitting element having two light-emitting units is described with reference to FIG. 3A; however, a similar structure can be applied to a light-emitting element in which three or more light-emitting units are stacked. With a plurality of light-emitting units partitioned by the charge-generation layer between a pair of electrodes as in the light-emitting element 450, it is possible to provide a light-emitting element which can emit light with high luminance with the current density kept low and has a long lifetime. A light-emitting element with low power consumption can be provided.

When the structure of the EL layer 100 shown in FIGS. 1A and 1B is applied to at least one of the plurality of units, a light-emitting element with high emission efficiency can be provided.

The light-emitting layer 443 contains an organic compound 421, an organic compound 422, and a guest material 423. The light-emitting layer 444 contains an organic compound 431, an organic compound 432, and a guest material 433.

In this embodiment, the light-emitting layer 443 has a structure similar to that of the light-emitting layer 120 in FIGS. 1A and 1B. That is, the organic compound 421, the organic compound 422, and the guest material 423 in the light-emitting layer 443 correspond to the organic compound 131, the organic compound 132, and the guest material 133 in the light-emitting layer 120, respectively. In the following description, the guest material 433 contained in the light-emitting layer 444 is a phosphorescent material. Note that the electrode 401, the electrode 402, the hole-injection layers 411 and 415, the hole-transport layers 412 and 416, the electron-transport layers 413 and 417, and the electron-injection layers 414 and 418 correspond to the electrode 101, the electrode 102, the hole-injection layer 111, the hole-transport layer 112, the electron-transport layer 118, and the electron-injection layer 119 in Embodiment 1, respectively. Therefore, detailed description thereof is omitted in this embodiment.

<Emission Mechanism of Light-Emitting Layer 443>

An emission mechanism of the light-emitting layer 443 is similar to that of the light-emitting layer 120 in FIGS. 2A to 2C.

<Emission Mechanism of Light-Emitting Layer 444>

Next, an emission mechanism of the light-emitting layer 444 will be described.

The organic compound 431 and the organic compound 432 which are contained in the light-emitting layer 444 form exciplexes. The organic compound 431 serves as a host material and the organic compound 432 serves as an assist material in the description here.

Although it is acceptable as long as the combination of the organic compound 431 and the organic compound 431 can form exciplexes in the light-emitting layer 444, it is preferred that one organic compound be a material having a hole-transport property and the other organic compound be a material having an electron-transport property.

Figure 3B:
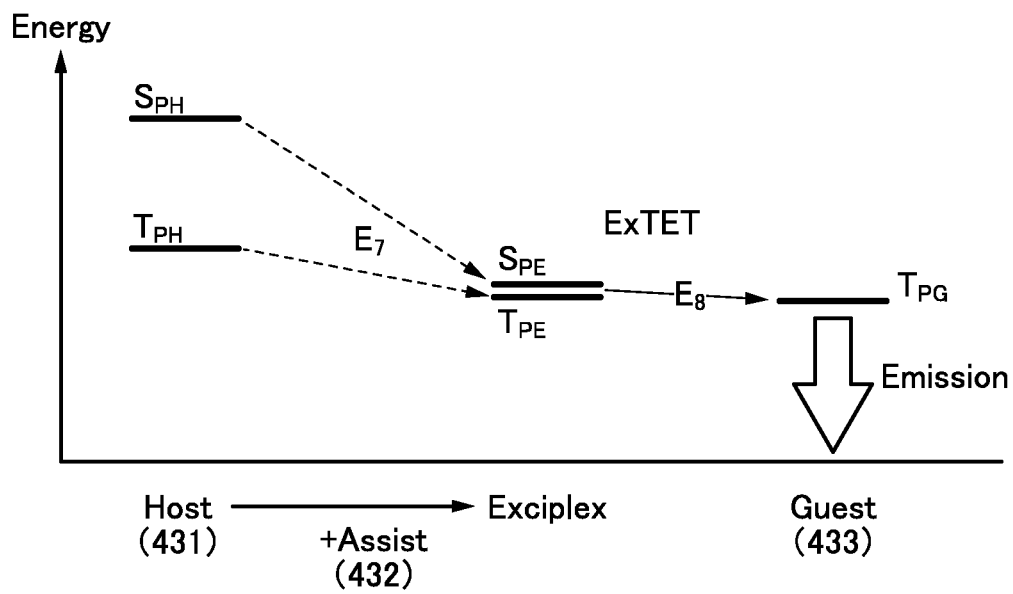

FIG. 3B illustrates the correlation of energy levels of the organic compound 431, the organic compound 432, and the guest material 433 in the light-emitting layer 444. The following explains what terms and signs in FIG. 3B represent:

Host (431): the host material (organic compound 431);
Assist (432): the assist material (organic compound 432);
Guest (433): the guest material 433 (phosphorescent material);
$S_{PH}$: the level of the lowest singlet excited state of the host material (organic compound 431);
$T_{PH}$: the level of the lowest triplet excited state of the host material (organic compound 431);
$T_{PG}$: the level of the lowest triplet excited state of the guest material 433 (the phosphorescent material);
$S_{PE}$: the level of the lowest singlet excited state of exciplexes; and
$T_{PE}$: the level of the lowest triplet excited state of exciplexes.

The level ($S_{PE}$) of the lowest singlet excited state of exciplexes, which is formed by the organic compound 432 and the organic compound 431 and the level ($T_{PE}$) of the lowest triplet excited state of exciplexes are close to each other (see $E_7$ in FIG. 3B).

Both energies of $S_{PE}$ and $T_{PE}$ of exciplexes are then transferred to the level ($T_{PG}$) of the lowest triplet excited state of the guest material 433 (the phosphorescent material); thus, light emission is obtained (see $E_8$ in FIG. 3B).

The above-described processes through a route $E_7$ and a route $E_8$ may be referred to as exciplex-triplet energy transfer (ExTET) in this specification and the like.

When one of the organic compounds 431 and 432 receiving holes and the other receiving electrons come close to each other, exciplexes are formed at once. Alternatively, when one compound is brought into an excited state, the one immediately interacts with the other compound to form exciplexes. Therefore, most excitons in the light-emitting layer 444 exist as exciplexes. The band gap of the exciplex is narrower than that of each of the organic compounds 431 and 432; therefore, the driving voltage of the light-emitting element can be lowered when exciplexes are formed.

When the light-emitting layer 444 has the above structure, light emission from the guest material 433 (the phosphorescent material) of the light-emitting layer 444 can be efficiently obtained.

Note that light emitted from the light-emitting layer 443 preferably has a peak on the shorter wavelength side than light emitted from the light-emitting layer 444. The luminance of a light-emitting element using the phosphorescent material emitting light with a short wavelength tends to degrade quickly. In view of the above, fluorescence is used for light emission with a short wavelength, so that a light-emitting element with less degradation of luminance can be provided.

Furthermore, the light-emitting layer 443 and the light-emitting layer 444 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 443 and the light-emitting layer 444 emit light of complementary colors, white light emission can be obtained.

In addition, white light emission with a high color rendering property that is formed of three primary colors or four or more colors can be obtained by using a plurality of light-emitting materials emitting light with different wavelengths for one of the light-emitting layers 443 and 444 or both. In that case, one of the light-emitting layers 443 and 444 or both may be divided into layers and each of the divided layers may contain a different light-emitting material from the others.

Next, materials that can be used for the light-emitting layers 443 and 444 will be described.

<Material that can be Used for Light-Emitting Layer 443>

A material that can be used for the light-emitting layer 120 described in Embodiment 1 may be used as a material that can be used for the light-emitting layer 443.

<Material that can be Used for Light-Emitting Layer 444>

In the light-emitting layer 444, the organic compound 431 (the host material) exists in the highest proportion in weight ratio, and the guest material 433 (the phosphorescent material) is dispersed in the organic compound 431 (the host material).

Examples of the organic compound 431 (the host material) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine, a carbazole derivative, and the like. In addition, the compound having a skeleton which easily accepts electrons and the compound having a skeleton which easily accepts holes, which are described in Embodiment 1, can be used.

As the guest material 433 (the phosphorescent material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand or the like can be given.

As the organic compound 432 (the assist material), a substance which can form exciplexes together with the organic compound 431 is used. In that case, it is preferable that the organic compound 431, the organic compound 432, and the guest material 433 (the phosphorescent material) be selected such that the emission peak of the exciplexes overlaps with an adsorption band, specifically an adsorption band on the longest wavelength side, of a triplet metal to ligand charge transfer (MLCT) transition of the phosphorescent material. This makes it possible to provide a light-emitting element with drastically improved emission efficiency. Note that in the case where a thermally activated delayed fluorescence material is used instead of the phosphorescent material, it is preferable that the adsorption band on the longest wavelength side be a singlet absorption band. Specifically, the compound having a skeleton which easily accepts electrons or the compound having a skeleton which easily accepts holes, which are described in Embodiment 1, can be used as the organic compound 432.

As the light-emitting material contained in the light-emitting layer 444, any material can be used as long as the material can convert triplet excitation energy into light emission. As an example of the material that can convert triplet excitation energy into light emission, a thermally activated delayed fluorescence material can be given in addition to the phosphorescent material. Therefore, the term "phosphorescent material" in the description can be replaced with the term "thermally activated delayed fluorescence material". Note that the thermally activated delayed fluorescence material is a material that can up-convert a triplet excited state into a singlet excited state (i.e., reverse inter-system crossing is possible) using a little thermal energy and efficiently exhibits light emission (fluorescence) from the singlet excited state. Thermally activated delayed fluorescence is efficiently obtained under the condition where the difference between the triplet excitation energy level and the singlet excitation energy level is larger than 0 eV and smaller than or equal to 0.2 eV, preferably larger than 0 eV and smaller than or equal to 0.1 eV.

There is no limitation on the emission colors of the light-emitting material included in the light-emitting layer 443 and the light-emitting material included in the light-emitting layer 444, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 443 is preferably shorter than that of the light-emitting material contained in the light-emitting layer 444.

Note that the light-emitting layers 443 and 444 can be formed by an evaporation method (including a vacuum evaporation method), an inkjet method, a coating method, gravure printing, or the like.

Note that the structure described above in this embodiment can be combined with any of the structures described in the other embodiments as appropriate.

Embodiment 3

In this embodiment, a light-emitting element having a structure different from those described in Embodiment 1 and Embodiment 2 will be described below with reference to FIGS. 4A and 4B.

<Structure Example of Light-Emitting Element>

Figure 4A:
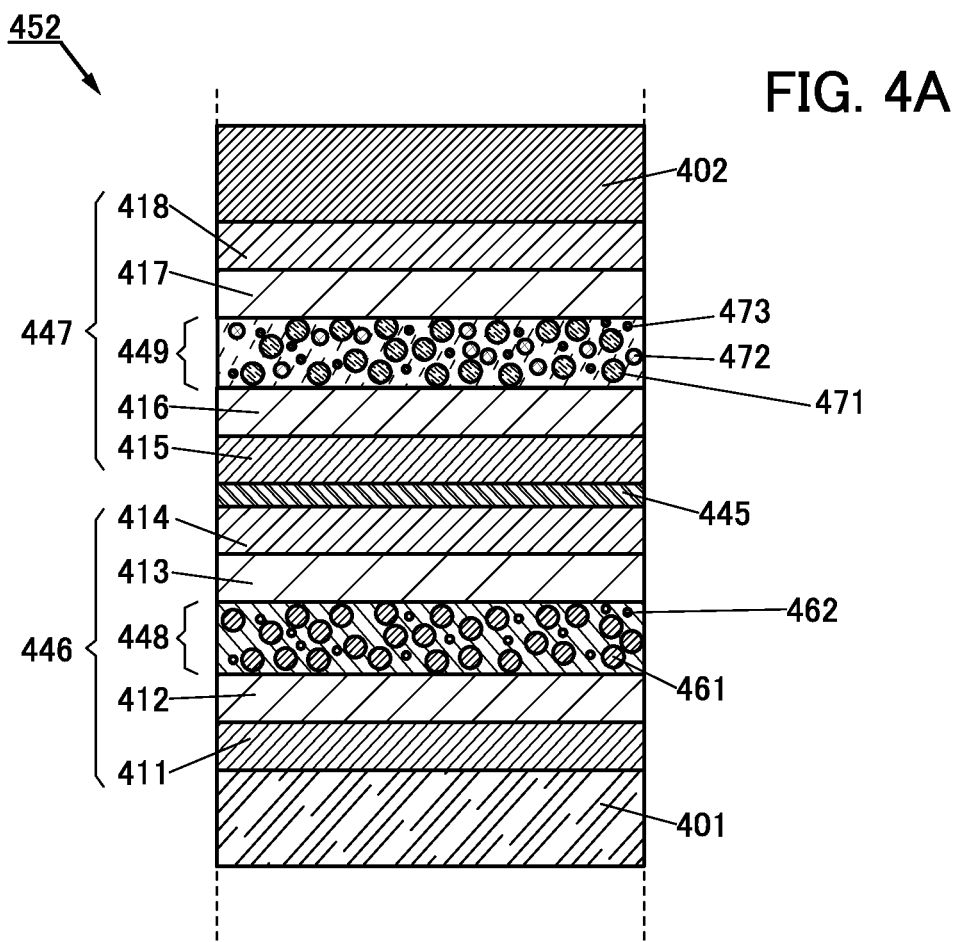
FIGS. 4A and 4B are a schematic cross-sectional view of a light-emitting element of one embodiment of the present invention and a diagram illustrating the correlation of energy levels in a light-emitting layer.

FIG. 4A is a schematic cross-sectional view of a light-emitting element 452 of one embodiment of the present invention.

The light-emitting element 452 includes a plurality of light-emitting units (in FIG. 4A, a light-emitting unit 446 and a light-emitting unit 447) between an electrode 401 and an electrode 402. One light-emitting unit has the same structure as the EL layer 100 illustrated in FIG. 1A. That is, the light-emitting element 150 in FIG. 1A includes one light-emitting unit, while the light-emitting element 452 includes the plurality of light-emitting units. Note that the electrode 401 functions as an anode and the electrode 402 functions as a cathode in the following description of this embodiment; however, the functions may be interchanged in the light-emitting element 452.

In the light-emitting element 452 illustrated in FIG. 4A, the light-emitting unit 446 and the light-emitting unit 447 are stacked, and a charge-generation layer 445 is provided between the light-emitting unit 446 and the light-emitting unit 447. Note that the light-emitting unit 446 and the light-emitting unit 447 may have the same structure or different structures. For example, it is preferable that a light-emitting layer containing a fluorescent material as a light-emitting material be used in the light-emitting unit 446 and that the EL layer 100 illustrated in FIG. 1A be used in the light-emitting unit 447.

That is, the light-emitting element 452 includes a light-emitting layer 448 and a light-emitting layer 449. The light-emitting unit 446 includes a hole-injection layer 411, a hole-transport layer 412, an electron-transport layer 413, and an electron-injection layer 414 in addition to the light-emitting layer 448. The light-emitting unit 447 includes a hole-injection layer 415, a hole-transport layer 416, an electron-transport layer 417, and an electron-injection layer 418 in addition to the light-emitting layer 449.

The light-emitting element having two light-emitting units is described with reference to FIG. 4A; however, a similar structure can be applied to a light-emitting element in which three or more light-emitting units are stacked. With a plurality of light-emitting units partitioned by the charge-generation layer between a pair of electrodes as in the light-emitting element 452, it is possible to provide a light-emitting element which can emit light with high luminance with the current density kept low and has a long lifetime. A display device with low power consumption can be provided.

When the structure of the EL layer 100 shown in FIG. 1A is applied to at least one of the plurality of units, a light-emitting element with high emission efficiency can be provided.

The light-emitting layer 448 contains a host material 461 and a guest material 462. The light-emitting layer 449 contains an organic compound 471, an organic compound 472, and a guest material 473.

In this embodiment, the light-emitting layer 449 has a structure similar to that of the light-emitting layer 120 in FIGS. 1A and 1B. That is, the organic compound 471, the organic compound 472, and the guest material 473 in the light-emitting layer 449 correspond to the organic compound 131, the organic compound 132, and the guest material 133 in the light-emitting layer 120, respectively. In the following description, the guest material 462 contained in the light-emitting layer 448 is a fluorescent material.

<Emission Mechanism of Light-Emitting Layer 448>

First, an emission mechanism of the light-emitting layer 448 will be described.

In the light-emitting layer 448, an excited state is generated by recombination of carriers. Because the amount of the host material 461 is large as compared to the guest material 462, the host material 461 is brought into an excited state by the exciton generation. The ratio of singlet excitons to triplet excitons generated by carrier recombination (hereinafter referred to as exciton generation probability) is approximately 1:3.

First, a case where the triplet excitation energy level of the host material 461 is higher than the triplet excitation energy level of the guest material 462 will be described below.

The triplet excitation energy level of the host material 461 is transferred to the triplet excitation energy level of the guest material 462 (triplet energy transfer). However, the guest material 462 in the triplet excitation energy state does not provide light emission in a visible light region because the guest material 462 is the fluorescent material. Thus, it is difficult to use the triplet excitation energy of the host material 461 for light emission. Therefore, when the triplet excitation energy level of the host material 461 is higher than the triplet excitation energy level of the guest material 462, it is difficult to use more than approximately 25% of injected carriers for light emission.

Figure 4B:
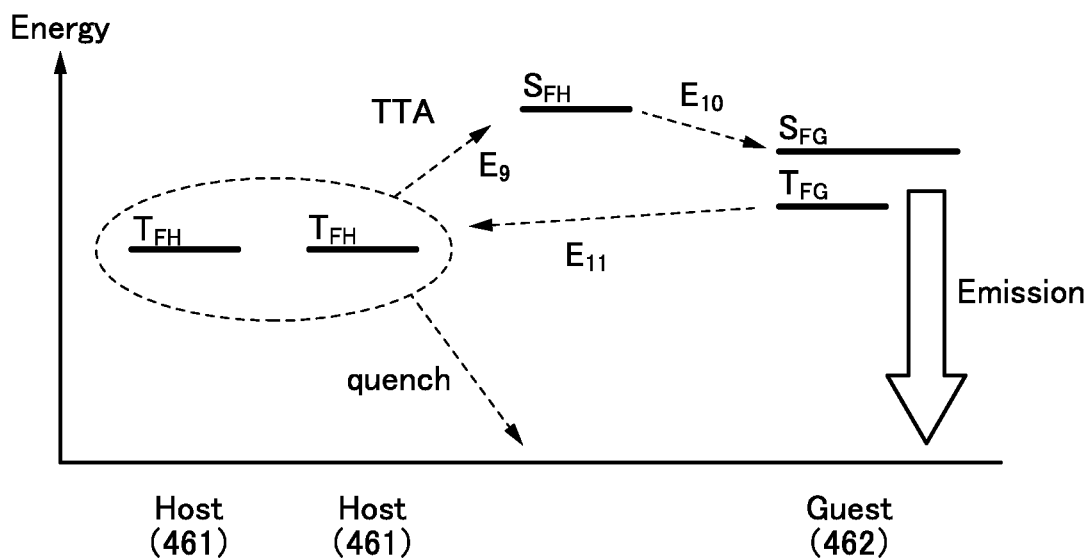

FIG. 4B illustrates the correlation of energy levels of the host material 461 and the guest material 462 in the light-emitting layer 448 of one embodiment of the present invention. The following explains what terms and signs in FIG. 4B represent:

Host (461): the host material 461;
Guest (462): the guest material 462 (fluorescent material);
$S_{FH}$: the level of the lowest singlet excited state of the host material 461;
$T_{FH}$: the level of the lowest triplet excited state of the host material 461;
$S_{FG}$: the level of the lowest singlet excited state of the guest material 462 (fluorescent material); and
$T_{FG}$: the level of the lowest triplet excited state of the guest material 462 (fluorescent material).

As illustrated in FIG. 4B, the triplet excitation energy level of the guest material 462 ($T_{FG}$ in FIG. 4B) is higher than the triplet excitation energy level of the host material 461 ($T_{FH}$ in FIG. 4B).

In addition, as illustrated in FIG. 4B, triplet excitons collide with each other by triplet-triplet annihilation (TTA) (see a route $E_9$ in FIG. 4B), and their excitation energy are partly converted into singlet excitons having an energy at the level of the lowest singlet excited state of the host material 461 ($S_{FH}$). The singlet excitation energy of the host material 461 is transferred from the level of the lowest singlet excited state of the host material 461 ($S_{FH}$) to the level of the lowest singlet excited state of the guest material 462 (the fluorescent material) ($S_{FG}$) that is a level lower than $S_{FH}$ (see a route $E_{10}$ in FIG. 4B). Thus, the guest material 462 (the fluorescent material) is brought into the singlet excited state and accordingly emits light.

Because the triplet excitation energy level of the host material 462 is lower than the triplet excitation energy level of the guest material, excitation energy at $T_{FG}$ is transferred to $T_{FH}$ without deactivation (see a route $E_{11}$ in FIG. 4B), which is utilized for TTA.

When the light-emitting layer 448 has the above structure, light emission from the guest material 462 of the light-emitting layer 448 can be efficiently obtained.

Note that the light-emitting layer 448 and the light-emitting layer 449 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 448 and the light-emitting layer 449 emit light of complementary colors, white light emission can be obtained.

In addition, white light emission with a high color rendering property that is formed of three primary colors or four or more colors can be obtained by using a plurality of light-emitting materials emitting light with different wavelengths for one of the light-emitting layers 448 and 449 or both. In that case, one of the light-emitting layers 448 and 449 or both may be divided into layers and each of the divided layers may contain a different light-emitting material from the others.

<Emission Mechanism of Light-Emitting Layer 449>

An emission mechanism of the light-emitting layer 449 is similar to that of the light-emitting layer 120 in FIGS. 2A to 2C.

Next, materials that can be used for the light-emitting layers 448 and 449 will be described.

<Material that can be Used for Light-Emitting Layer 448>

In the light-emitting layer 448, the host material 461 is present in the highest proportion in weight ratio, and the guest material 462 (the fluorescent material) is dispersed in the host material 461. The singlet excitation energy level of the host material 461 is preferably higher than the singlet excitation energy level of the guest material 462 (the fluorescent material), while the triplet excitation energy level of the host material 461 is preferably lower than the triplet excitation energy level of the guest material 462 (the fluorescent material).

An anthracene derivative or a tetracene derivative is preferably used as the host material 461. This is because these derivatives each have a high singlet excitation energy level and a low triplet excitation energy level. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H- dibenzo[c,g]carbazole (abbreviation: cgDBCzPA), 6-[3-(9, 10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). Besides, 5,12-diphenyltetracene, 5,12-bis(biphenyl-2-yl)tetracene, and the like can be given.

Examples of the guest material 462 (the fluorescent material) include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-diphenylpyrene-1,6-diamine (abbreviation: 1,6FLPAPm), N,N'-bis(dibenzofuran-2-yl)-N,N'-diphenylpyrene-1,6-diamine (abbreviation: 1,6FrAPm), N,N'-bis(dibenzothiophene-2-yl)-N,N'-diphenylpyrene-1,6-diamine (abbreviation: 1,6ThAPrn), and the like. Any of the fluorescent materials described in Embodiment 1 can be used.

<Material that can be Used for Light-Emitting Layer 449>

A material that can be used for the light-emitting layer 120 described in Embodiment 1 may be used as a material that can be used for the light-emitting layer 449.

There is no limitation on the emission colors of the light-emitting material included in the light-emitting layer 448 and the light-emitting material included in the light-emitting layer 449, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 448 is preferably shorter than that of the light-emitting material contained in the light-emitting layer 449.

Note that the light-emitting layers 448 and 449 can be formed by an evaporation method (including a vacuum evaporation method), an inkjet method, a coating method, gravure printing, or the like.

Note that the above-described structure can be combined with any of the structures in this embodiment and the other embodiments.

Embodiment 4

In this embodiment, a display device including a light-emitting element of one embodiment of the present invention will be described with reference to FIGS. 5A and 5B.

Figure 5A:
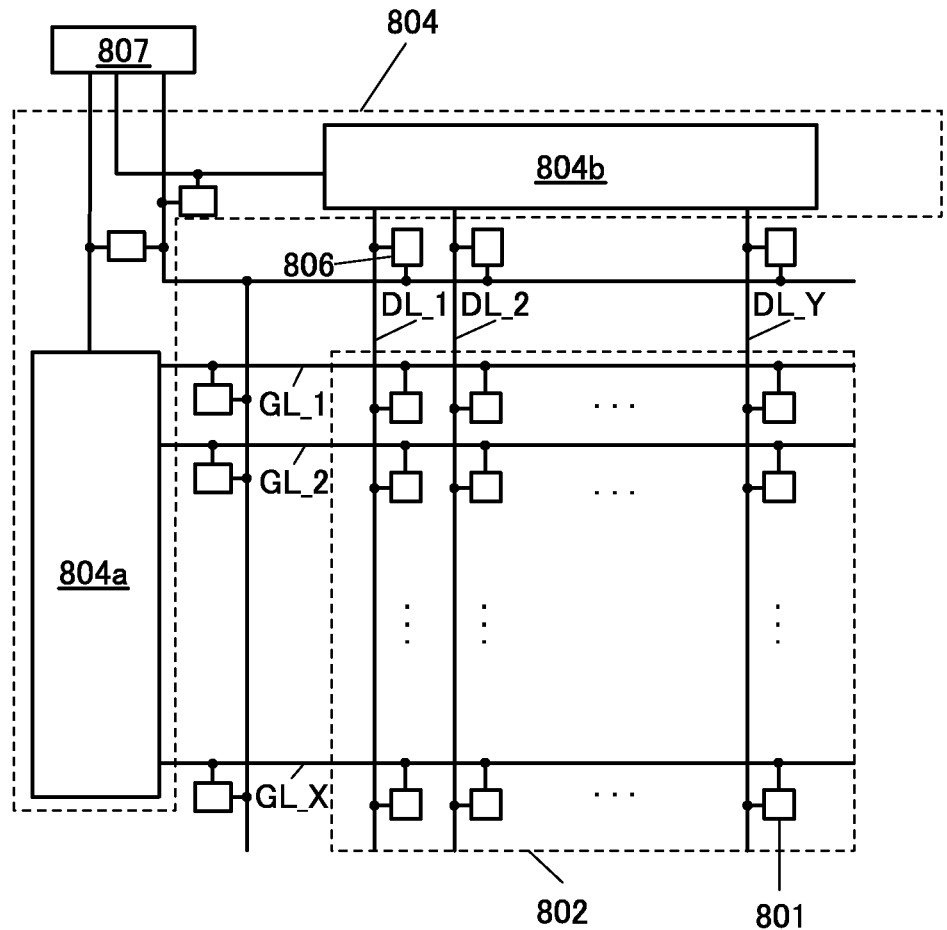
FIGS. 5A and 5B are a block diagram and a circuit diagram illustrating a display device of one embodiment of the present invention.
Figure 5B:
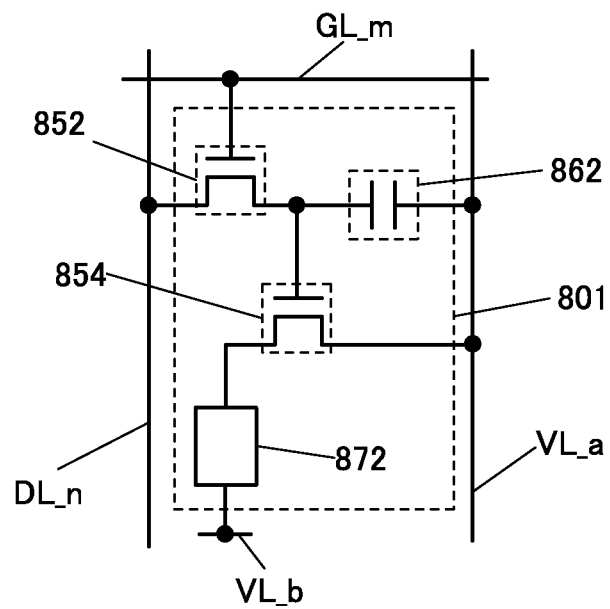

FIG. 5A is a block diagram illustrating the display device of one embodiment of the present invention, and FIG. 5B is a circuit diagram illustrating a pixel circuit of the display device of one embodiment of the present invention.

<Display Device>

The display device illustrated in FIG. 5A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by chip-on-glass (COG) or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804b includes a shift register or the like. The signal line driver circuit 804b receives a signal (video signal) from which a data signal is derived, as well as a signal for driving the shift register, through the terminal portion 807. The signal line driver circuit 804b has a function of generating a data signal to be written to the pixel circuit 801 which is based on the video signal. In addition, the signal line driver circuit 804b has a function of controlling output of a data signal in response to a pulse signal produced by input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply another signal.

The signal line driver circuit 804b includes a plurality of analog switches or the like, for example. The signal line driver circuit 804b can output, as the data signals, signals obtained by time-dividing the video signal by sequentially turning on the plurality of analog switches. The signal line driver circuit 804b may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804a. For example, to the pixel circuit 801 in the m-th row and the n-th column (m is a natural number of less than or equal to X, and n is a natural number of less than or equal to Y), a pulse signal is input from the scan line driver circuit 804*a* through the scan line GL_m, and a data signal is input from the signal line driver circuit 804*b* through the data line DL_n in accordance with the potential of the scan line GL_m.

The protection circuit 806 shown in FIG. 5A is connected to, for example, the scan line GL between the scan line driver circuit 804*a* and the pixel circuit 801. Alternatively, the protection circuit 806 is connected to the data line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be connected to a wiring between the signal line driver circuit 804*b* and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 5A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804*a* or a configuration in which the protection circuits 806 are connected to the signal line driver circuit 804*b* may be employed. Alternatively, the protection circuits 806 may be configured to be connected to the terminal portion 807.

In FIG. 5A, an example in which the driver circuit portion 804 includes the scan line driver circuit 804*a* and the signal line driver circuit 804*b* is shown; however, the structure is not limited thereto. For example, only the scan line driver circuit 804*a* may be formed and a separately prepared substrate where a signal line driver circuit is formed (e.g., a driver circuit substrate formed with a single crystal semiconductor film or a polycrystalline semiconductor film) may be mounted.

<Structural Example of Pixel Circuit>

Each of the plurality of pixel circuits 801 in FIG. 5A can have a structure illustrated in FIG. 5B, for example.

The pixel circuit 801 illustrated in FIG. 5B includes transistors 852 and 854, a capacitor 862, and a light-emitting element 872.

One of a source electrode and a drain electrode of the transistor 852 is electrically connected to a wiring to which a data signal is supplied (hereinafter referred to as a data line DL_n). A gate electrode of the transistor 852 is electrically connected to a wiring to which a gate signal is supplied (hereinafter referred to as a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 5B, the pixel circuits 801 are sequentially selected row by row by the scan line driver circuit 804*a* in FIG. 5A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments or examples as appropriate.

Embodiment 5

In this embodiment, a display device including a light-emitting element of one embodiment of the present invention and an electronic device in which the display device is provided with an input device will be described with reference to FIGS. 6A and 6B, FIGS. 7A to 7C, FIGS. 8A and 8B, FIGS. 9A and 9B, and FIG. 10.

<Description 1 of Touch Panel>

In this embodiment, a touch panel 2000 including a display device and an input device will be described as an example of an electronic device. In addition, an example in which a touch sensor is used as an input device will be described.

Figure 6A:
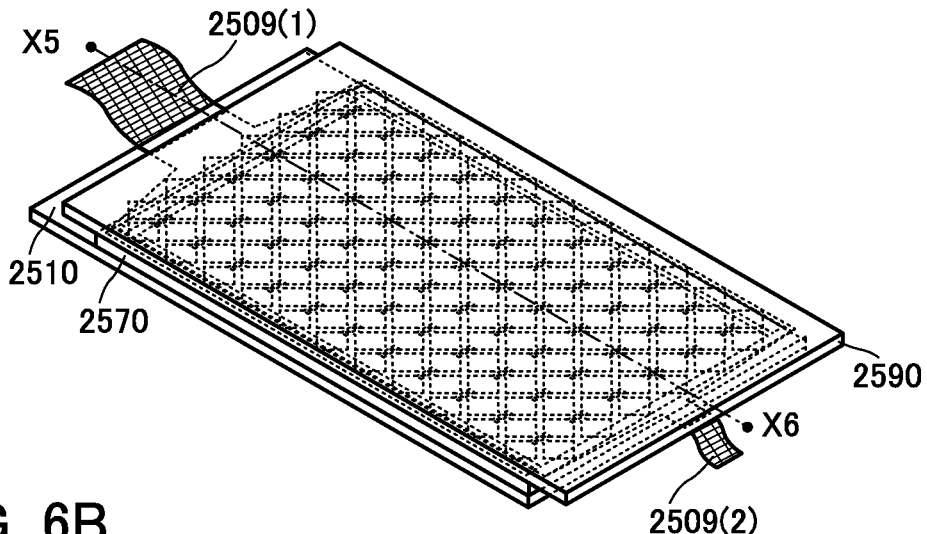
FIGS. 6A and 6B are perspective views of an example of a touch panel of one embodiment of the present invention.
Figure 6B:
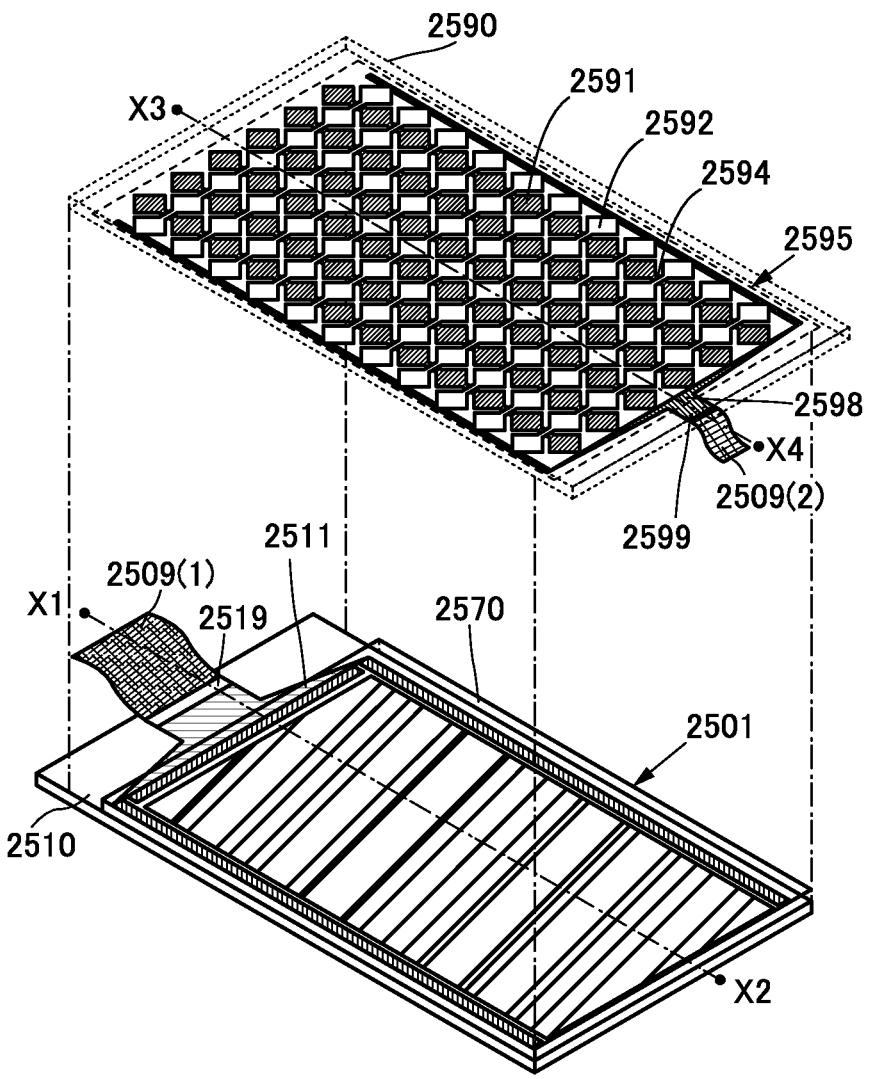

FIGS. 6A and 6B are perspective views of the touch panel 2000. Note that FIGS. 6A and 6B illustrate only main components of the touch panel 2000 for simplicity.

The touch panel 2000 includes a display device 2501 and a touch sensor 2595 (see FIG. 6B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 6B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 6B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 6A and 6B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Display Device>

Figure 7A:
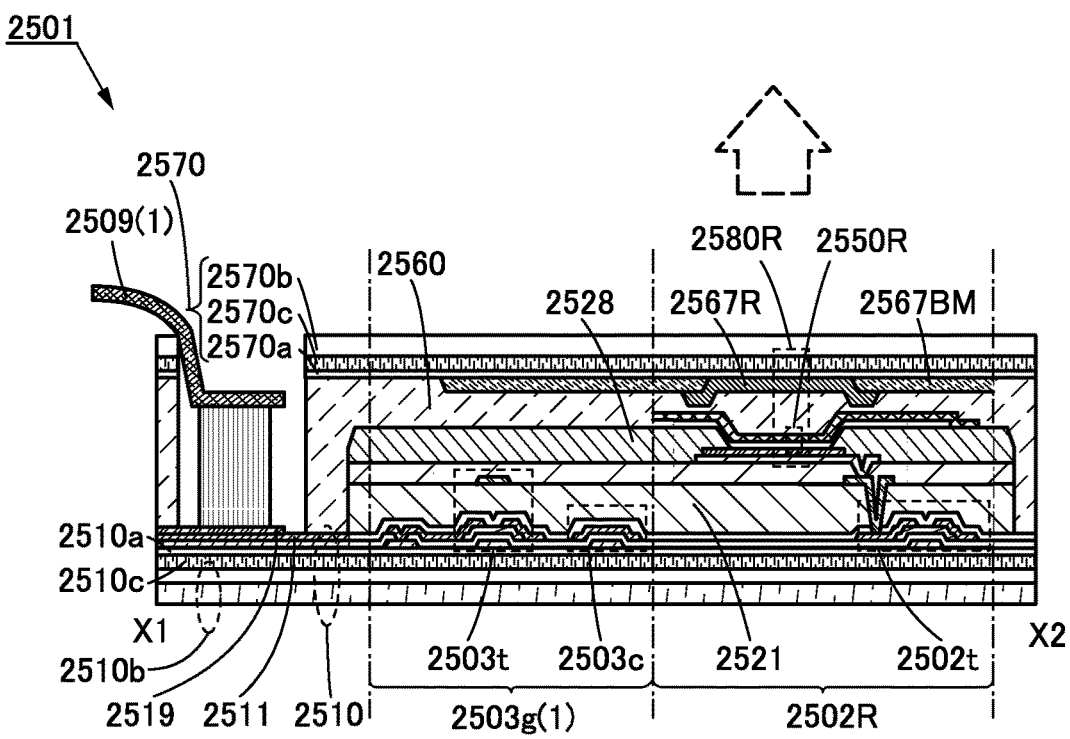
FIGS. 7A to 7C are cross-sectional views of examples of a display device and a touch sensor of one embodiment of the present invention.

Next, the display device 2501 will be described in detail with reference to FIG. 7A. FIG. 7A corresponds to a cross-sectional view taken along dashed-dotted line X1-X2 in FIG. 6B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, or a resin having an acrylic resin, polyurethane, an epoxy resin, or a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 7A, the sealing layer 2560 can also serve as an adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. An ultraviolet curable resin or a heat curable resin may be used; for example, a polyvinyl chloride (PVC) based resin, an acrylic resin, a polyimide-based resin, an epoxy-based resin, a silicone-based resin, a polyvinyl butyral (PVB) based resin, or an ethylene vinyl acetate (EVA) based resin can be used. For example, an epoxy-based resin or a glass frit is preferably used as the sealant. As a material used for the sealant, a material which is impermeable to moisture or oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1 to 3 can be used, for example.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in FIG. 7A.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of planarizing unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503g(1) includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 7B:
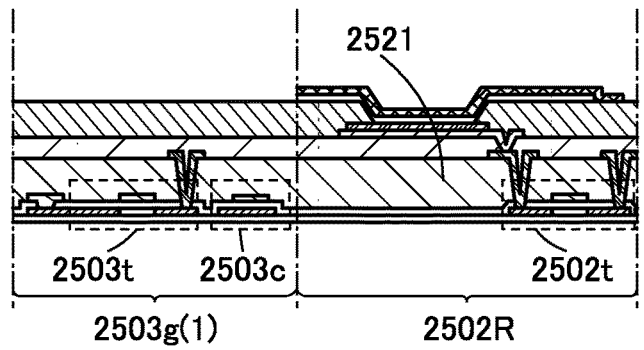

In the display device 2501, transistors with any of a variety of structures can be used. FIG. 7A illustrates an example of using bottom-gate transistors; however, the present invention is not limited to this example, and top-gate transistors may be used in the display device 2501 as illustrated in FIG. 7B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide, an In-M-Zn oxide (M represents aluminum (Al), gallium (Ga), yttrium (Y), zirconium (Zr), lanthanum (La), cerium (Ce), tin (Sn), hafnium (Hf), or neodymium (Nd)), and the like.

<Touch Sensor>

Figure 7C:
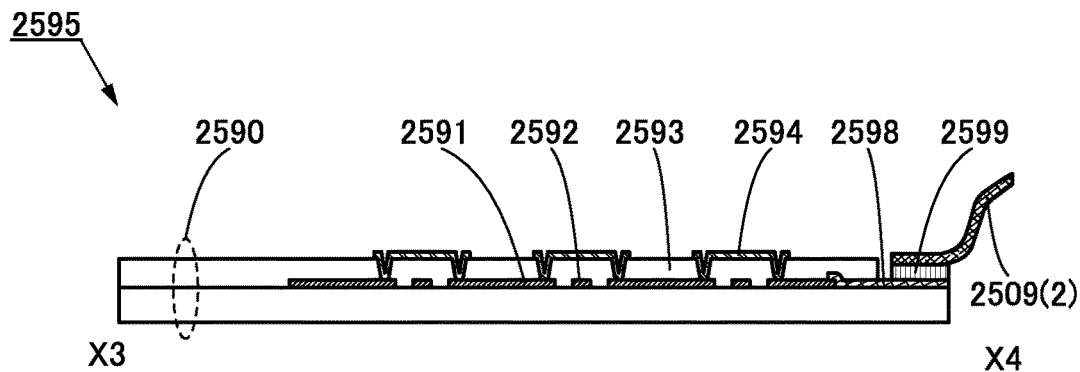

Next, the touch sensor 2595 will be described in detail with reference to FIG. 7C. FIG. 7C corresponds to a cross-sectional view taken along dashed-dotted line X3-X4 in FIG. 6B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 8A:
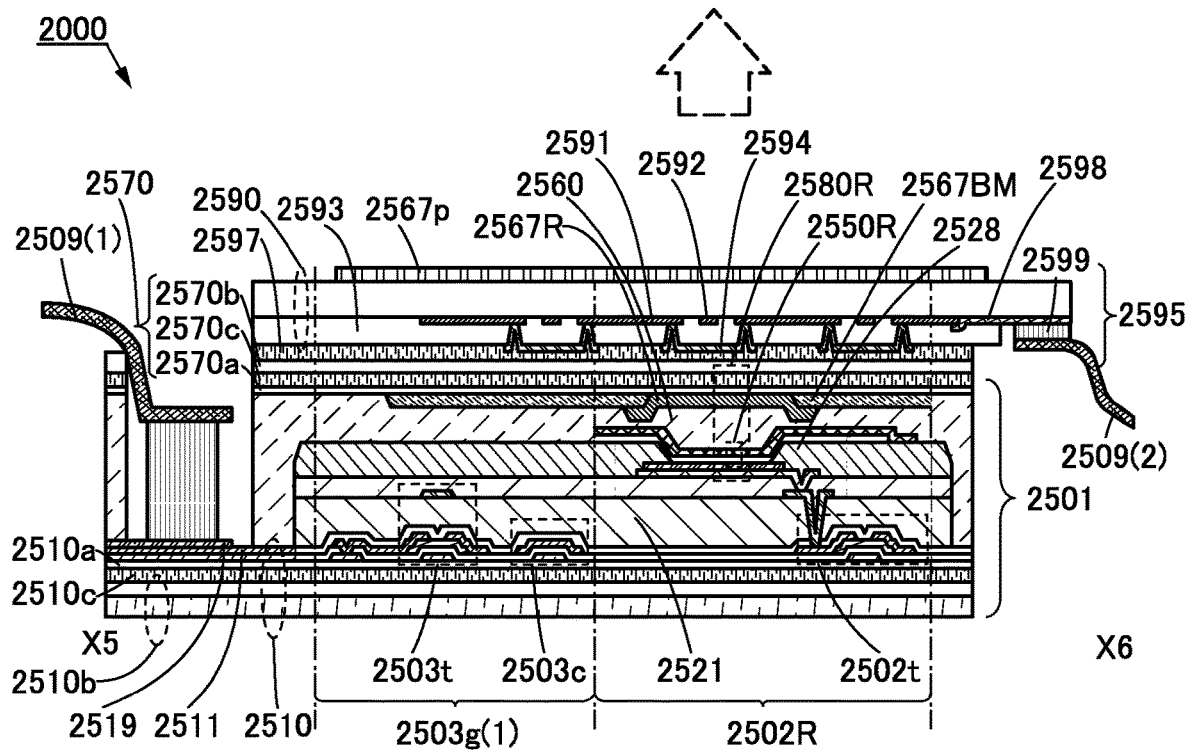
FIGS. 8A and 8B illustrate examples of a touch panel of one embodiment of the present invention.

Next, the touch panel 2000 will be described in detail with reference to FIG. 8A. FIG. 8A corresponds to a cross-sectional view taken along dashed-dotted line X5-X6 in FIG. 6A.

In the touch panel 2000 illustrated in FIG. 8A, the display device 2501 described with reference to FIG. 7A and the touch sensor 2595 described with reference to FIG. 7C are attached to each other.

The touch panel 2000 illustrated in FIG. 8A includes an adhesive layer 2597 and an anti-reflective layer 2567*p* in addition to the components described with reference to FIGS. 7A and 7C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, an urethane-based resin, an epoxy-based resin, or a siloxane-based resin can be used.

The anti-reflective layer 2567*p* is positioned in a region overlapping with pixels. As the anti-reflective layer 2567*p*, a circularly polarizing plate can be used, for example.

Next, a touch panel having a structure different from that illustrated in FIG. 8A will be described with reference to FIG. 8B.

Figure 8B:
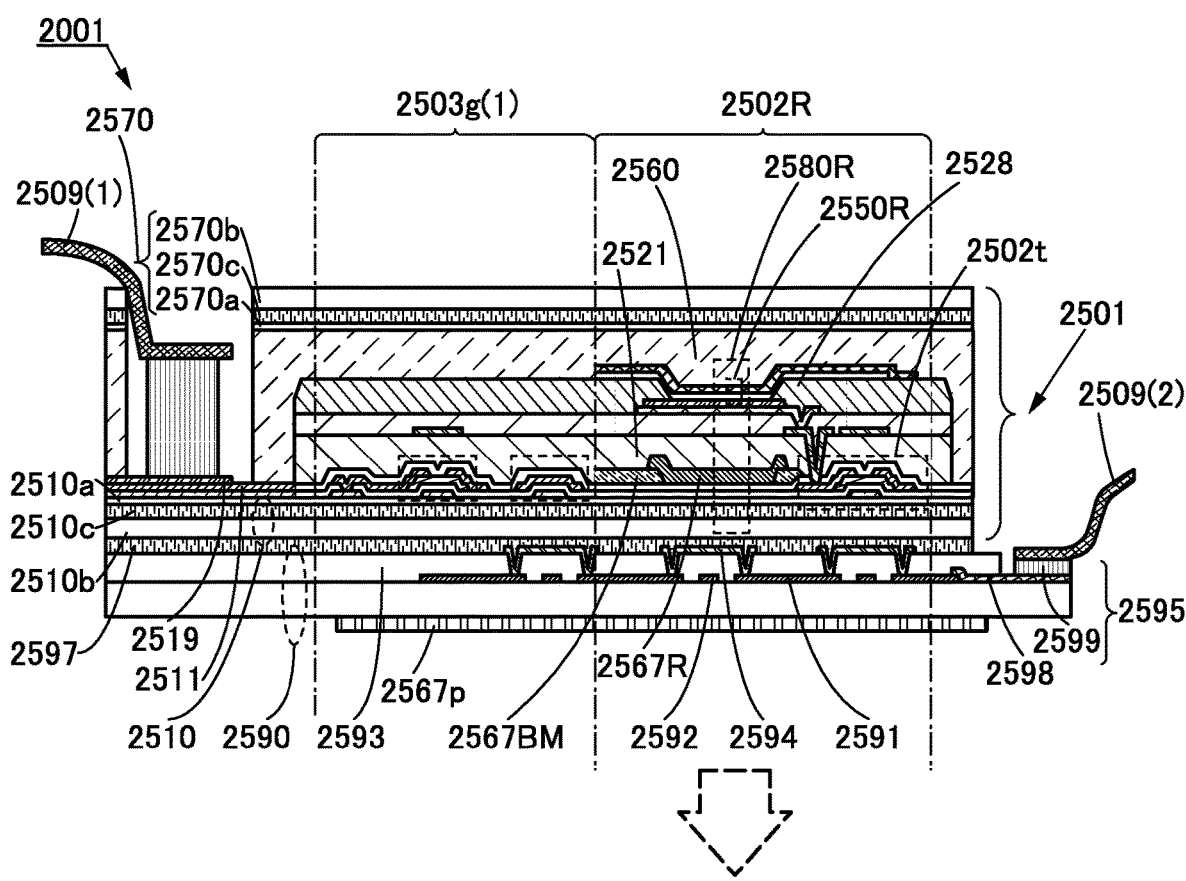

FIG. 8B is a cross-sectional view of a touch panel 2001. The touch panel 2001 illustrated in FIG. 8B differs from the touch panel 2000 illustrated in FIG. 8A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 8B emits light to the side where the transistor 2502*t* is provided. Accordingly, part of light emitted from the light-emitting element 2550R passes through the coloring layer 2567R and is emitted to the outside of the light-emitting module 2580R as indicated by an arrow in FIG. 8B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 8A or 8B, light may be emitted from the light-emitting element to one of upper and lower sides, or both, of the substrate.

<Method for Driving Touch Panel>

Next, an example of a method for driving a touch panel will be described with reference to FIGS. 9A and 9B.

Figure 9A:
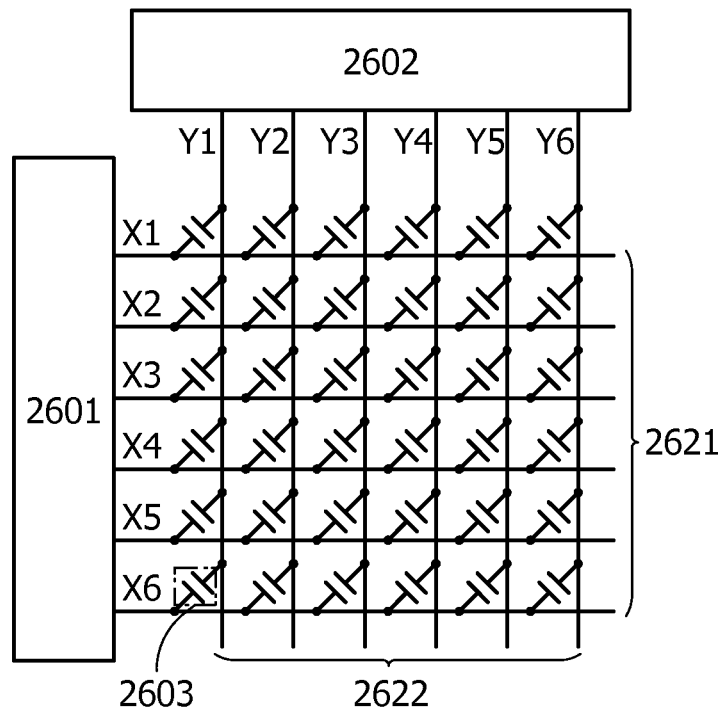
FIGS. 9A and 9B are a block diagram and a timing chart of a touch sensor of one embodiment of the present invention.

FIG. 9A is a block diagram illustrating the structure of a mutual capacitive touch sensor. FIG. 9A illustrates a pulse voltage output circuit 2601 and a current sensing circuit 2602. Note that in FIG. 9A, six wirings X1 to X6 represent the electrodes 2621 to which a pulse voltage is applied, and six wirings Y1 to Y6 represent the electrodes 2622 that detect changes in current. FIG. 9A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 9B:
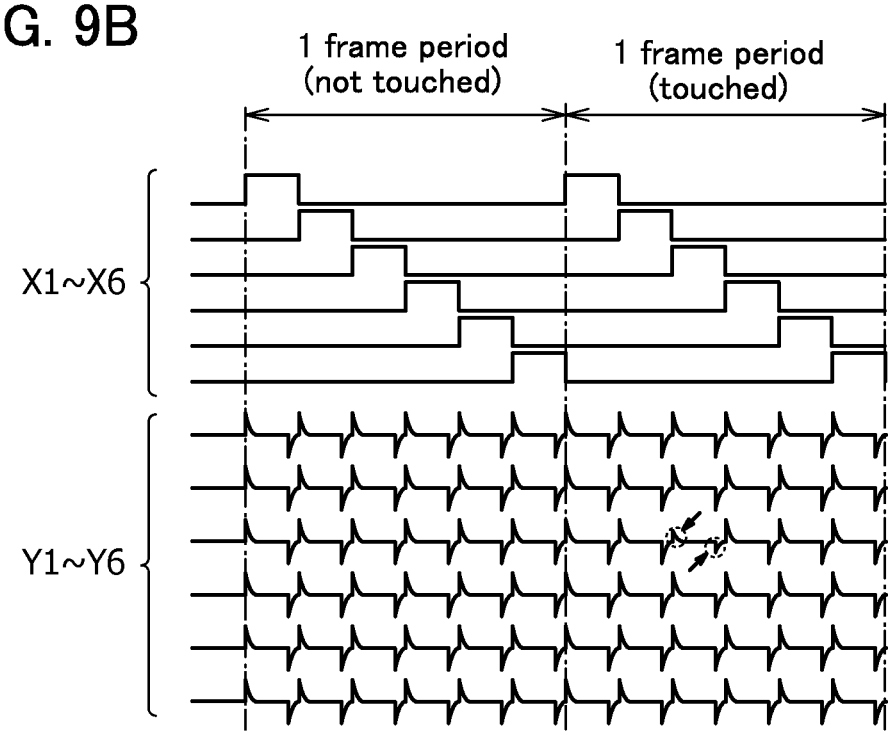

FIG. 9B is a timing chart showing input and output waveforms in the mutual capacitive touch sensor illustrated in FIG. 9A. In FIG. 9B, sensing of a sensing target is performed in all the rows and columns in one frame period. FIG. 9B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Sensor Circuit>

Figure 10:
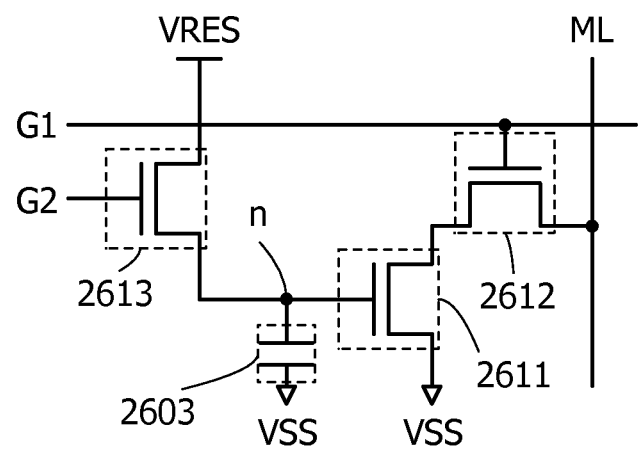
FIG. 10 is a circuit diagram illustrating a touch sensor of one embodiment of the present invention.

Although FIG. 9A illustrates a passive matrix type touch sensor in which only the capacitor 2603 is provided at the intersection of wirings as a touch sensor, an active matrix type touch sensor including a transistor and a capacitor may be used. FIG. 10 illustrates an example of a sensor circuit included in an active matrix type touch sensor.

The sensor circuit in FIG. 10 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 10 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments or examples as appropriate.

Embodiment 6

In this embodiment, a display module and electronic devices including a light-emitting element of one embodiment of the present invention will be described with reference to FIG. 11 and FIGS. 12A to 12G.

<Display Module>

Figure 11:
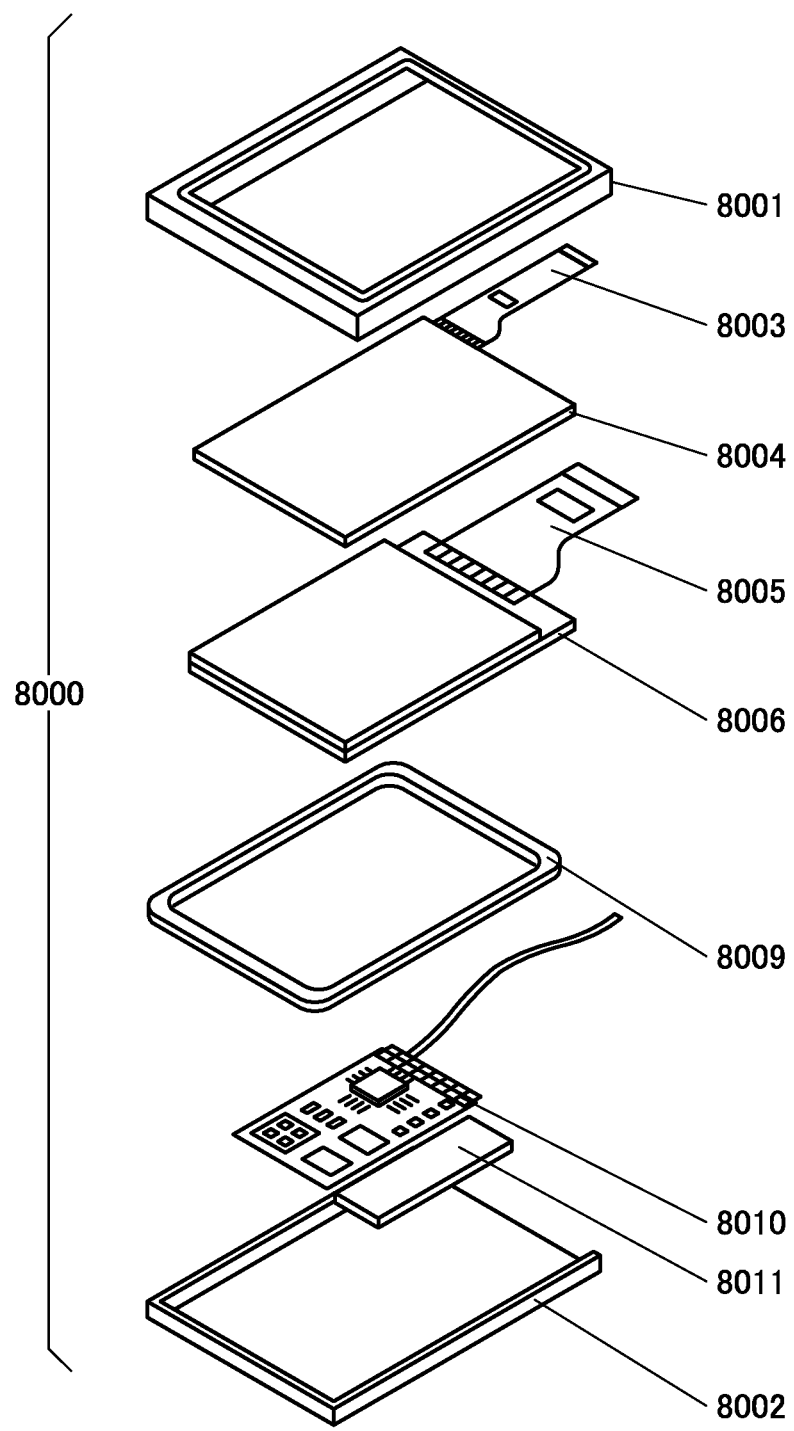
FIG. 11 is a perspective view illustrating a display module of one embodiment of the present invention.

In a display module 8000 in FIG. 11, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Electronic Device>

FIGS. 12A to 12G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 12A to 12G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 12A to 12G are not limited to those described above, and the electronic devices can have a variety of functions. Although not illustrated in FIGS. 12A to 12G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 12A to 12G will be described in detail below.

Figure 12A:
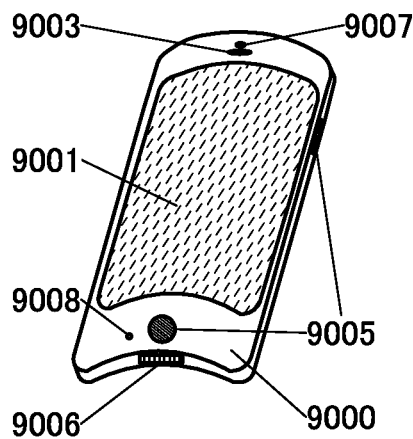
FIGS. 12A to 12G illustrate electronic devices of one embodiment of the present invention.

FIG. 12A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 12D:
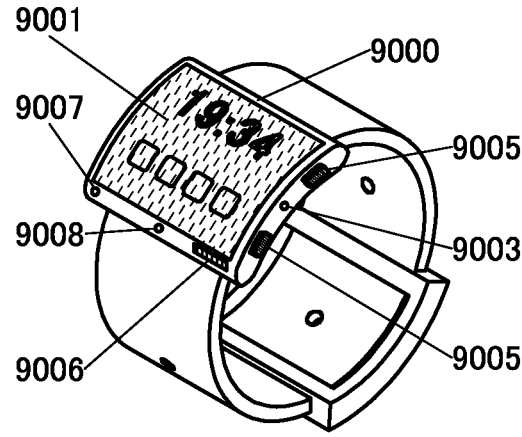
Figure 12B:
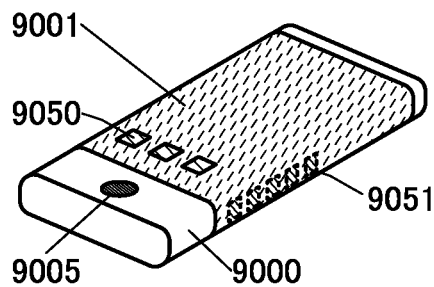

FIG. 12B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 12B, can be positioned in the portable information terminal 9101 as in the portable information terminal 9100 shown in FIG. 12A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 12E:
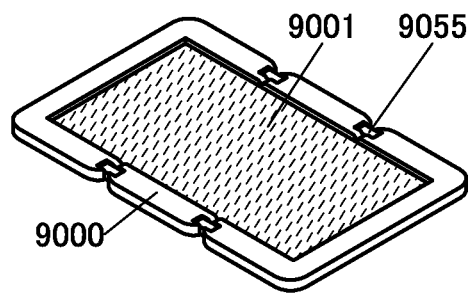
Figure 12C:
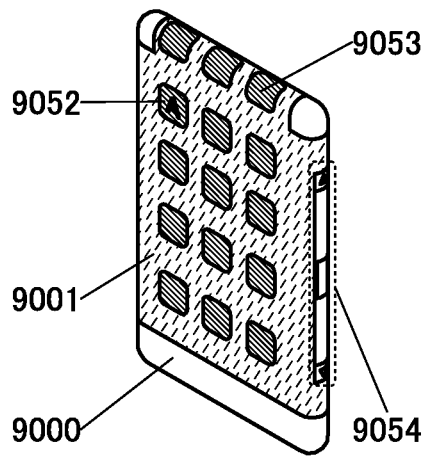

FIG. 12C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 12D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 12F:
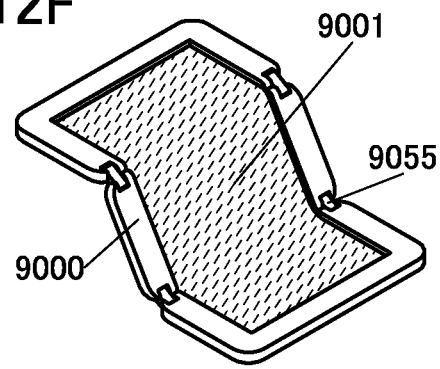
Figure 12G:
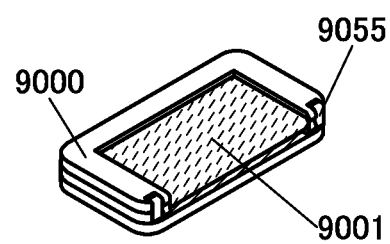

FIGS. 12E, 12F, and 12G are perspective views of a foldable portable information terminal 9201. FIG. 12E is a perspective view illustrating the portable information terminal 9201 that is opened. FIG. 12F is a perspective view illustrating the portable information terminal 9201 that is being opened or being folded. FIG. 12G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be combined with any of the structures described in the other embodiments or examples as appropriate.

Embodiment 7

In this embodiment, examples of lighting devices in which the light-emitting element of one embodiment of the present invention is used will be described with reference to FIG. 13.

Figure 13:
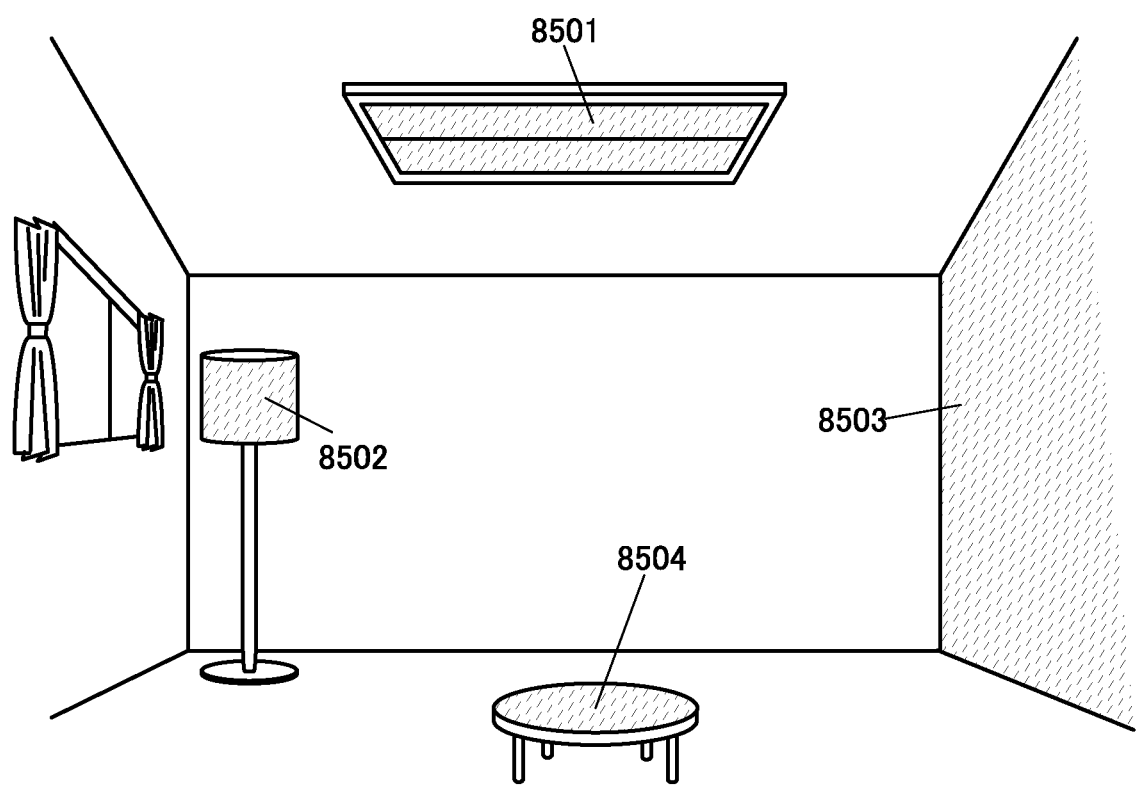
FIG. 13 illustrates a lighting device of one embodiment of the present invention.

FIG. 13 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

In this manner, a variety of lighting devices to which the light-emitting element is applied can be obtained. Note that such lighting devices are also embodiments of the present invention.

The structure described in this embodiment can be combined with any of the structures described in the other embodiments as appropriate.

Example 1

Figure 14:
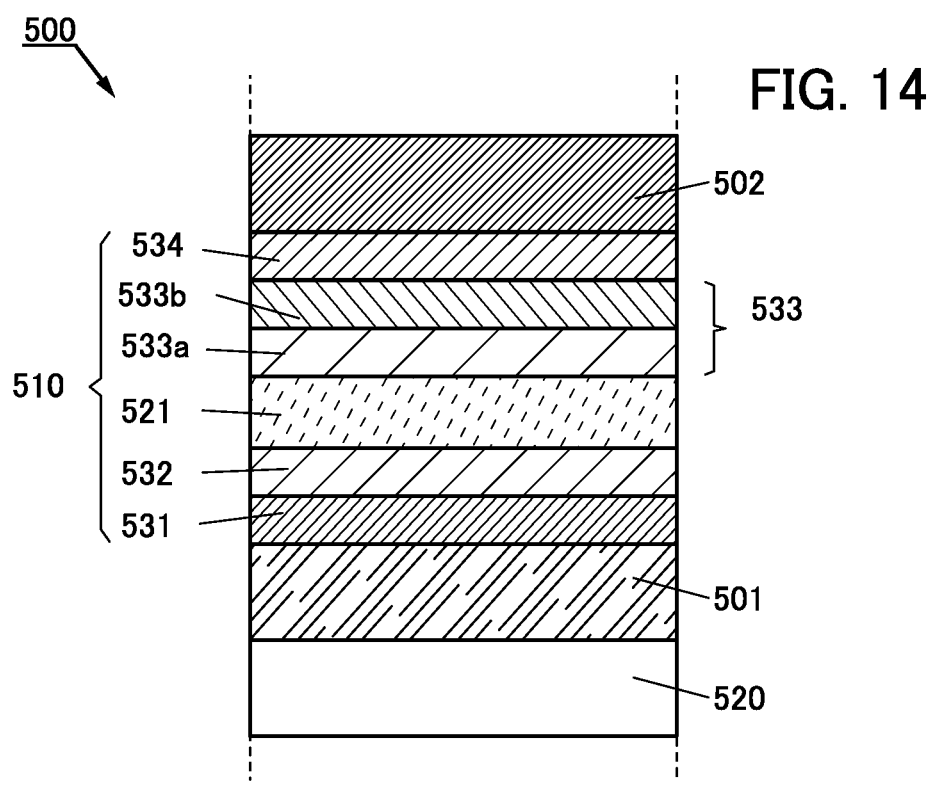
FIG. 14 is a schematic cross-sectional view illustrating light-emitting elements of Examples 1 and 2.

This example shows a fabrication example of light-emitting elements (light-emitting elements 1 and 2) in which a mixture of a thermally activated delayed fluorescence substance (a first organic compound), a host material (a second organic compound), and a guest material emitting fluorescence are used for a light-emitting layer. FIG. 14 is a schematic cross-sectional view of the light-emitting element fabricated in this example. Table 4 shows a detailed structure of the element. In addition, structures and abbreviations of compounds used here are shown below. Note that Embodiment 1 can be referred to for other compounds.

[Chemical Formula 4]

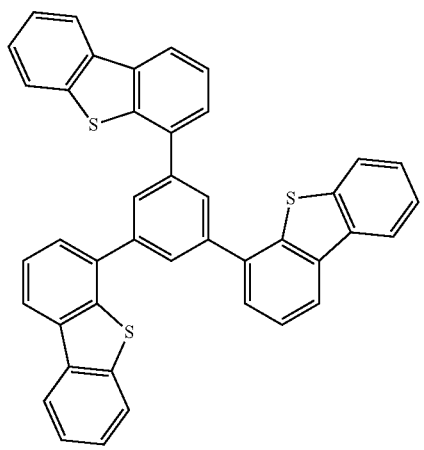

DBT3P-II

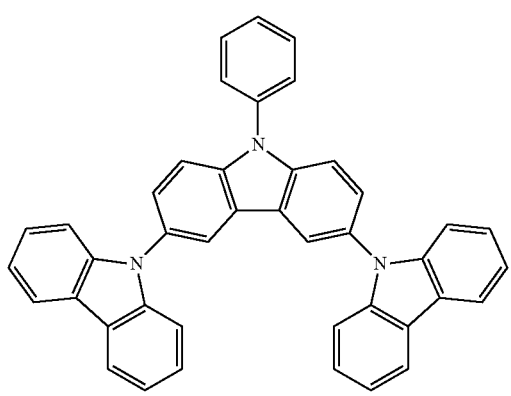

PhCzGI

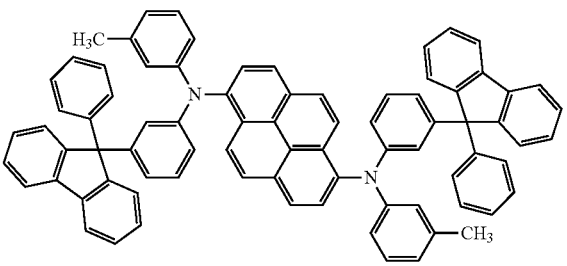

1,6mMemFLPAPrn

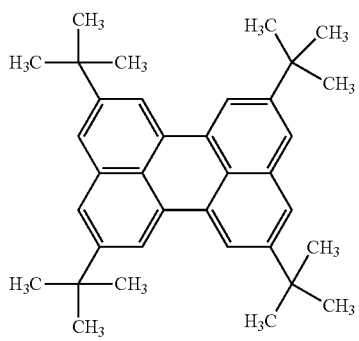

TBP

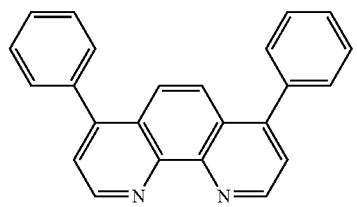

Bphen

TABLE 4

| | Layer | Reference numeral | Thickness (nm) | Material | Weight ratio |
|---|---|---|---|---|---|
| Light-emitting element 1 | Electrode | 502 | 200 | Al | — |
| | Electron-injection layer | 534 | 1 | LiF | — |
| | Electron-transport layer | 533b | 15 | Bphen | — |
| | | 533a | 15 | 4,6mCzP2Pm | — |
| | Light-emitting layer | 521 | 30 | PCCzPTzn:4,6mCzP2Pm:1,6mMemFLPAPrn | 0.3:0.7:0.0025 |
| | Hole-transport layer | 532 | 20 | PhCzGI | — |
| | Hole-injection layer | 531 | 70 | DBT3P-II:MoO$_3$ | 1:0.5 |
| | Electrode | 501 | 110 | ITSO | — |
| Light-emitting element 2 | Electrode | 502 | 200 | Al | — |
| | Electron-injection layer | 534 | 1 | LiF | — |
| | Electron-transport layer | 533b | 15 | Bphen | — |
| | | 533a | 15 | 4,6mCzP2Pm | — |
| | Light-emitting layer | 521 | 30 | PCCzPTzn:4,6mCzP2Pm:TBP | 0.3:0.7:0.0025 |
| | Hole-transport layer | 532 | 20 | PhCzGI | — |
| | Hole-injection layer | 531 | 70 | DBT3P-II:MoO$_3$ | 1:0.5 |
| | Electrode | 501 | 110 | ITSO | — |

Fabrication methods of the light-emitting elements 1 and 2 are described.

<Fabrication of Light-Emitting Element 1>

A film of indium tin oxide containing silicon oxide (ITSO) was formed to a thickness of 110 nm over a substrate 520 by a sputtering method to form an electrode 501. Note that the area of the electrode 501 was 4 mm$^2$ (2 mm×2 mm).

Then, as pretreatment for forming the light-emitting element over the substrate 520, UV ozone treatment was performed for 370 seconds after washing of a surface of the substrate with water and heat treatment that was performed at 200° C. for 1 hour.

Next, the substrate 520 was fixed to a substrate holder inside a vacuum evaporation apparatus reduced to approximately 1×10$^{-4}$ Pa with the electrode 501 side down. Then, as a hole-injection layer 531, DBT3P-II and molybdenum oxide (MoO$_3$) were deposited on the electrode 501 by co-evaporation in a weight ratio of DBT3P-II:MoO$_3$=1:0.5 to a thickness of 70 nm.

As a hole-transport layer 532, PhCzGI was deposited to a thickness of 20 nm over the hole-injection layer 531.

As a light-emitting layer 521, PCCzPTzn, 4,6mCzP2Pm, and 1,6mMemFLPAPrn were deposited over the hole-transport layer 532 by co-evaporation such that the deposited layer has a weight ratio of PCCzPTzn:4,6mCzP2Pm:1,6mMemFLPAPrn=0.3:0.7:0.0025 and a thickness of 30 nm. Note that in the light-emitting layer 521, PCCzPTzn is a thermally activated delayed fluorescence substance (a first organic compound), 4,6mCzP2Pm is a host material (a second organic compound), and 1,6mMemFLPAPrn is a guest material.

Next, 4,6mCzP2Pm and bathophenanthroline (abbreviation: Bphen) were sequentially deposited to thicknesses of 15 nm each, as electron-transport layers 533a and 533b over the light-emitting layer 521.

Then, as the electron-injection layer 534, lithium fluoride (abbreviation: LiF) was deposited to a thickness of 1 nm over the electron-transport layer 533b.

As an electrode 502, aluminum (Al) was deposited on the electron-injection layer 534 to a thickness of 200 nm.

Through the above steps, the components over the substrate 520 were formed. Note that a resistance heating method was used for the above deposition process.

Next, a light-emitting element was sealed by fixing a sealing substrate to the substrate 520 using a sealant for an organic EL device in a glove box under a nitrogen atmosphere. Specifically, the sealant was applied to surround the light-emitting element, the substrate 520 and the sealing substrate were bonded to each other, irradiation with ultraviolet light a wavelength of 365 nm at 6 J/cm$^2$ was performed, and heat treatment was performed at 80° C. for 1 hour. Through the above steps, the light-emitting element 1 was obtained.

<Fabrication of Light-Emitting Element 2>

The light-emitting element 2 was fabricated through the same steps as those for the light-emitting element 1 except that TBP was used as a guest material for the light-emitting element 2.

In other words, as the light-emitting layer 521 of the light-emitting element 2, PCCzPTzn, 4,6mCzP2Pm, and TBP were deposited by co-evaporation such that the deposited layer has a weight ratio of PCCzPTzn:4,6mCzP2Pm:TBP=0.3:0.7:0.0025 and a thickness of 30 nm. Note that in the light-emitting layer 521, PCCzPTzn is a thermally activated delayed fluorescence substance (a first organic compound), 4,6mCzP2Pm is a host material (a second organic compound), and TBP is a guest material.

<Measurement of Transient Fluorescent Characteristics>

Transient fluorescent characteristics of PCCzPTzn which was the host material of the light-emitting elements in this example (the light-emitting elements 1 and 2) were measured using time-resolved emission measurement.

The time-resolved emission measurement was performed on a thin-film sample in which PCCzPTzn was deposited over a quartz substrate to a thickness of 50 nm. The thin-film sample was sealed by fixing a sealing substrate to the quartz substrate over which the thin-film sample was deposited using a sealant for an organic EL device in a glove box under a nitrogen atmosphere. Specifically, after a sealant was applied to surround the thin-film over the quartz substrate and the quartz substrate was bonded to the sealing substrate, irradiation with ultraviolet light having a wavelength of 365 nm at 6 J/cm² and heat treatment at 80° C. for one hour were performed.

A picosecond fluorescence lifetime measurement system (manufactured by Hamamatsu Photonics K.K.) was used for the measurement. In this measurement, the thin film was irradiated with pulsed laser, and emission of the thin film which was attenuated from the laser irradiation underwent time-resolved measurement using a streak camera to measure the lifetime of fluorescent emission of the thin film. A nitrogen gas laser with a wavelength of 337 nm was used as the pulsed laser. The thin film was irradiated with pulsed laser with a pulse width of 500 ps at a repetition rate of 10 Hz. By integrating data obtained by the repeated measurement, data with a high S/N ratio was obtained. The measurement was performed at room temperature (in an atmosphere kept at 23° C.).

Figure 15:
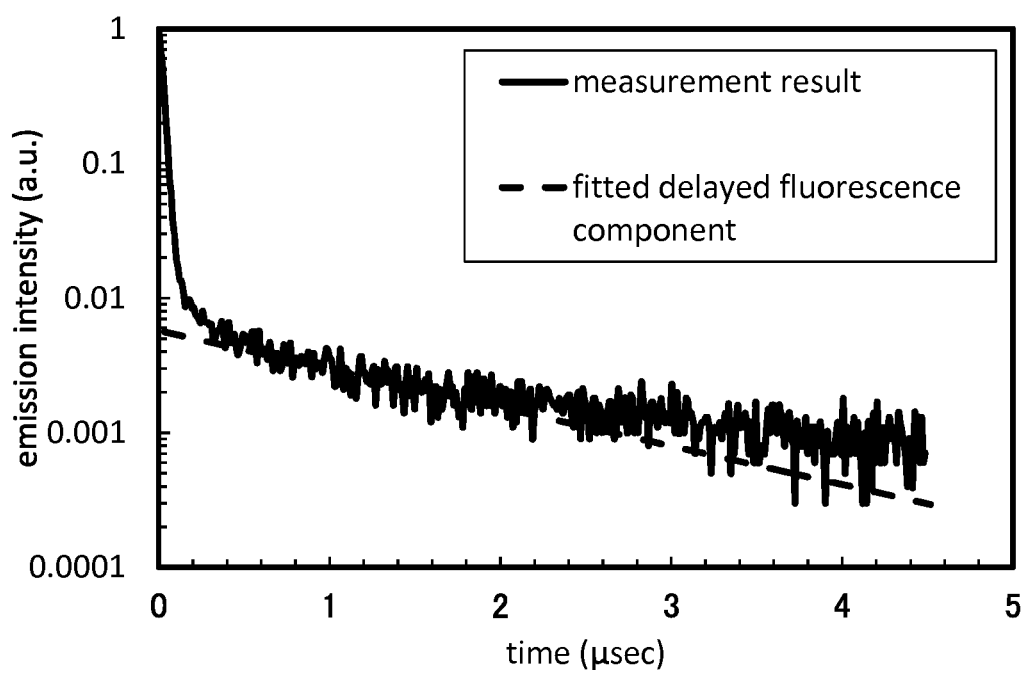
FIG. 15 shows transient fluorescence characteristics of a host material of Example 1.

FIG. 15 shows transient fluorescent characteristics of PCCzPTzn obtained by the measurement.

The attenuation curve shown in FIG. 15 was fitted with Formula 4.

$$L = \sum_{n=1} A_n \exp\left(-\frac{t}{a_n}\right)$$ [Formula 4]

In Formula 4, L and t represent normalized emission intensity and elapsed time, respectively. The attenuation curve was able to be fitted when n was 1 to 3. This fitting results show that the emission component of the PCCzPTzn thin-film sample contains a fluorescent component having an emission lifetime of 0.015 μs and a delayed fluorescence component having an emission lifetime of 1.5 μs. In other words, it is found that PCCzPTzn is a thermally activated delayed fluorescence substance exhibiting delayed fluorescent at room temperature.

<Characteristics of Light-Emitting Elements>

Figure 16:
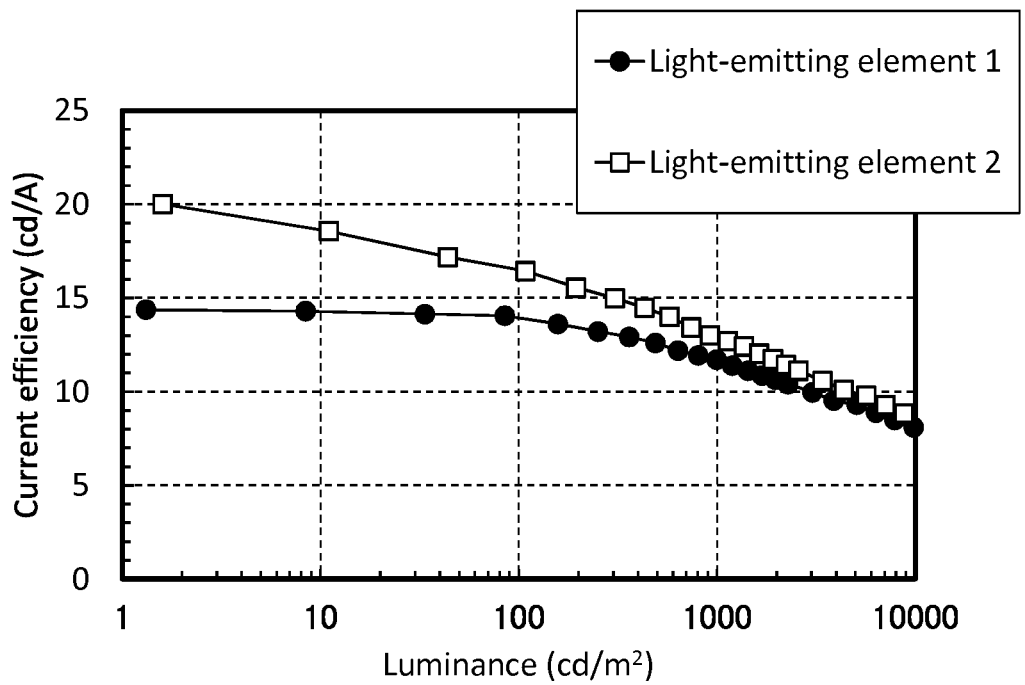
FIG. 16 shows current efficiency-luminance characteristics of light-emitting elements of Example 1.
Figure 17:
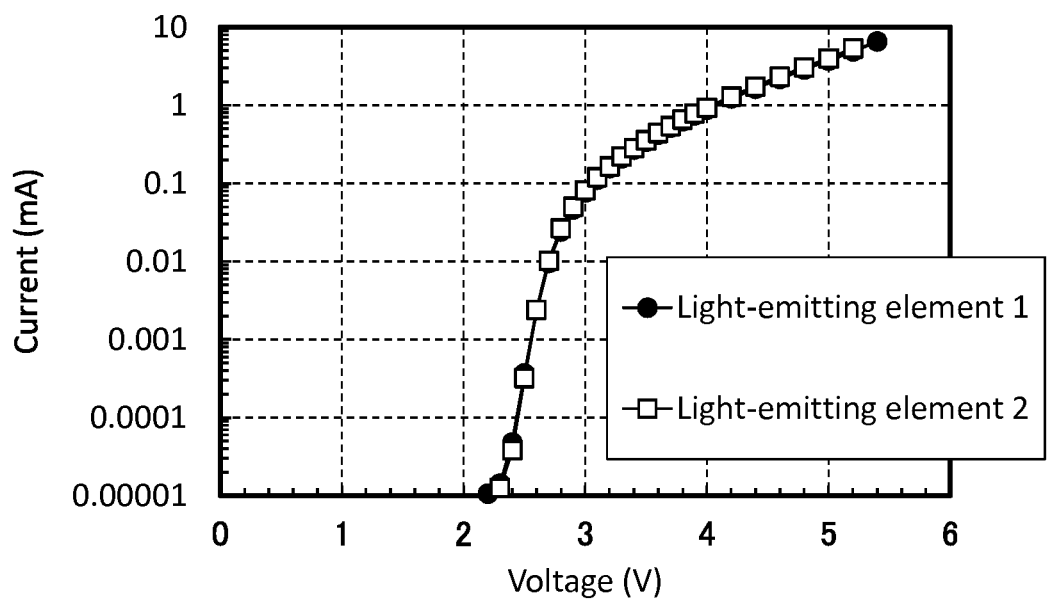
FIG. 17 shows current-voltage characteristics of light-emitting elements of Example 1.
Figure 18:
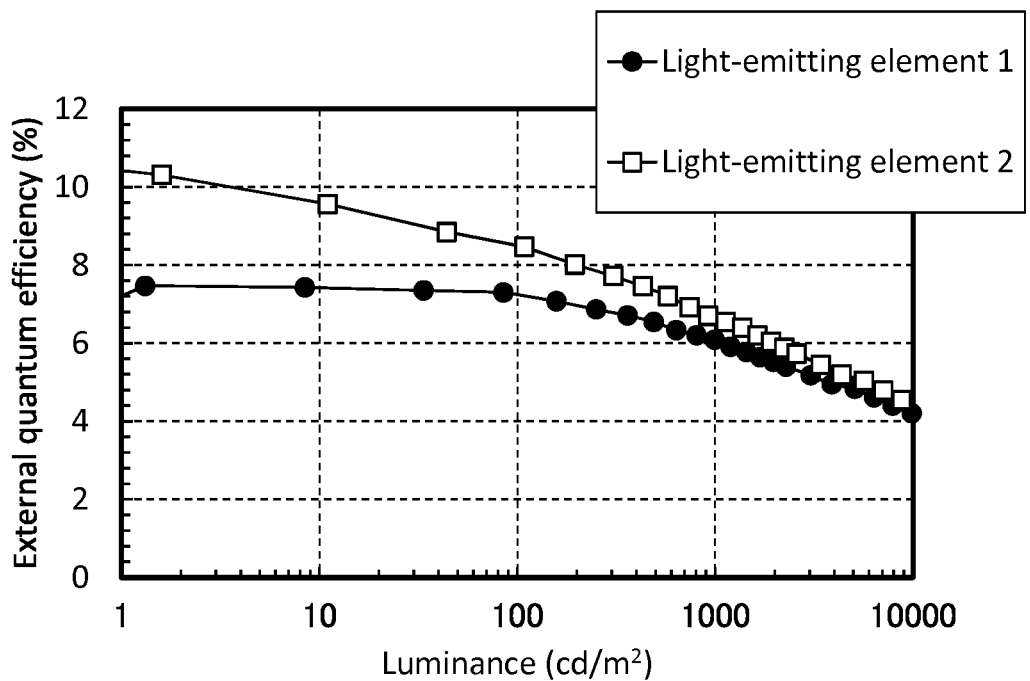
FIG. 18 shows external quantum efficiency-luminance characteristics of light-emitting elements of Example 1.

FIGS. 16, 17, and 18 show luminance-current density characteristics, luminance-voltage characteristics, and external quantum efficiency-luminance characteristics, respectively, of the light-emitting elements 1 and 2. The measurement of the light-emitting elements was performed at room temperature (in an atmosphere kept at 23° C.).

Table 5 shows element characteristics of the light-emitting elements 1 and 2 at around 1000 cd/m².

case where a fluorescent substance is used as a guest material and energy only from a singlet excited state is used for emission, the maximum external quantum efficiency of a light-emitting element is approximately 6% on the assumption that the light extraction efficiency from the light-emitting element to the outside is 25%. However, the light-emitting elements 1 and 2 using one embodiment of the present invention exhibited higher external quantum efficiency. This is because a triplet excited state generated by recombined carriers in a thermally activated delayed fluorescence substance was converted into a single excited state by reverse intersystem crossing.

In addition, in the light-emitting elements 1 and 2, the HOMO level of a thermally activated delayed fluorescence substance is higher than or equal to the HOMO level of a host material, and the LUMO level of the thermally activated delayed fluorescence substance is lower than or equal to the LUMO level of the host material, which are shown in Table 1 in Embodiment 1. In addition, the oxidation potential and the reduction potential of the thermally activated delayed fluorescence substance are lower than or equal to the oxidation potential of the host material and higher than or equal to the reduction potential of the host material, respectively, as shown in Table 2 in Embodiment 1. Thus, the HOMO level and the LUMO level of the thermally activated delayed fluorescence substance which are estimated from the oxidation potential and the reduction potential are higher than or equal to the HOMO level of the host material and lower than or equal to the LUMO level of the host material, respectively.

The triplet excited energy level of 1,6mMemFLPAPrn was 1.84 eV, which was measured by the method similar to that in Embodiment 1. Therefore, as shown in Table 3 in Embodiment 1, the triplet excited energy level of the thermally activated delayed fluorescence substance (PCCzPTzn) and that of the host material (4,6mCzP2Pm) are each higher than that of the guest material.

Therefore, in the light-emitting elements 1 and 2, both the singlet excited state and the triplet excited state which are efficiently formed by carrier recombination in the thermally activated delayed fluorescence substance can be transferred

TABLE 5

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Light-emitting element 1 | 3.5 | 8.49 | (0.18, 0.27) | 995 | 11.7 | 10.5 | 6.09 |
| Light-emitting element 2 | 3.4 | 7.10 | (0.18, 0.29) | 924 | 13.0 | 12.0 | 6.70 |

Figure 19:
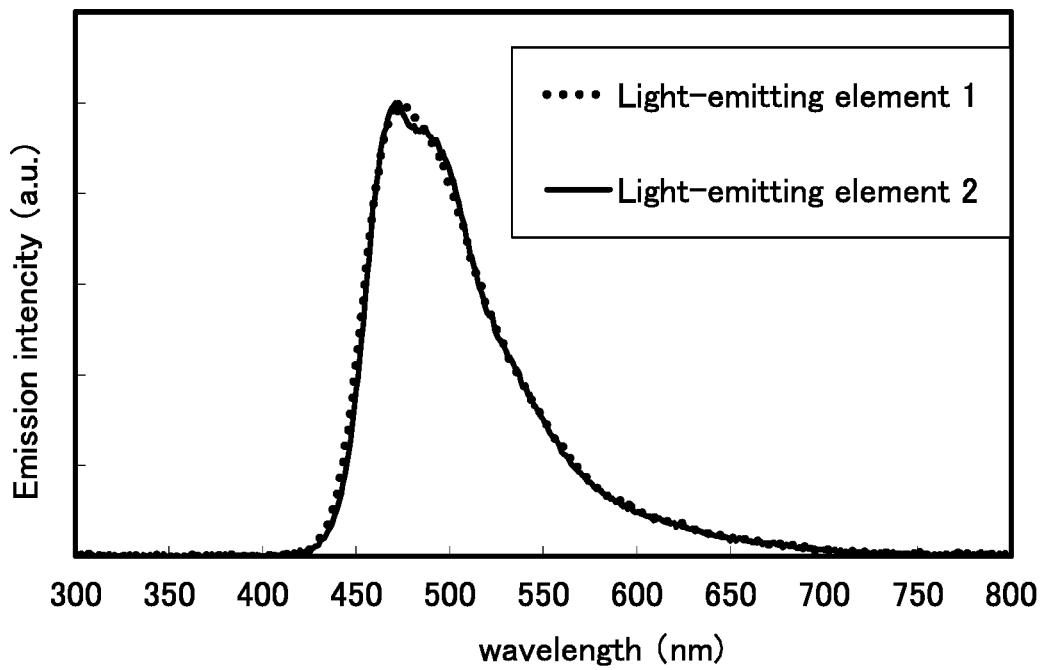
FIG. 19 shows electroluminescence spectra of light emitted from light-emitting elements of Example 1.

FIG. 19 shows the electroluminescence spectra of the light-emitting elements 1 and 2 through which current flows at a current density of 2.5 mA/cm². It is found from FIG. 19 that blue light emission originating from the guest material is obtained from the light-emitting elements 1 and 2.

In addition, the light-emitting elements 1 and 2 show element characteristics of low driving voltage and high emission efficiency as shown in FIGS. 16, 17, and 18. In particular, the light-emitting element 2 shows high external quantum efficiency exceeding 10% at a maximum. In the efficiently to the guest material. As a result, the light-emitting elements 1 and 2 show high emission efficiency.

The high emission efficiency of the light-emitting elements 1 and 2 means that the weight ratio of the host material to the thermally activated delayed fluorescence substance is preferably from 1:0.05 to 1:0.5 (host material: thermally activated delayed fluorescence substance) and the weight ratio of the host material to the guest material is preferably from 1:0.001 to 1:0.01 (host material: guest material).

As described above, the use of a structure of one embodiment of the present invention can provide a light-emitting element with high emission efficiency.

Example 2

In this example, light-emitting elements including and not including a thermally activated delayed fluorescence substance, and light-emitting elements with different weight ratios of a host material and a guest material (light-emitting elements 3 to 5 and comparative light-emitting element 1 to 4) were fabricated. A schematic cross-sectional view of the light-emitting elements fabricated in this example is similar to FIG. 14 in Example 1. Details of the light-emitting elements fabricated in this example are shown in Table 6 and Table 7. In addition, structures and abbreviations of compounds used here are given below. Embodiment 1 or Example 1 may be referred to for other compounds.

[Chemical Formula 5]

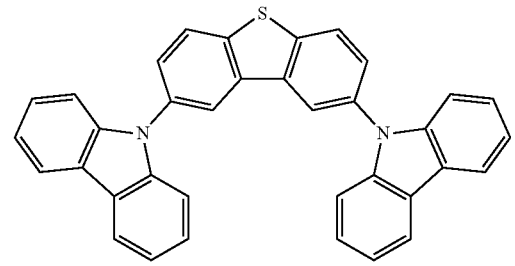

Cz2DBT

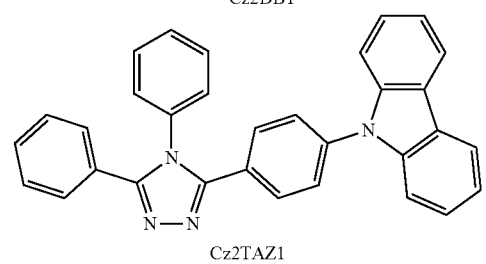

Cz2TAZ1

TABLE 6

|  | Layer | Reference numeral | Thickness (nm) | Material | Weight ratio |
|---|---|---|---|---|---|
| Light-emitting element 3 | Electrode | 502 | 200 | Al | — |
|  | Electron-injection layer | 534 | 1 | LiF | — |
|  | Electron-transport layer | 533 | 30 | Bphen | — |
|  | Light-emitting layer | 521 | 30 | PCCzPTzn:Cz2DBT:1,6mMemFLPAPrn | 0.1:0.9:0.005 |
|  | Hole-transport layer | 532 | 20 | Cz2DBT | — |
|  | Hole-injection layer | 531 | 70 | DBT3P-II:MoO₃ | 1:0.5 |
|  | Electrode | 501 | 110 | ITSO | — |
| Comparative light-emitting element 1 | Electrode | 502 | 200 | Al | — |
|  | Electron-injection layer | 534 | 1 | LiF | — |
|  | Electron-transport layer | 533 | 30 | Bphen | — |
|  | Light-emitting layer | 521 | 30 | Cz2DBT:1,6mMemFLPAPrn | 1:0.05 |
|  | Hole-transport layer | 532 | 20 | Cz2DBT | — |
|  | Hole-injection layer | 531 | 70 | DBT3P-II:MoO₃ | 1.0.5 |
|  | Electrode | 501 | 110 | ITSO | — |
| Comparative light-emitting element 2 | Electrode | 502 | 200 | Al | — |
|  | Electron-injection layer | 534 | 1 | LiF | — |
|  | Electron-transport layer | 533 | 30 | Bphen | — |
|  | Light-emitting layer | 521 | 30 | PCCzPTzn:Cz2DBT:1,6mMemFLPAPrn | 0.1:0.9:0.05 |
|  | Hole-transport layer | 532 | 20 | Cz2DBT | — |
|  | Hole-injection layer | 531 | 70 | DBT3P-II:MoO₃ | 1:0.5 |
|  | Electrode | 501 | 110 | ITSO | — |

TABLE 7

| | Layer | Reference numeral | Thickness (nm) | Material | Weight ratio |
|---|---|---|---|---|---|
| Light-emitting element 4 | Electrode | 502 | 200 | Al | — |
| | Electron-injection layer | 534 | 1 | LiF | — |
| | Electron-transport layer | 533 | 30 | Bphen | — |
| | Light-emitting layer | 521 | 30 | PCCzPTzn:Cz2DBT:TBP | 0.1:0.9:0.005 |
| | Hole-transport layer | 532 | 20 | Cz2DBT | — |
| | Hole-injection layer | 531 | 70 | DBT3P-II:MoO$_3$ | 1:0.5 |
| | Electrode | 501 | 110 | ITSO | — |
| Light-emitting element 5 | Electrode | 502 | 200 | Al | — |
| | Electron-injection layer | 534 | 1 | LiF | — |
| | Electron-transport layer | 533 | 30 | Bphen | — |
| | Light-emitting layer | 521 | 30 | PCCzPTzn:CzTAZ1:TBP | 0.1:0.9:0.005 |
| | Hole-transport layer | 532 | 20 | Cz2DBT | — |
| | Hole-injection layer | 531 | 70 | DBT3P-II:MoO$_3$ | 1:0.5 |
| | Electrode | 501 | 110 | ITSO | — |
| Comparative light-emitting element 3 | Electrode | 502 | 200 | Al | — |
| | Electron-injection layer | 534 | 1 | LiF | — |
| | Electron-transport layer | 533 | 30 | Bphen | — |
| | Light-emitting layer | 521 | 30 | PCCzPTzn:Cz2DBT:TBP | 0.1:0.9:0.05 |
| | Hole-transport layer | 532 | 20 | Cz2DBT | — |
| | Hole-injection layer | 531 | 70 | DBT3P-II:MoO$_3$ | 1:0.5 |
| | Electrode | 501 | 110 | ITSO | — |
| Comparative light-emitting element 4 | Electrode | 502 | 200 | Al | — |
| | Electron-injection layer | 534 | 1 | LiF | — |
| | Electron-transport layer | 533 | 30 | Bphen | — |
| | Light-emitting layer | 521 | 30 | PCCzPTzn:CzTAZ1:TBP | 0.1:0.9:0.05 |
| | Hole-transport layer | 532 | 20 | Cz2DBT | — |
| | Hole-injection layer | 531 | 70 | DBT3P-II:MoO$_3$ | 1:0.5 |
| | Electrode | 501 | 110 | ITSO | — |

A method for fabricating the light-emitting elements 3 to 5 and the comparative light-emitting elements 1 to 4 will be described.

<Fabrication of Light-Emitting Element 3>

An ITSO film was formed to a thickness of 110 nm over the substrate 520 by a sputtering method to form the electrode 501. Note that the area of the electrode 501 was 4 mm$^2$ (2 mm×2 mm).

Then, as pretreatment for forming the light-emitting element over the substrate 520, UV ozone treatment was performed for 370 seconds after washing of a surface of the substrate with water and heat treatment that was performed at 200° C. for 1 hour.

Next, the substrate 520 was fixed to a substrate holder inside a vacuum evaporation apparatus reduced to approximately 1×10$^4$ Pa with the electrode 501 side down. Then, as a hole-injection layer 531, DBT3P-II and MoO$_3$ were deposited on the electrode 501 by co-evaporation in a weight ratio of DBT3P-II:MoO$_3$=1:0.5 to a thickness of 70 nm.

As a hole-transport layer 532, Cz2DBT was deposited to a thickness of 20 nm over the hole-injection layer 531.

As a light-emitting layer 521, PCCzPTzn, Cz2DBT, and 1,6mMemFLPAPrn were deposited over the hole-transport layer 532 by co-evaporation such that the deposited layer has a weight ratio of PCCzPTzn:Cz2DBT:1,6mMemFLPAPrn=0.1:0.9:0.005 and a thickness of 30 nm. Note that in the light-emitting layer 521, PCCzPTzn is a thermally activated delayed fluorescence substance (a first organic compound), Cz2DBT is a host material (a second organic compound), and 1,6mMemFLPAPrn is a guest material.

Next, Bphen were sequentially deposited to a thickness of 30 nm each, as electron-transport layer 533 over the light-emitting layer 521.

Then, as the electron-injection layer 534, LiF was deposited to a thickness of 1 nm over the electron-transport layer 533.

As an electrode 502, Al was deposited on the electron-injection layer 534 to a thickness of 200 nm.

Through the above steps, the components over the substrate 520 were formed. Note that a resistance heating method was used for the above deposition process.

Next, a light-emitting element was sealed by fixing a sealing substrate to the substrate 520 using a sealant for an organic EL device in a glove box under a nitrogen atmosphere. Specifically, the sealant was applied to surround the light-emitting element, the substrate 520 and the sealing substrate were bonded to each other, irradiation with ultraviolet light having a wavelength of 365 nm at 6 J/cm$^2$ was performed, and heat treatment was performed at 80° C. for 1 hour. Through the above steps, the light-emitting element 3 was obtained.

<Fabrication of Light-Emitting Elements 4 and 5 and Comparative Light-Emitting Elements 1 to 4>

The light-emitting elements 4 and 5 and the comparative light-emitting elements 1 to 4 were fabricated through the same steps as those for the above-mentioned light-emitting element 3 except that structures of their light-emitting layers were different from the structure of the light-emitting layer of the light-emitting element 3.

As the light-emitting layer 521 of the light-emitting element 4, PCCzPTzn, Cz2DBT, and TBP were deposited by co-evaporation such that the deposited layer has a weight ratio of PCCzPTzn:Cz2DBT:TBP=0.1:0.9:0.005 and a thickness of 30 nm. Note that in the light-emitting layer 521, PCCzPTzn is a thermally activated delayed fluorescence substance (a first organic compound), Cz2DBT is a host material (a second organic compound), and TBP is a guest material. In other words, the light-emitting element 4 has a structure similar to that of the light-emitting element 3 except for the guest material.

As the light-emitting layer 521 of the light-emitting element 5, PCCzPTzn, CzTAZ1, and TBP were deposited by co-evaporation such that the deposited layer has a weight ratio of PCCzPTzn:CzTAZ1:TBP=0.1:0.9:0.005 and a thickness of 30 nm. Note that in the light-emitting layer 521, PCCzPTzn is a thermally activated delayed fluorescence substance (a first organic compound), CzTAZ1 is a host material (a second organic compound), and TBP is a guest material. In other words, the light-emitting element 5 has a structure similar to that of the light-emitting element 4 except for the host material.

As the light-emitting layer 521 of the comparative light-emitting element 1, Cz2DBT and 1,6mMemFLPAPrn were deposited by co-evaporation such that the deposited layer has a weight ratio of Cz2DBT:1,6mMemFLPAPrn=1:0.05 and a thickness of 30 nm. Note that in the light-emitting layer 521, Cz2DBT is a host material (a second organic compound) and 1,6mMemFLPAPrn is a guest material. In other words, a thermally activated delayed fluorescence substance (a first organic compound) is not used for the comparative light-emitting element 1.

As the light-emitting layer 521 of the comparative light-emitting element 2, PCCzPTzn, Cz2DBT, and 1,6mMemFLPAPrn were deposited by co-evaporation such that the deposited layer has a weight ratio of PCCzPTzn:Cz2DBT:1,6mMemFLPAPrn=0.1:0.9:0.05 and a thickness of 30 nm. Note that in the light-emitting layer 521, PCCzPTzn is a thermally activated delayed fluorescence substance (a first organic compound), Cz2DBT is a host material (a second organic compound), and 1,6mMemFLPAPrn is a guest material. In other words, the comparative light-emitting element 2 has a structure similar to that of the light-emitting element 3 except for the concentration of the guest material.

As the light-emitting layer 521 of the comparative light-emitting element 3, PCCzPTzn, Cz2DBT, and TBP were deposited by co-evaporation such that the deposited layer has a weight ratio of PCCzPTzn:Cz2DBT:TBP=0.1:0.9:0.05 and a thickness of 30 nm. Note that in the light-emitting layer 521, PCCzPTzn is a thermally activated delayed fluorescence substance (a first organic compound), Cz2DBT is a host material (a second organic compound), and TBP is a guest material. In other words, the comparative light-emitting element 3 has a structure similar to that of the light-emitting element 4 except for the concentration of the guest material.

As the light-emitting layer 521 of the comparative light-emitting element 4, PCCzPTzn, CzTAZ1, and TBP were deposited by co-evaporation such that the deposited layer has a weight ratio of PCCzPTzn:CzTAZ1:TBP=0.1:0.9:0.05 and a thickness of 30 nm. Note that in the light-emitting layer 521, PCCzPTzn is a thermally activated delayed fluorescence substance (a first organic compound), CzTAZ1 is a host material (a second organic compound), and TBP is a guest material. In other words, the comparative light-emitting element 4 has a structure similar to that of the light-emitting element 5 except for the concentration of the guest material.

<Characteristics of Light-Emitting Elements>

Figure 20:
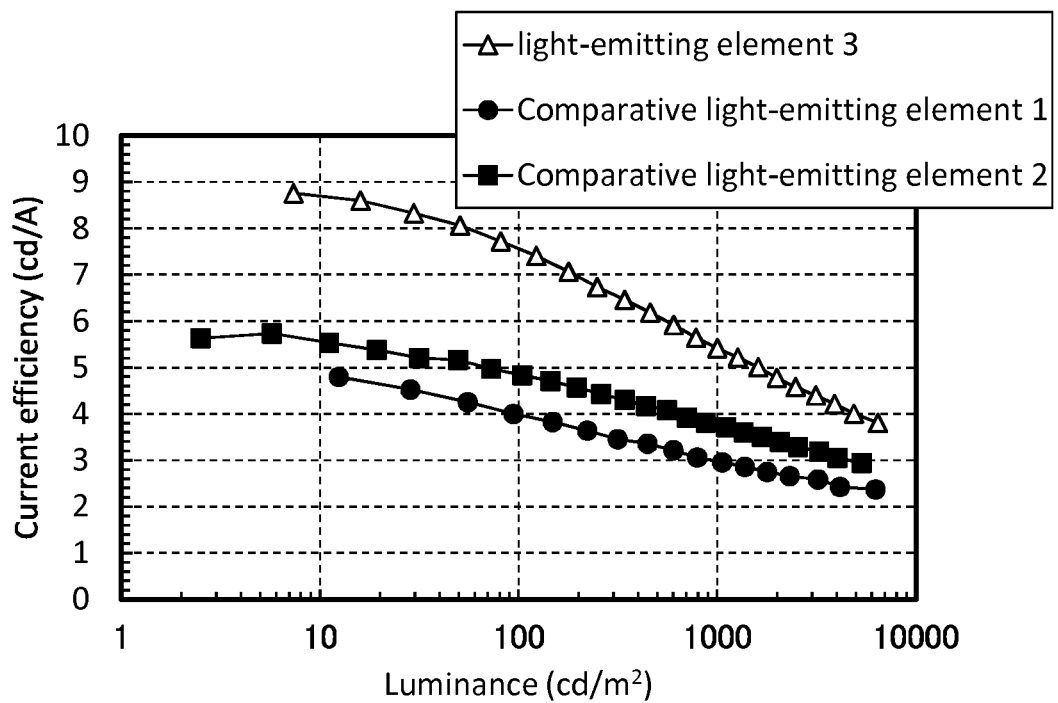
FIG. 20 shows current efficiency-luminance characteristics of light-emitting elements of Example 2.
Figure 21:
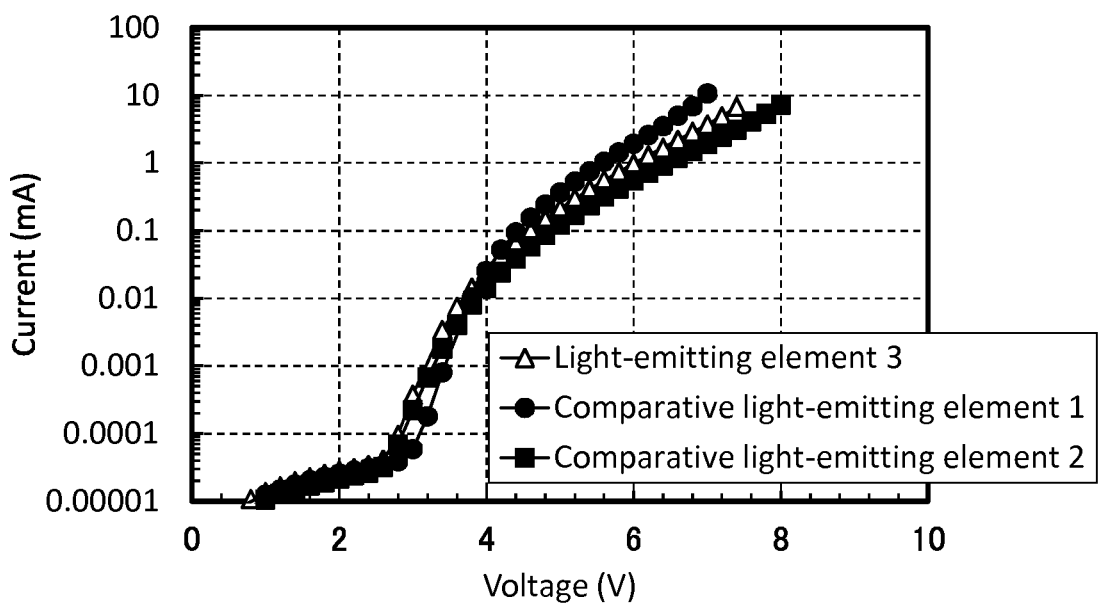
FIG. 21 shows current-voltage characteristics of light-emitting elements Example 2.
Figure 22:
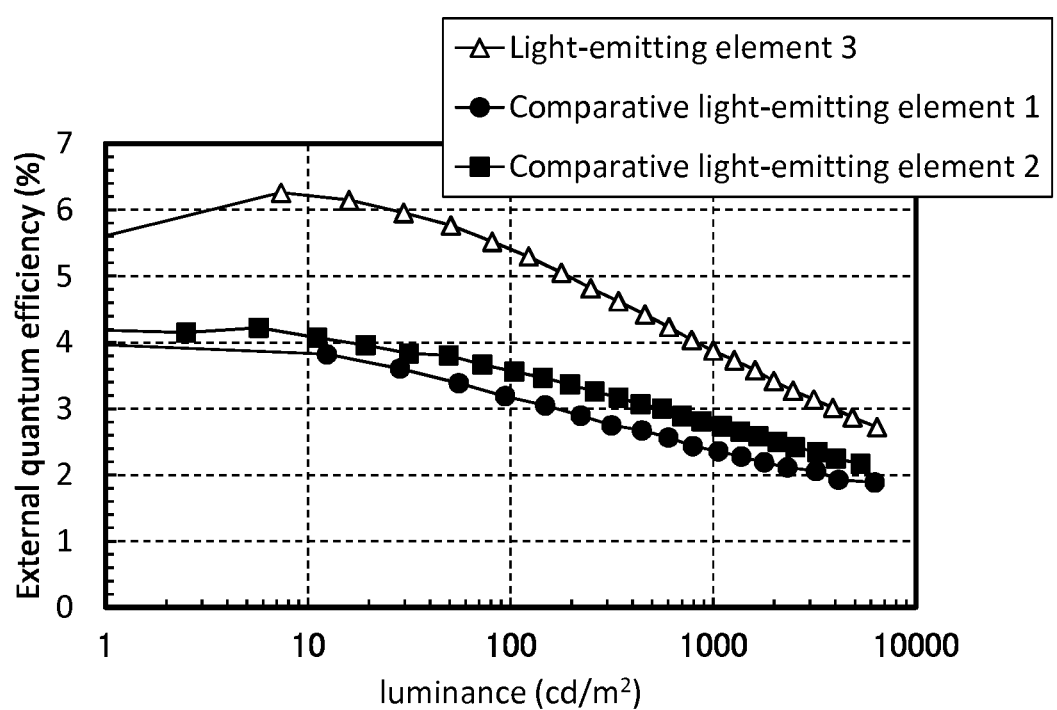
FIG. 22 shows external quantum efficiency-luminance characteristics of light-emitting elements Example 2.
Figure 23:
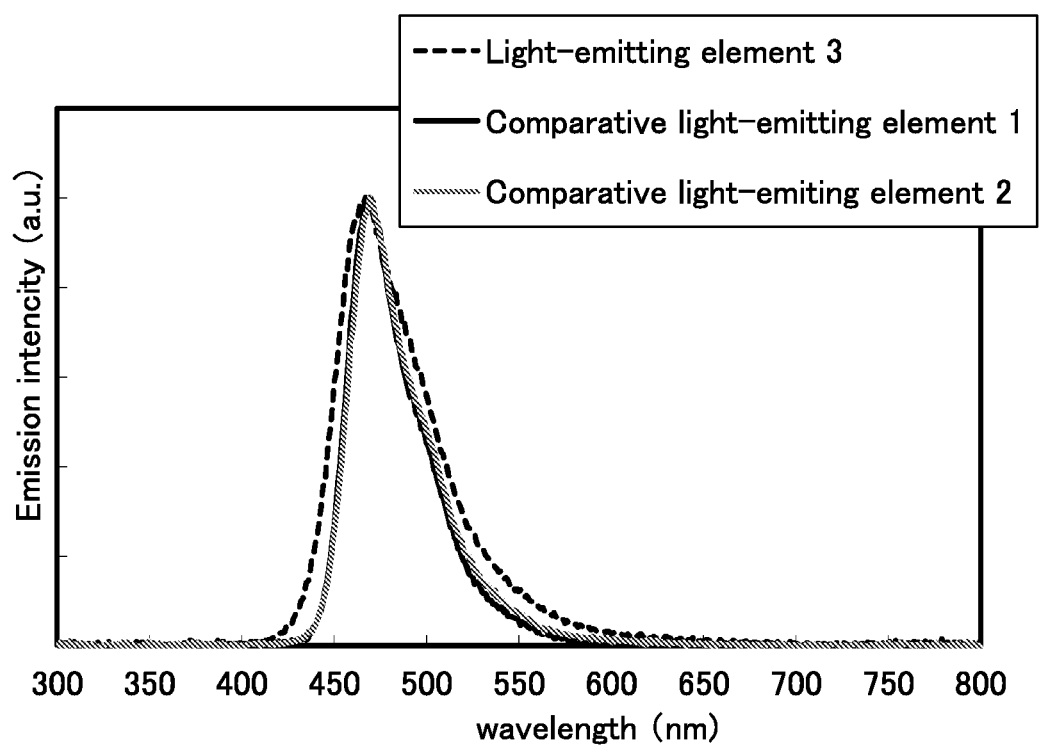
FIG. 23 shows electroluminescence spectra of light-emitting elements of Example 2.
Figure 24:
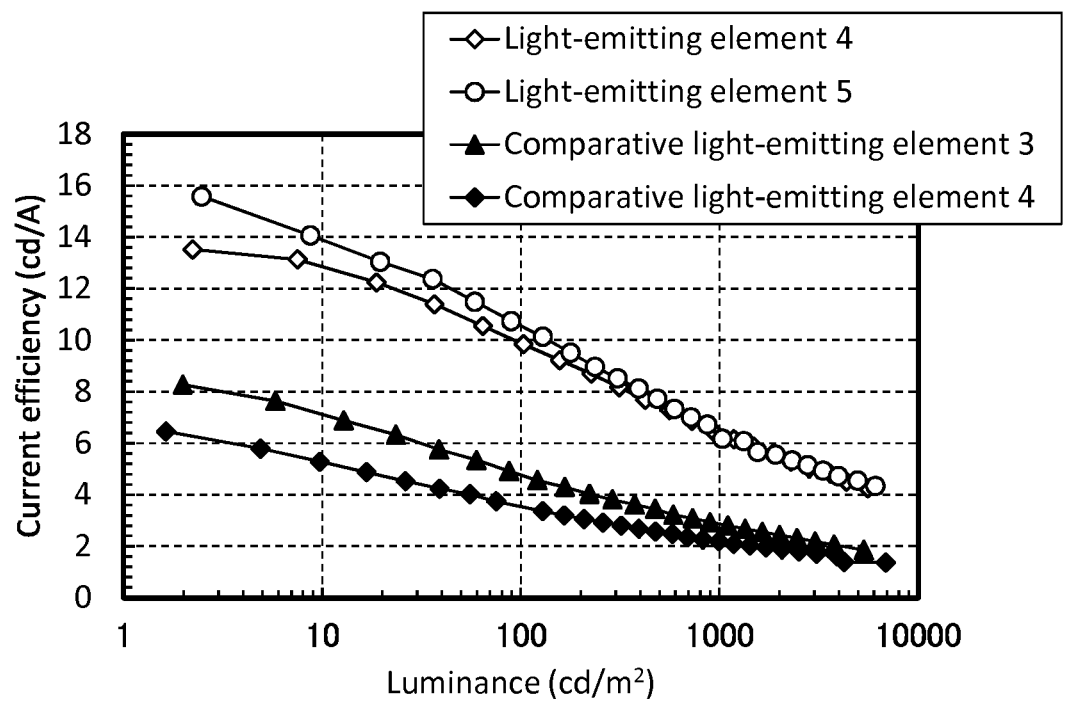
FIG. 24 shows current efficiency-luminance characteristics of light-emitting elements of Example 2.
Figure 25:
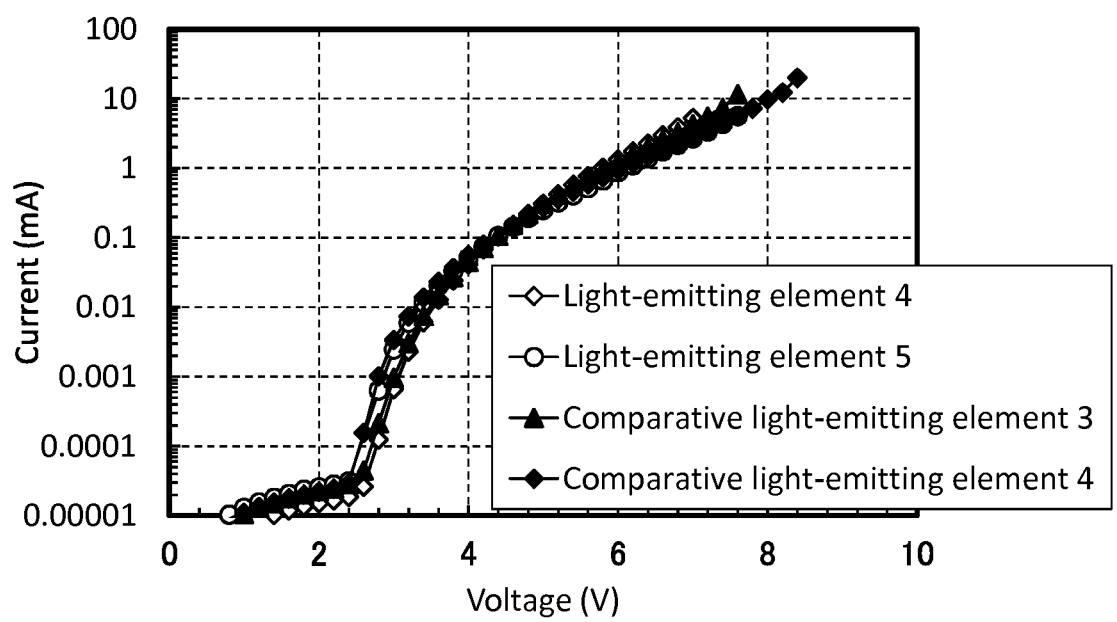
FIG. 25 shows current-voltage characteristics of light-emitting elements of Example 2.
Figure 26:
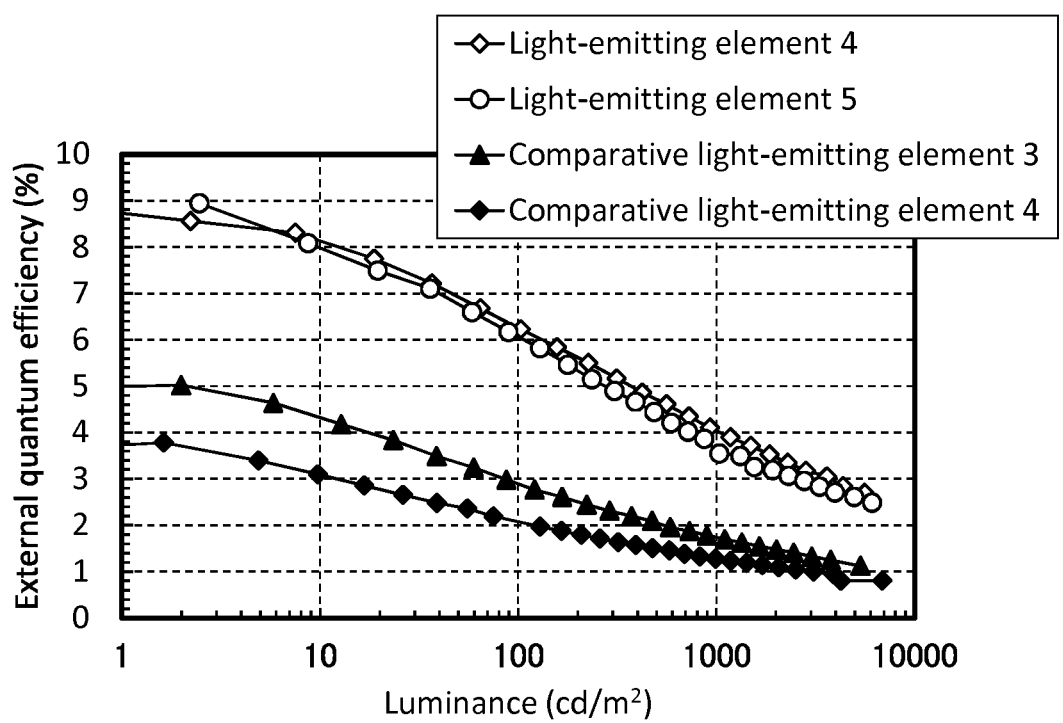
FIG. 26 shows external quantum efficiency-luminance characteristics of light-emitting elements of Example 2.
Figure 27:
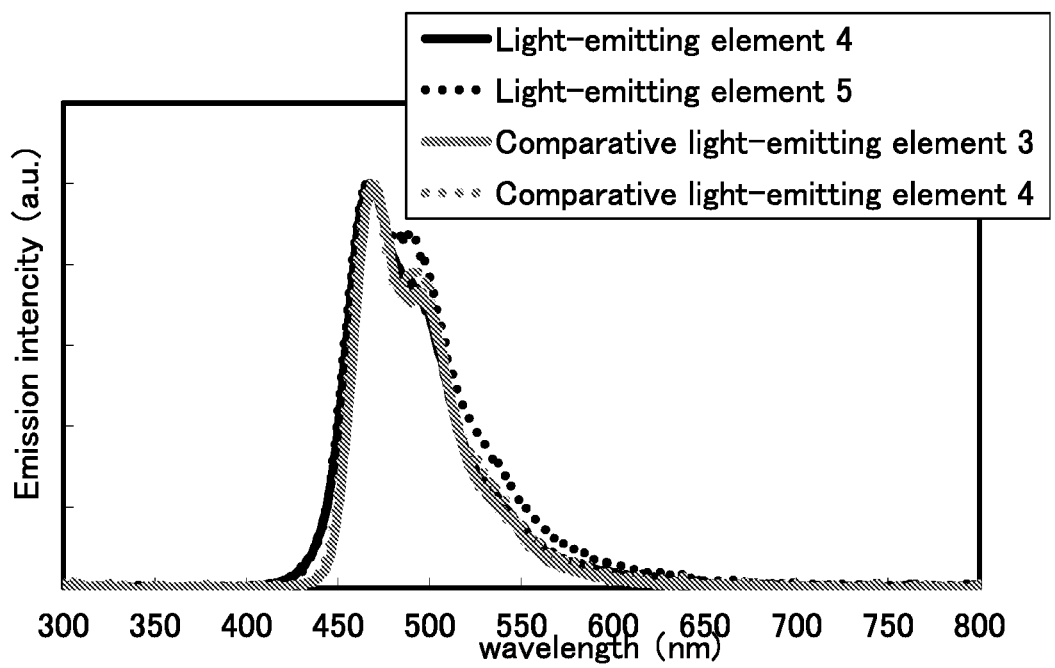
FIG. 27 shows electroluminescence spectra of light-emitting elements of Example 2.

FIGS. 20, 21, and 22 show current efficiency-luminance characteristics, current-voltage characteristics, and external quantum efficiency-luminance characteristics, respectively, of the light-emitting element 3 and the comparative light-emitting elements 1 and 2. FIG. 23 shows electroluminescence spectra when a current at a current density of 2.5 mA/cm$^2$ was supplied to the light-emitting element 3 and the comparative light-emitting elements 1 and 2. FIGS. 24, 25, and 26 show current efficiency-luminance characteristics, current-voltage characteristics, and external quantum efficiency-luminance characteristics, respectively, of the light-emitting elements 4 and 5 and the comparative light-emitting elements 3 and 4. FIG. 27 shows s electroluminescence spectra when a current at a current density of 2.5 mA/cm$^2$ was supplied to the light-emitting elements 4 and 5 and the comparative light-emitting elements 3 and 4. The measurements of the light-emitting elements were performed at room temperature (in an atmosphere kept at 23° C.).

Table 8 shows the element characteristics of the light-emitting elements 3 to 5 and the comparative light-emitting element 1 to 4 at around 1000 cd/m$^2$.

TABLE 8

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
| --- | --- | --- | --- | --- | --- | --- | --- |
| Light-emitting element 3 | 4.2 | 1.05 | (0.16, 0.19) | 81 | 7.7 | 5.8 | 5.52 |
| Light-emitting element 4 | 4.0 | 1.05 | (0.16, 0.23) | 103 | 9.8 | 7.7 | 6.22 |
| Light-emitting element 5 | 3.8 | 0.83 | (0.17, 0.26) | 89 | 10.7 | 8.9 | 6.17 |

TABLE 8-continued

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting element 1 | 4.4 | 2.35 | (0.14, 0.17) | 94 | 4.0 | 2.9 | 3.19 |
| Comparative light-emitting element 2 | 4.8 | 2.16 | (0.14, 0.19) | 104 | 4.8 | 3.2 | 3.56 |
| Comparative light-emitting element 3 | 4.2 | 1.77 | (0.15, 0.25) | 87 | 4.9 | 3.7 | 2.98 |
| Comparative light-emitting element 4 | 4.2 | 2.00 | (0.16, 0.26) | 75 | 3.7 | 2.8 | 2.19 |

It is found from the emission spectra in FIG. 23 and FIG. 27 that blue light emission originating from the guest material is obtained from the light-emitting elements 3 to 5 and the comparative light-emitting element 1 to 4.

As shown in FIGS. 20 to 22 and FIGS. 24 to 26, the light-emitting elements 3 to 5 show high emission efficiency. In contrast, the comparative light-emitting elements 1 to 4 do not show sufficient emission efficiency.

Table 9 shows measurement results of the oxidation potentials and the reduction potentials of the thermally activated delayed fluorescence material (PCCzPTzn) and the host material (Cz2DBT or CzTAZ1) in the solution state and the HOMO and LUMO levels estimated from the results. Note that the measurement method is similar to that described in Embodiment 1.

TABLE 9

| | Abbreviation | Oxidation potential(V) in solution state | Reduction potential(V) in solution state | HOMO(eV) estimated from oxidation potential in solution state | LUMO(eV) estimated from oxidation potential in solution state |
|---|---|---|---|---|---|
| Thermally activated delayed fluorescence substance | PCCzPTzn | 0.70 | −1.97 | −5.64 | −2.97 |
| Host material | Cz2DBT | 0.92 | −2.62 | −5.86 | −2.33 |
| | CzTAZ1 | 1.00 | −2.70 | −5.94 | −2.24 |

As shown in Table 9, in the light-emitting elements 3 to 5, the oxidation potential and the reduction potential of the thermally activated delayed fluorescence substance are lower than or equal to the oxidation potential of the host material and higher than or equal to the reduction potential of the host material, respectively. Thus, the HOMO level and the LUMO level of the thermally activated delayed fluorescence substance which are estimated from the oxidation potential and the reduction potential are higher than or equal to the HOMO level of the host material and lower than or equal to the LUMO level of the host material, respectively. Therefore, both the singlet excited state and the triplet excited state which are efficiently formed by carrier recombination in the thermally activated delayed fluorescence substance can be transferred efficiently to the guest material. As a result, the light-emitting elements 3 to 5 show high emission efficiency.

In addition, the results in which the emission efficiency of the light-emitting element 3 is higher than that of the comparative light-emitting element 2, and the emission efficiency of the comparative light-emitting element 2 is higher than that of the comparative light-emitting element 1 show that the use of PCCzPTzn as the thermally activated delayed fluorescence substance for the light-emitting layer 521 can increase the emission efficiency. This is because a triplet excited state generated by recombined carriers in PCCzPTzn, which was the thermally activated delayed fluorescence substance, was converted into a single excited state by reverse intersystem crossing.

The emission efficiency of the light-emitting element 3 higher than that of the comparative light-emitting element 2 means that the weight ratio of the host material (Cz2DBT) to the guest material (1,6mMemFLPAPrn) in the light-emitting layer 521 is preferably from 1:0.001 to 1:0.01 (host material: guest material). This is because the concentration of a guest material that is sufficiently lower than that of a host material can suppress generation of a triplet excited state of the guest material.

The emission efficiency of the light-emitting element 4 is higher than that of the comparative light-emitting element 3 and the emission efficiency of the light-emitting element 5 is higher than that of the comparative light-emitting element 4, which means that the weight ratio of the host material (Cz2DBT or CzTAZ1) to the guest material (TBP) in the light-emitting layer 521 is preferably from 1:0.001 to 1:0.01 (host material: guest material).

Thus, the weight ratio of the host material to the thermally activated delayed fluorescence substance is preferably from 1:0.05 to 1:0.5 (host material: thermally activated delayed fluorescence substance) and the weight ratio of the host material to the guest material is preferably from 1:0.001 to 1:0.01 (host material: guest material).

As described above, the use of a structure of one embodiment of the present invention can provide a light-emitting element with high emission efficiency.

EXPLANATION OF REFERENCE

100: EL layer, 101: electrode, 102: electrode, 111: hole-injection layer, 112: hole-transport layer, 118: electron-transport layer, 119: electron-injection layer, 120: light-emitting layer, 131: organic compound, 132: organic compound, 133: guest material, 150: light-emitting element, 401: electrode, 402: electrode, 411: hole-injection layer, 412: hole-transport layer, 413: electron-transport layer, 414: electron-injection layer, 415: hole-injection layer, 416: hole-transport layer, 417: electron-transport layer, 418: electron-injection layer, 421: organic compound, 422: organic compound, 423: guest material, 431: organic compound, 432: organic compound, 433: guest material, 441: light-emitting unit, 442: light-emitting unit, 443: light-emitting layer, 444: light-emitting layer, 445: charge-generation layer, 446: light-emitting unit, 447: light-emitting unit, 448: light-emitting layer, 449: light-emitting layer, 450: light-emitting element, 452: light-emitting element, 461: host material, 462: guest material, 471: organic compound, 472: organic compound, 473: guest material, 501: electrode, 502: electrode, 520: substrate, 521: light-emitting layer, 531: hole-injection layer, 532: hole-transport layer, 533: electron-transport layer, 533a: electron-transport layer, 533b: electron-transport layer, 534: electron-injection layer, 801: pixel circuit, 802: pixel portion, 804: driver circuit portion, 804a: scan line driver circuit, 804b: signal line driver circuit, 806: protective circuit, 807: terminal portion, 852: transistor, 854: transistor, 862: capacitor, 872: light-emitting element, 2000: touch panel, 2001: touch panel, 2501: display device, 2502R: pixel, 2502t: transistor, 2503c: capacitor, 2503g(1): scan line driver circuit, 2503t: transistor, 2509: FPC, 2510: substrate, 2510a: insulating layer, 2510b: flexible substrate, 2510c: adhesive layer, 2511: wiring, 2519: terminal, 2521: insulating layer, 2528: partition, 2550R: light-emitting element, 2560: sealing layer, 2567BM: light-blocking layer, 2567p: anti-reflective layer, 2567R: coloring layer, 2570: substrate, 2570a: insulating layer, 2570b: flexible substrate, 2570c: adhesive layer, 2580R: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitor, 2611: transistor, 2612: transistor, 2613: transistor, 2621: electrode, 2622: electrode, 8000: display module, 8001: upper cover, 8002: lower cover, 8003: FPC, 8004: touch sensor, 8005: FPC, 8006: display device, 8009: frame, 8010: printed board, 8011: battery, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal.

This application is based on Japanese Patent Application serial no. 2014-200355 filed with Japan Patent Office on Sep. 30, 2014, the entire contents of which are hereby incorporated by reference.

What is claimed is:

1. A light-emitting element comprising:
a pair of electrodes; and
an EL layer between the pair of electrodes,
wherein the EL layer comprises a light-emitting layer,
wherein the light-emitting layer comprises a first organic compound, a second organic compound, and a guest material,
wherein the first organic compound emits a thermally activated delayed fluorescence at room temperature,
wherein the guest material emits fluorescence,
wherein emission energy of the first organic compound is higher than phosphorescence emission energy of the guest material,
wherein a triplet excitation energy level of the second organic compound is higher than a triplet excitation energy level of the guest material, and
wherein a singlet excitation energy level of the second organic compound is higher than a singlet excitation energy level of the guest material.

2. The light-emitting element according to claim 1, wherein a difference between a singlet excitation energy level of the first organic compound and a triplet excitation energy level of the first organic compound is larger than 0 eV and smaller than or equal to 0.2 eV.

3. The light-emitting element according to claim 1, wherein the guest material emits light.

4. The light-emitting element according to claim 1,
wherein the first organic compound comprises a first π-electron deficient heteroaromatic skeleton and a first π-electron rich heteroaromatic skeleton, and
wherein the second organic compound comprises a second π-electron deficient heteroaromatic skeleton and a second π-electron rich heteroaromatic skeleton.

5. The light-emitting element according to claim 4,
wherein the first π-electron deficient heteroaromatic skeleton comprises a diazine skeleton or a triazine skeleton,
wherein the first π-electron rich heteroaromatic skeleton comprises any one or more of an acridine skeleton, a phenoxazine skeleton, or a 3-(9-phenyl-9H-carbazole-3-yl)-9H-carbazole skeleton,
wherein the second π-electron deficient heteroaromatic skeleton comprises a pyridine skeleton or a diazine skeleton, and
wherein the second π-electron rich heteroaromatic skeleton comprises any one or more of a furan skeleton, a thiophene skeleton, a fluorine skeleton, and a pyrrole skeleton.

6. The light-emitting element according to claim 1,
wherein a weight ratio of the second organic compound to the first organic compound is from 1:0.05 to 1:0.5, and
wherein a weight ratio of the second organic compound to the guest material is from 1:0.001 to 1:0.01.

7. A display device comprising:
the light-emitting element according to claim 1; and
a color filter, a sealant, or a transistor.

8. The light-emitting element according to claim 1,
wherein a HOMO level of the first organic compound is higher than or equal to a HOMO level of the second organic compound, and
wherein a LUMO level of the first organic compound is lower than or equal to a LUMO level of the second organic compound.

9. A light-emitting element comprising:
a pair of electrodes; and
an EL layer between the pair of electrodes,
wherein the EL layer comprises a light-emitting layer,
wherein the light-emitting layer comprises a first organic compound, a second organic compound, and a guest material,
wherein the first organic compound emits a thermally activated delayed fluorescence at room temperature, wherein the guest material emits fluorescence, wherein emission energy of the first organic compound is higher than phosphorescence emission energy of the guest material, wherein a triplet excitation energy level of the second organic compound is higher than a triplet excitation energy level of the guest material, and wherein a difference between a singlet excitation energy level of the second organic compound and the triplet excitation energy level of the second organic compound is larger than a difference between a singlet excitation energy level of the first organic compound and a triplet excitation energy level of the first organic compound.

10. The light-emitting element according to claim 9, wherein a difference between the singlet excitation energy level of the first organic compound and the triplet excitation energy level of the first organic compound is larger than 0 eV and smaller than or equal to 0.2 eV.

11. The light-emitting element according to claim 9, wherein the guest material emits light.

12. The light-emitting element according to claim 9, wherein the first organic compound comprises a first π-electron deficient heteroaromatic skeleton and a first π-electron rich heteroaromatic skeleton, and wherein the second organic compound comprises a second π-electron deficient heteroaromatic skeleton and a second π-electron rich heteroaromatic skeleton.

13. The light-emitting element according to claim 12, wherein the first π-electron deficient heteroaromatic skeleton comprises a diazine skeleton or a triazine skeleton, wherein the first π-electron rich heteroaromatic skeleton comprises any one or more of an acridine skeleton, a phenoxazine skeleton, or a 3-(9-phenyl-9H-carbazole-3-yl)-9H-carbazole skeleton, wherein the second π-electron deficient heteroaromatic skeleton comprises a pyridine skeleton or a diazine skeleton, and wherein the second π-electron rich heteroaromatic skeleton comprises any one or more of a furan skeleton, a thiophene skeleton, a fluorine skeleton, and a pyrrole skeleton.

14. The light-emitting element according to claim 9, wherein a weight ratio of the second organic compound to the first organic compound is from 1:0.05 to 1:0.5, and wherein a weight ratio of the second organic compound to the guest material is from 1:0.001 to 1:0.01.

15. A display device comprising:

the light-emitting element according to claim 9; and a color filter, a sealant, or a transistor.

16. The light-emitting element according to claim 9, wherein a HOMO level of the first organic compound is higher than or equal to a HOMO level of the second organic compound, and wherein a LUMO level of the first organic compound is lower than or equal to a LUMO level of the second organic compound.

17. The light-emitting element according to claim 1, wherein the singlet excitation energy level of the second organic compound is higher than a singlet excitation energy level of the first organic compound.

18. The light-emitting element according to claim 9, wherein the singlet excitation energy level of the second organic compound is higher than the singlet excitation energy level of the first organic compound.

* * * * *